(12) United States Patent
Kwong et al.

(10) Patent No.: US 9,293,712 B2
(45) Date of Patent: Mar. 22, 2016

(54) DISUBSTITUTED PYRENE COMPOUNDS WITH AMINO GROUP CONTAINING ORTHO ARYL GROUP AND DEVICES CONTAINING THE SAME

(71) Applicant: Universal Display Corporation, Ewing, NJ (US)

(72) Inventors: Raymond Kwong, Fo Tan (HK); Kit Yee Tsang, Shatin (HK); Sze Kui Lam, Kowloon (HK)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/486,468

(22) Filed: Sep. 15, 2014

(65) Prior Publication Data
US 2015/0102321 A1 Apr. 16, 2015

Related U.S. Application Data

(63) Continuation-in-part of application No. 14/052,374, filed on Oct. 11, 2013, now abandoned.

(51) Int. Cl.
H01L 21/08 (2006.01)
H01L 51/00 (2006.01)
H01L 51/50 (2006.01)

(52) U.S. Cl.
CPC ........ *H01L 51/0054* (2013.01); *H01L 51/0059* (2013.01); *H01L 51/0061* (2013.01);
(Continued)

(58) Field of Classification Search
CPC ................................ H01L 51/00; H01L 51/50
USPC ....................... 257/40; 564/308, 426; 549/460
See application file for complete search history.

(56) References Cited

U.S. PATENT DOCUMENTS

| 4,769,292 A | 9/1988 | Tang et al. |
| 5,061,569 A | 10/1991 | VanSlyke et al. |

(Continued)

FOREIGN PATENT DOCUMENTS

| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Caleb Henry
(74) *Attorney, Agent, or Firm* — Duane Morris LLP

(57) ABSTRACT

Compounds according to Formula 1, devices containing the same and formulations containing the same are described. Formula 1 has the following structure:

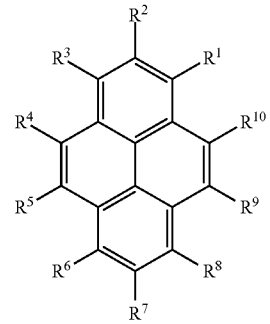

Formula 1 where at least two of $R^1$—$R^{10}$ are not H,
where at least one of $R^1$—$R^{10}$ has the formula T1

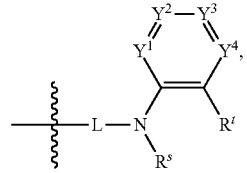

T1 where L is an organic linker,
where $Y^1$ to $Y^4$ are CR or N,
where adjacent R moieties can form fused rings,
where $R^s$ and $R^t$ are independently aryl or heteroaryl, either of which may independently be further substituted, and
where $R^s$ and $R^t$ do not form fused rings with any part of the molecule.

19 Claims, 3 Drawing Sheets

Formula 1

(52) U.S. Cl.
CPC ......... *H01L51/0073* (2013.01); *H01L 51/0055* (2013.01); *H01L 51/0058* (2013.01); *H01L 51/0067* (2013.01); *H01L 51/0072* (2013.01); *H01L 51/0081* (2013.01); *H01L 51/5016* (2013.01); *H01L 51/5064* (2013.01)

(56) References Cited

U.S. PATENT DOCUMENTS

| | | |
|---|---|---|
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 7,981,523 B2 | 7/2011 | Hosokawa et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0151042 A1 | 8/2003 | Marks et al. |
| 2003/0152802 A1 | 8/2003 | Tsuboyama et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Pakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2013/0001524 A1 | 1/2013 | Lim et al. |
| 2014/0316134 A1* | 10/2014 | Stoessel et al. ............... 544/180 |
| 2015/0021555 A1* | 1/2015 | Kwong et al. ................ 257/40 |
| 2015/0102290 A1* | 4/2015 | Kwong et al. ................ 257/40 |
| 2015/0102321 A1* | 4/2015 | Kwong et al. ................ 257/40 |

FOREIGN PATENT DOCUMENTS

| | | |
|---|---|---|
| EP | 2034538 | 3/2009 |
| JP | 2002063988 | 2/2002 |
| JP | 2004087245 | 3/2004 |
| JP | 200511610 | 1/2005 |
| JP | 2007123392 | 5/2007 |
| JP | 2007254297 | 10/2007 |
| JP | 2008074939 | 4/2008 |
| JP | 2012044010 | 3/2012 |
| KR | 20110034977 | 4/2011 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

(56) References Cited

OTHER PUBLICATIONS

Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 3, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 115-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Fequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic LIght-Emitting Diodes with Phosphorescent Platinum Complexes Containing NÔCÔN-Co-ordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

DISUBSTITUTED PYRENE COMPOUNDS WITH AMINO GROUP CONTAINING ORTHO ARYL GROUP AND DEVICES CONTAINING THE SAME

CROSS-REFERENCE TO RELATED APPLICATIONS

This application is a continuation-in-part of U.S. patent application Ser. No. 14/052,374, filed Oct. 11, 2013, the entire content of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to compounds for use as fluorescent emitters and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

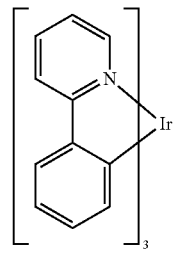

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a compound is provided that has the structure of Formula 1 shown below:

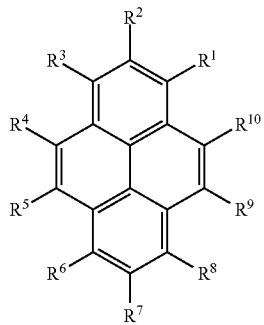

Formula 1 where $R^1$—$R^{10}$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, where at least two of $R^1$—$R^{10}$ are not H,
where at least one of $R^1$—$R^{10}$ has the formula T1

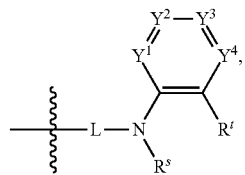

T1 where L is an organic linker,
where $Y^1$ to $Y^4$ are CR or N,
where R is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof,
where adjacent R moieties can form fused rings,
where $R^s$ and $R^r$ are independently aryl or heteroaryl, either of which may independently be further substituted, and
where $R^s$ and $R^r$ do not form fused rings with any part of the molecule.

According to another embodiment, a first device comprising a first organic light emitting device is also provided. The first organic light emitting device can include an anode, a cathode, and an organic layer, disposed between the anode and the cathode. The organic layer can include a compound of Formula 1. The first device can be a consumer product, an organic light-emitting device, and/or a lighting panel.

According to another embodiment, a formulation containing the compound according to Formula 1 is provided. The formulation can include one or more components selected from the group consisting of a solvent, a host, a hole injection material, hole transport material, and an electron transport layer material, disclosed herein

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
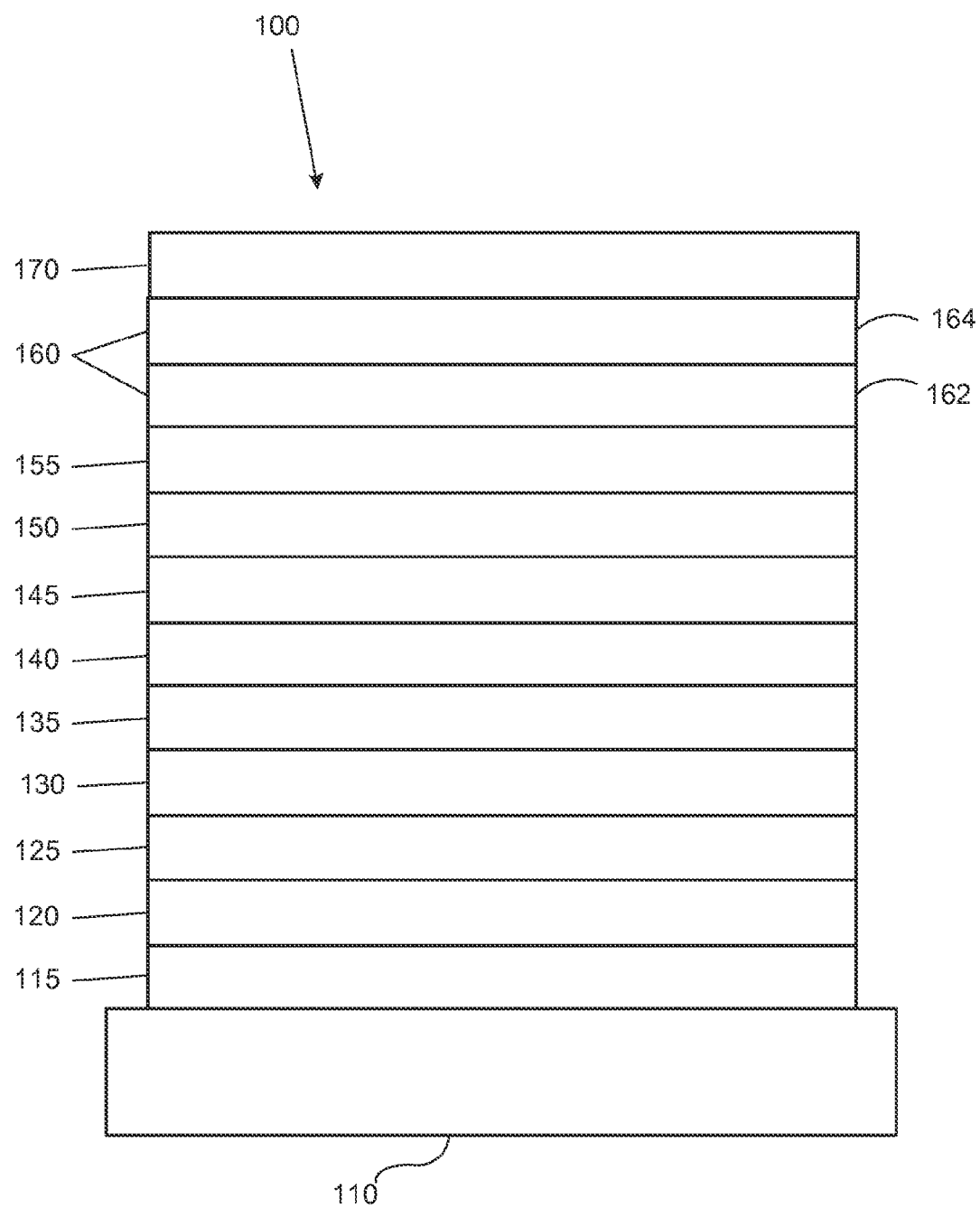
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
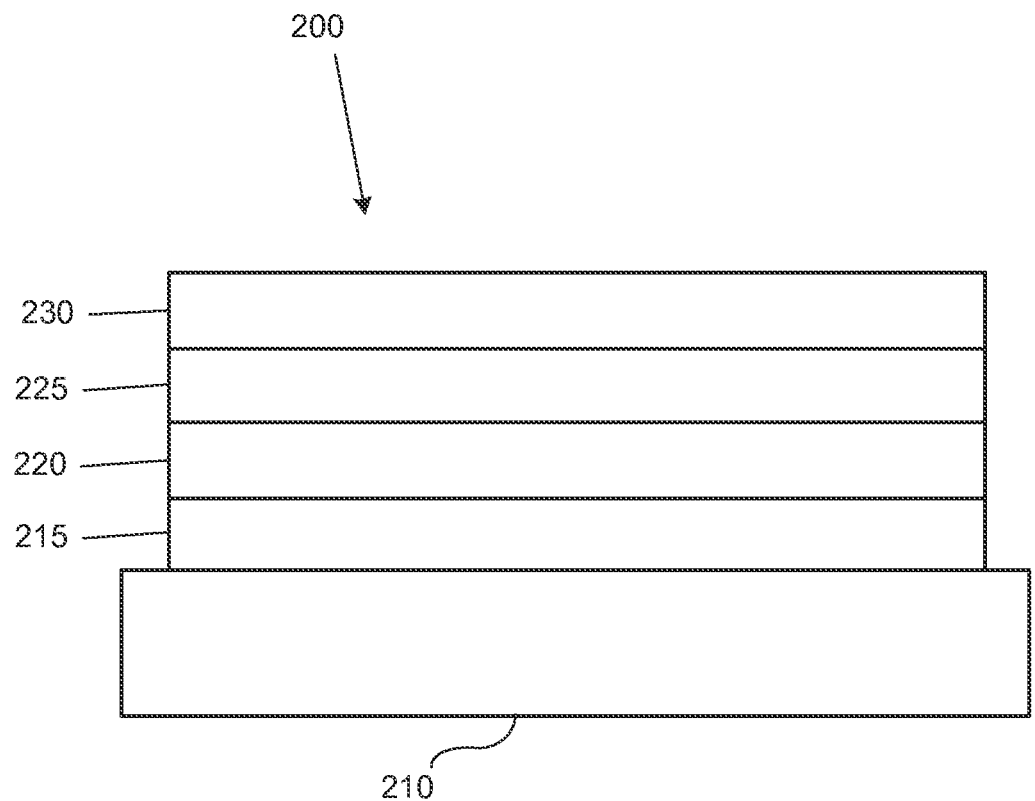
FIG. 2 shows an inverted organic light emitting device that does not have a separate electron transport layer.
Figure 3:
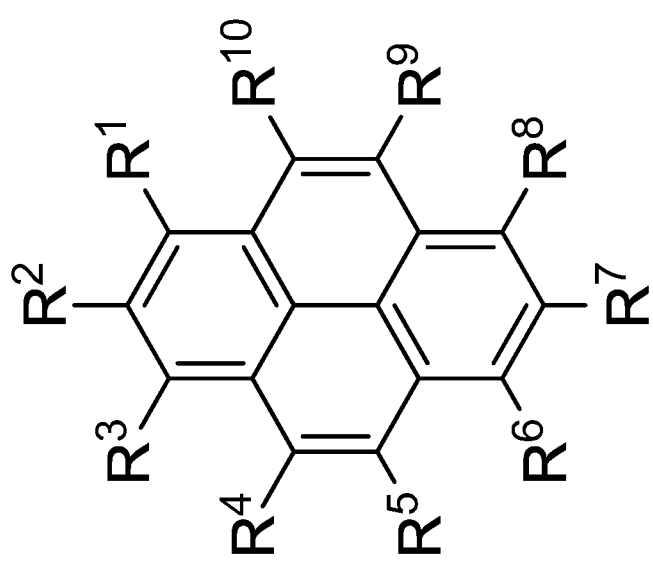
FIG. 3 shows Formula 1 as disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety.

By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95.

The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units), including display screens or lighting panels that can be utilized by the end-user product manufacturers. Such electronic component modules can optionally include the driving electronics and/or power source(s). Devices fabricated in accordance with embodiments of the invention can be incorporated into a wide variety of consumer products that have one or more electronic component modules (or units) incorporated therein. Some examples of such consumer products include flat panel displays, computer monitors, medical monitors, televisions, billboards, lights for interior or exterior illumination and/or signaling, heads up displays, fully transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Hetero-aromatic cyclic radicals also means heteroaryl. Preferred hetero-non-aromatic cyclic groups are those containing 3 or 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Pyrene compounds are a class of luminescent compounds that have been used in OLED devices. However, pyrene molecules have a tendency toward π-stacking, which leads to red-shifting of the emissions. It has been unexpectedly discovered that high efficiency blue emissions can be produced by pyrene compounds with at least two substitutions, including at least one amine group that includes a six-membered aryl ring substituted in the ortho position, where a linker is between the pyrene and the amino group. It is believed that these high efficiency blue emissions result because the linker-amino-ortho-aryl moiety produces steric bulkiness that imposes a heavy twisting on the aryl rings of the pyrene, which forces the pyrene moiety into a non-coplanar arrangement. It is believed that the linker may induce extra aryl-aryl twisting. Surprisingly, the data shows that the combined effect of these unique pyrene-based compounds is reduced π-stacking, increased photoluminescence and electroluminescent efficiency, as well as, decreased evaporation temperature, which makes the pyrene compounds described herein particularly suitable for use as fluorescent blue emitters in OLED devices.

According to one embodiment, a pyrene compound according to Formula 1 is disclosed:

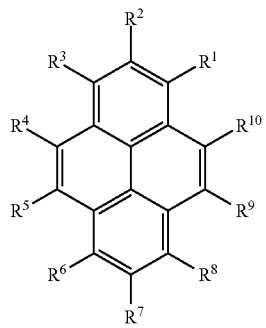

Formula 1 where $R^1$—$R^{10}$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, where at least two of $R^1$—$R^{10}$ are not H, where at least one of $R^1$—$R^{10}$ has the formula T1

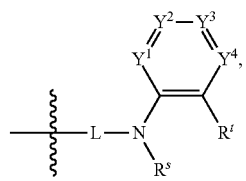

T1 where L is an organic linker, where $Y^1$ to $Y^4$ are CR or N, where R is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, where adjacent R moieties can form fused rings, where $R^s$ and $R^t$ are independently aryl or heteroaryl, either of which may independently be further substituted, and where $R^s$ and $R^t$ do not form fused rings with any part of the molecule.

In some embodiments, $R^s$ and $R^t$ can be further substituted by a moiety selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl (e.g., phenyl), heteroaryl, acyl, carbonyl, carboxylic acids, ester, nitrile, isonitrile, sulfanyl, sulfinyl, sulfonyl, phosphino, and combinations thereof, In some embodiments, $R_s$ can include a moiety selected from the group consisting of dibenzothiophene, dibenzofuran, dibenzoselenophene, aza-dibenzothiophene, aza-dibenzofuran, or aza-dibenzoselenophene, phenyl, pyridine, and combinations thereof.

The linker L is not a bond and includes at least one atom. In some embodiments, the linker L is alkyl, aryl or heteroaryl. In some more specific embodiments, the linker L is selected from the group consisting of:

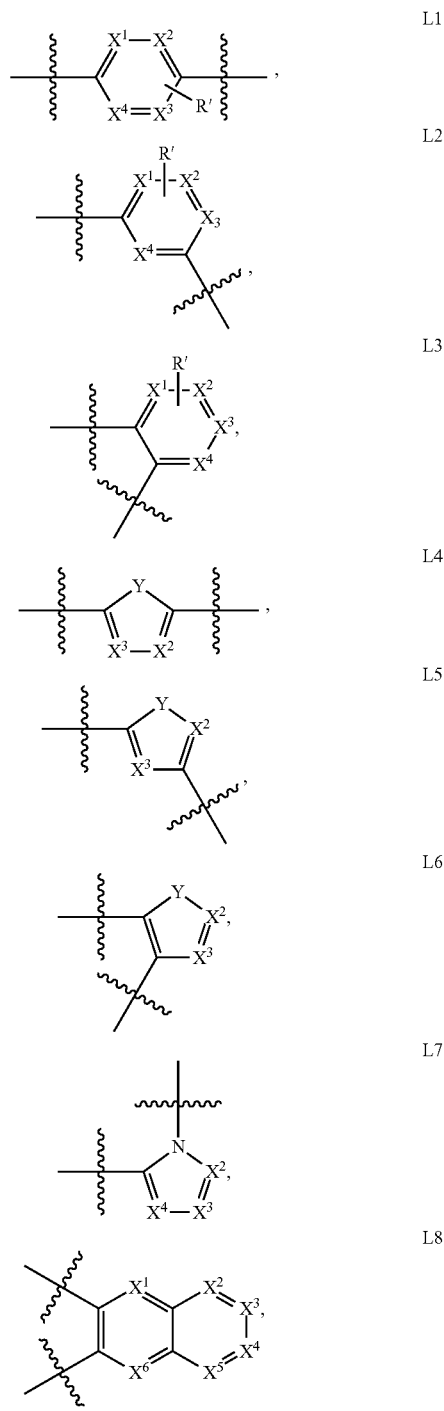

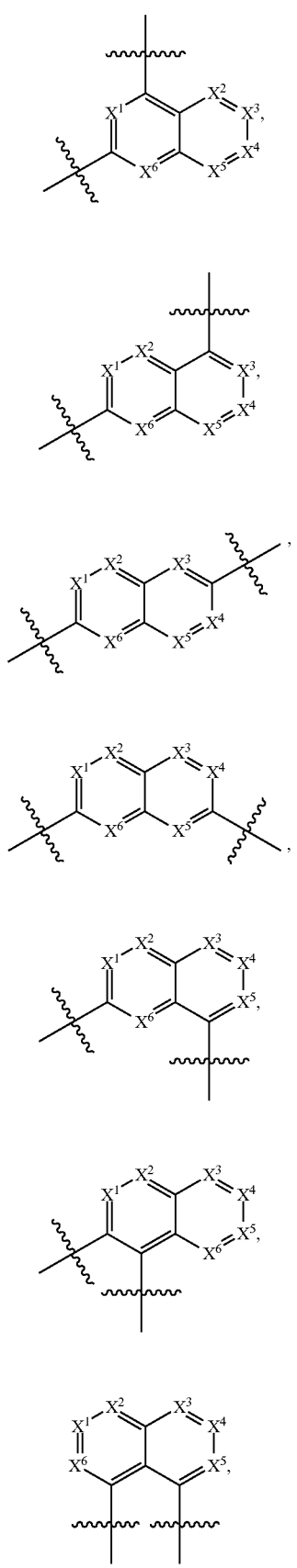
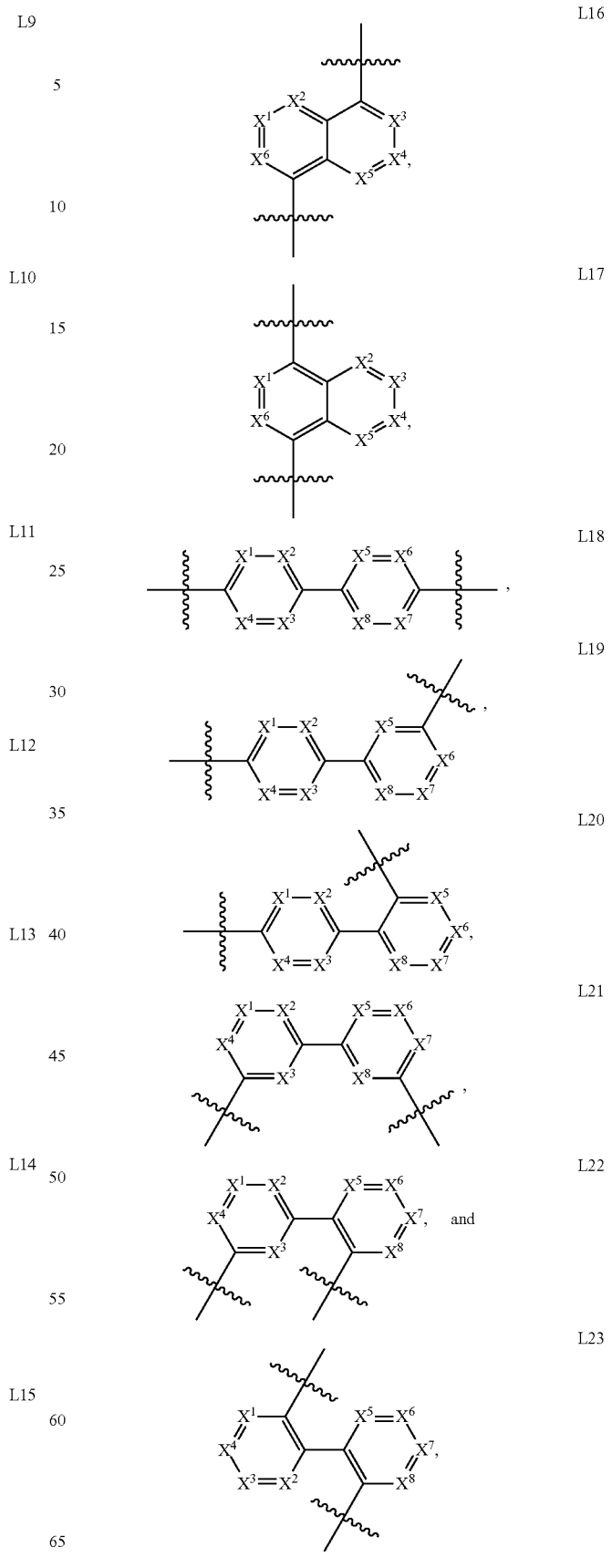

where $X^1$ to $X^8$ are CR' or N, where Y is NR", O or S, and where R' and R" are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In some embodiments, $R^1$ has the formula

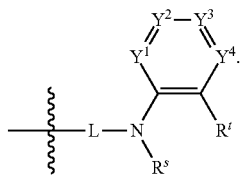

T1

In some embodiments, $R^1$ has the formula

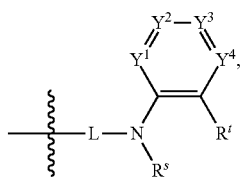

T1 and $R^6$ is alkyl, aryl or heteroaryl. In some specific embodiments, such compounds can be selected from the group consisting of:

Compound 1

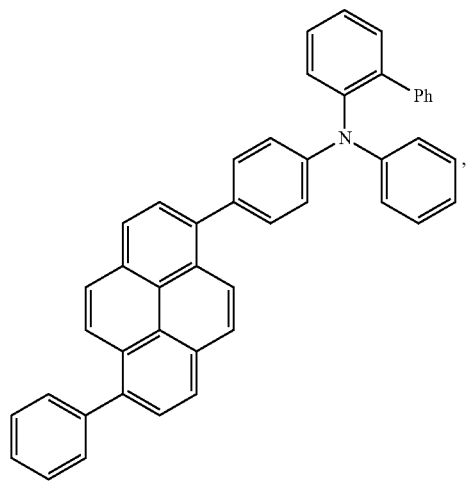

Compound 2

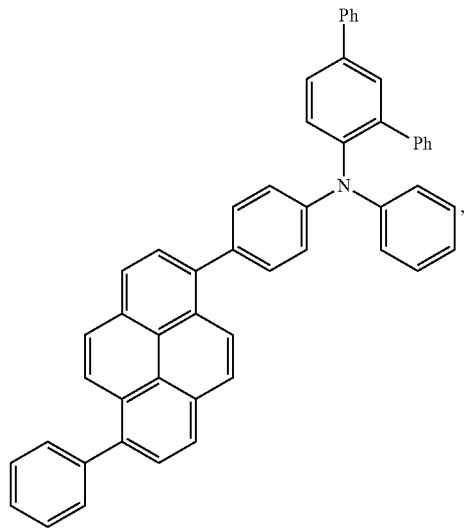

Compound 3

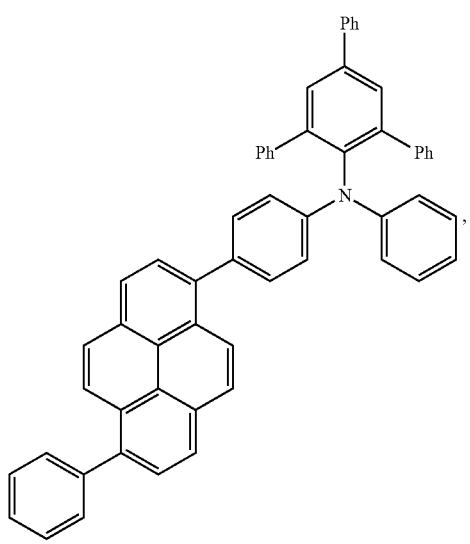

Compound 4

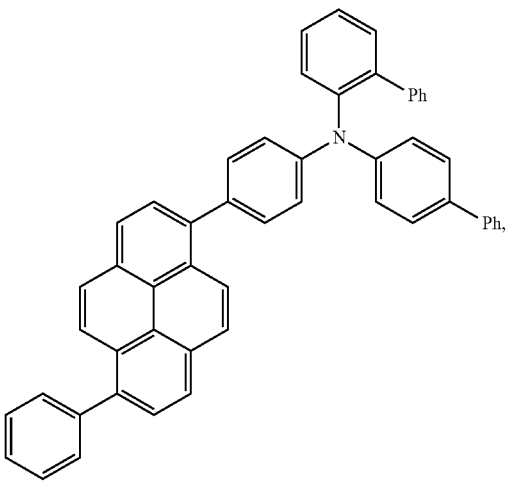

Compound 5
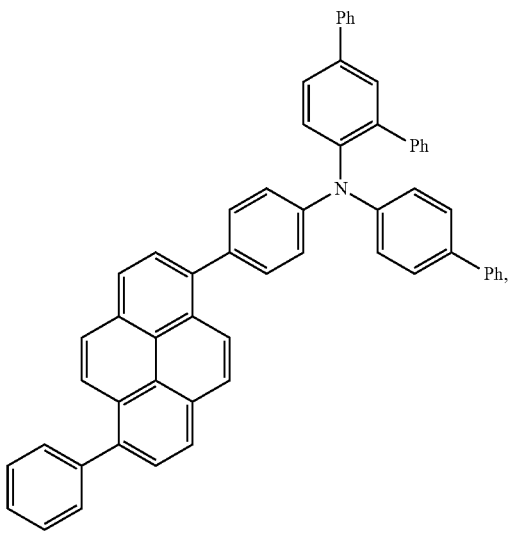
Compound 6
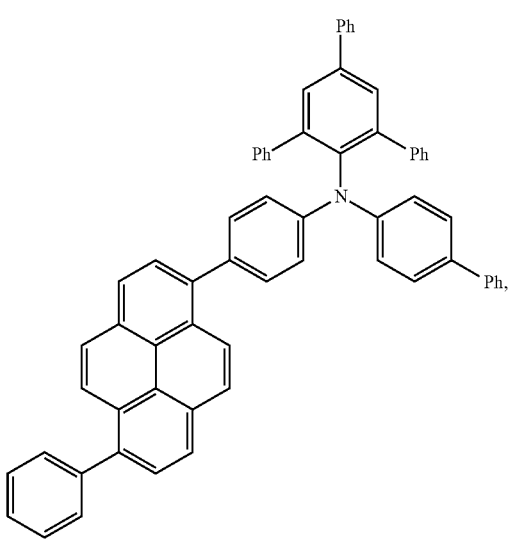
Compound 7
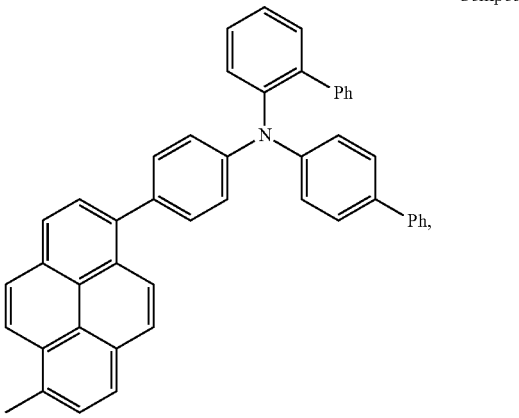
Compound 8
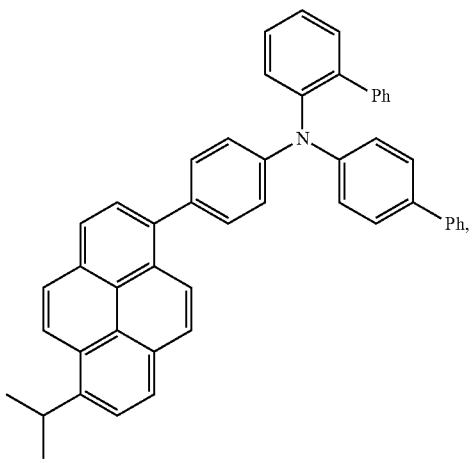
Compound 9
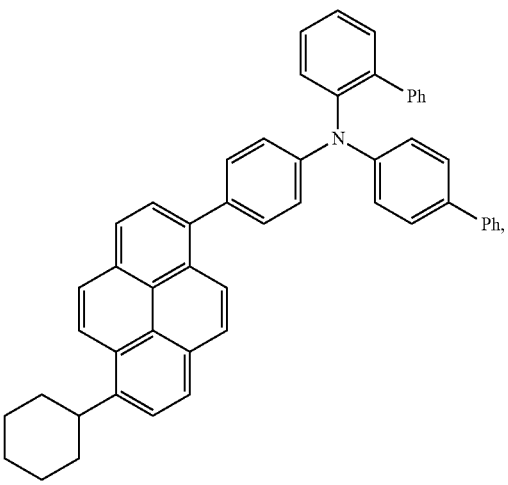
Compound 66
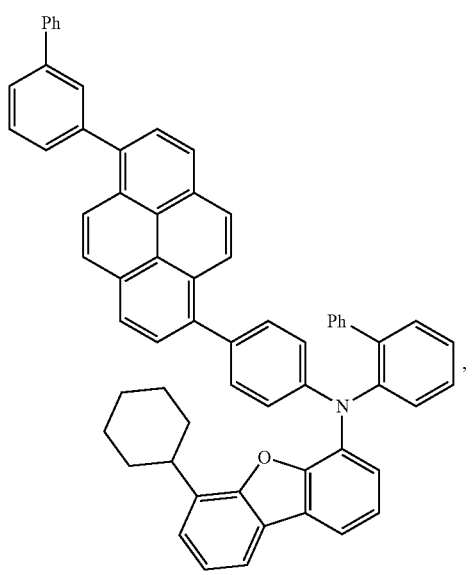

Compound 67
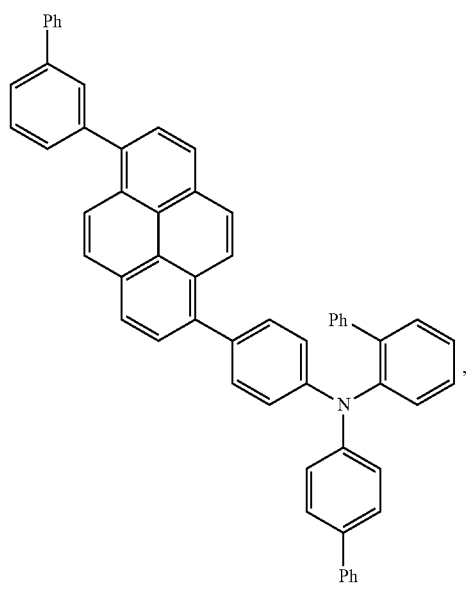
Compound 68
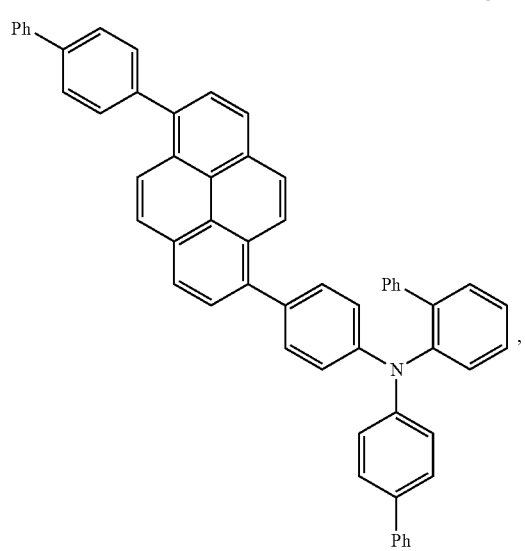
Compound 69
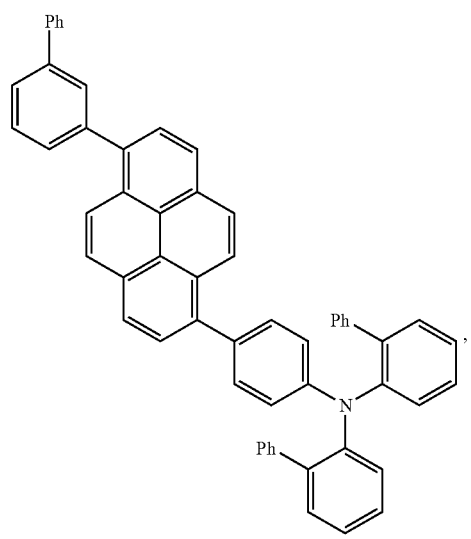
Compound 70
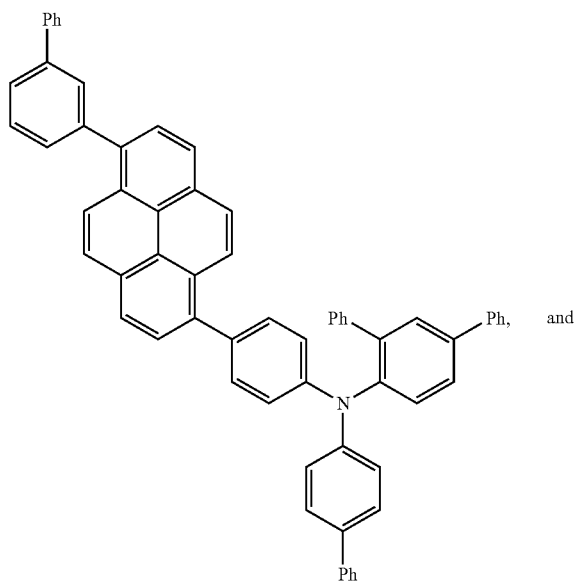
and Compound 71
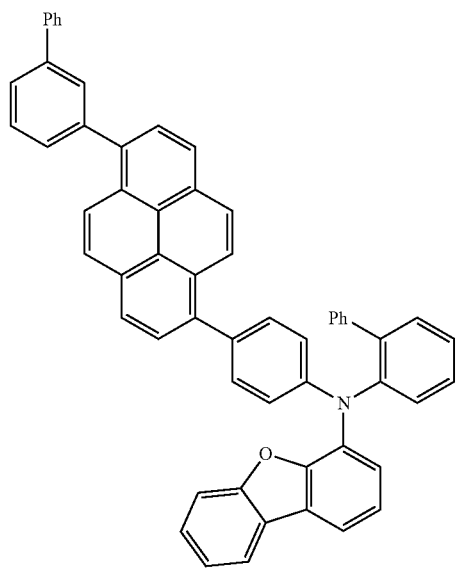
Compound 11
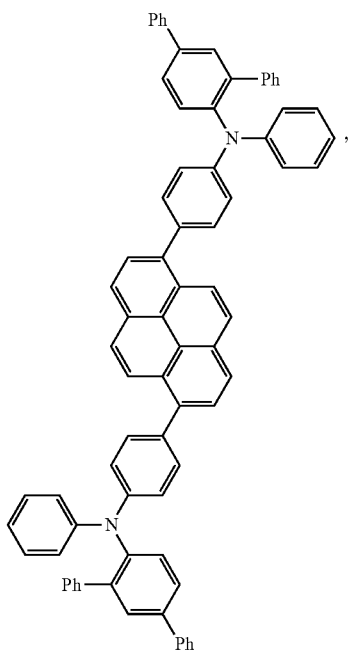
In some embodiments, $R^1$ and $R^6$ each have the formula T1
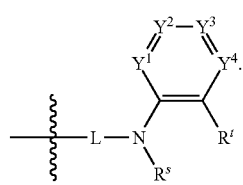
T1
In some specific embodiments, such compounds can be selected from the group consisting of:
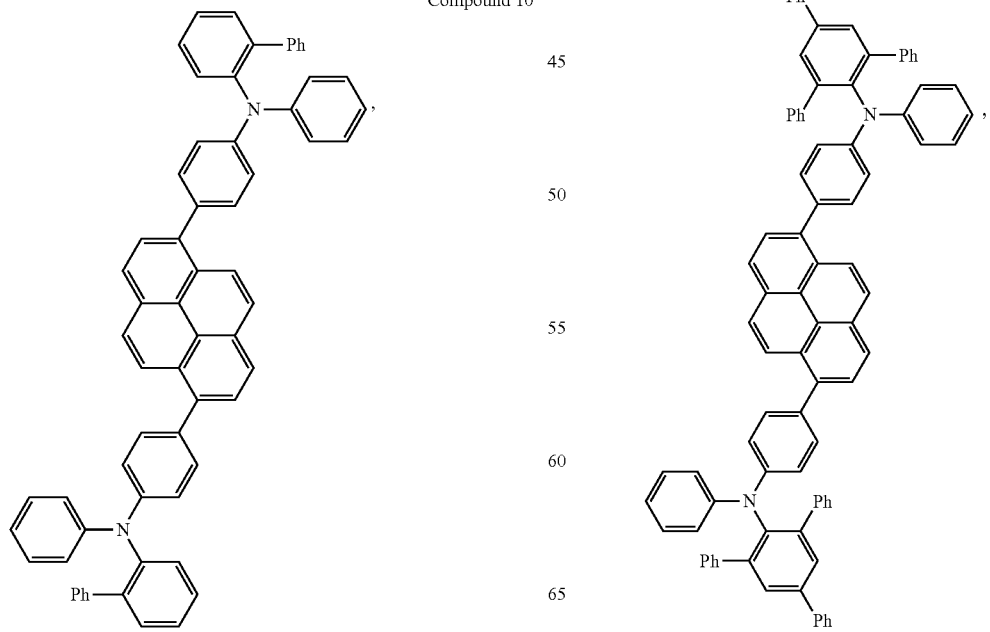
Compound 10
Compound 12

-continued
Compound 13
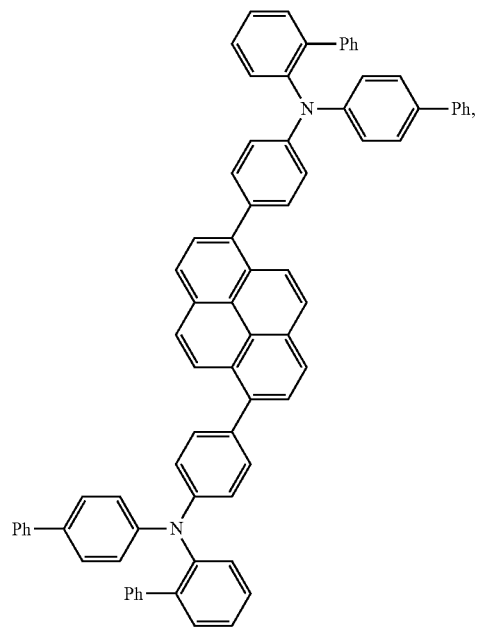
Compound 14
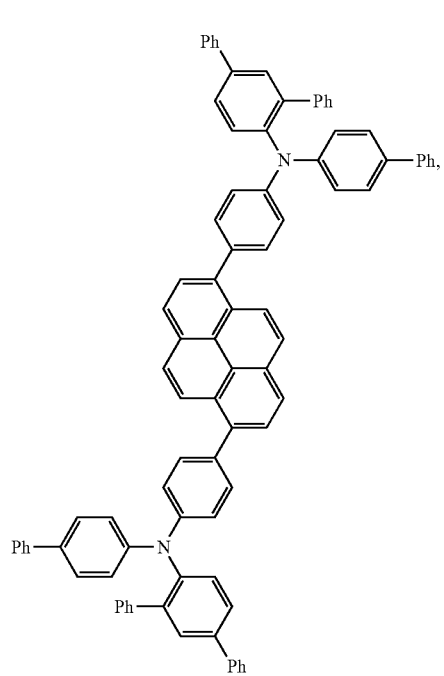
Compound 15
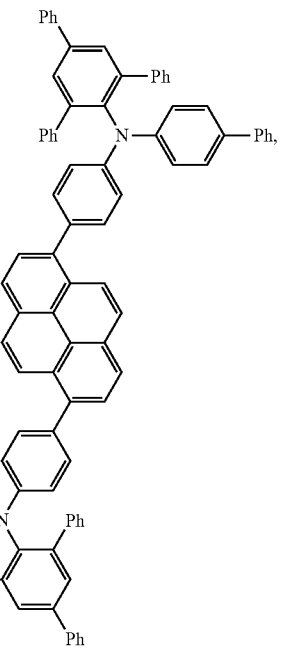
Compound 22
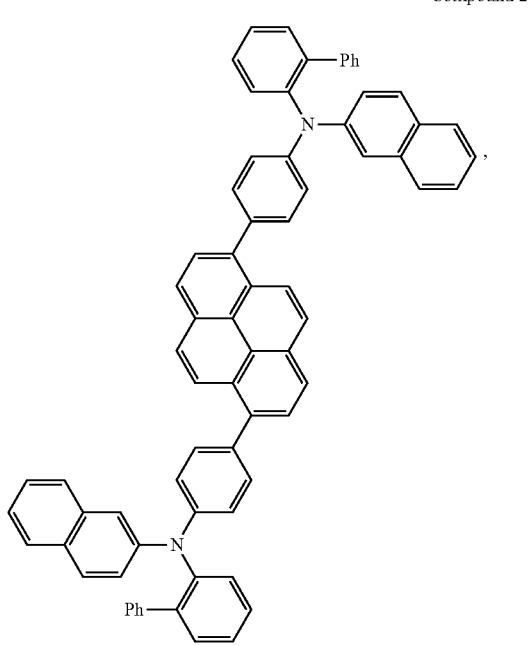

Compound 23
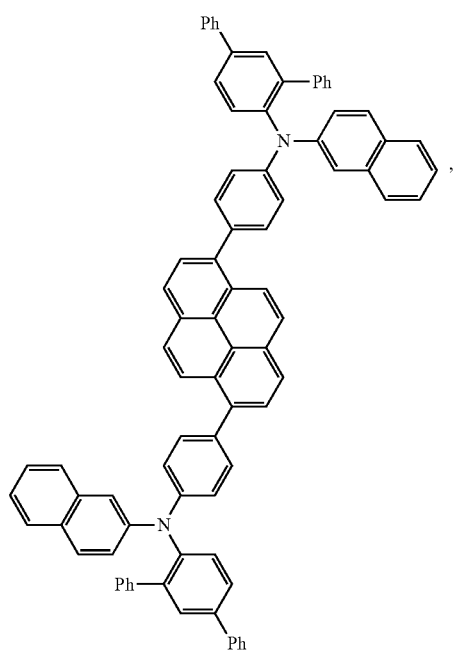
Compound 24
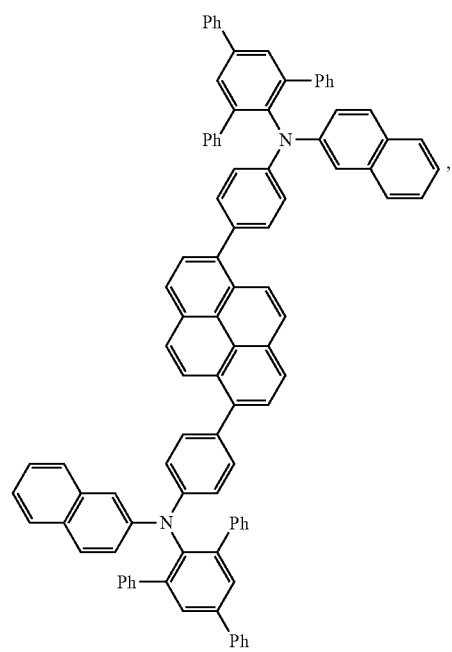
Compound 25
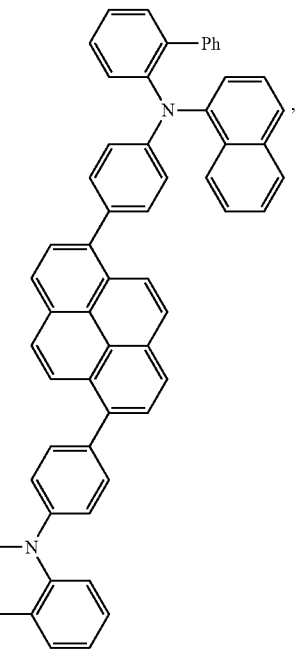
Compound 26
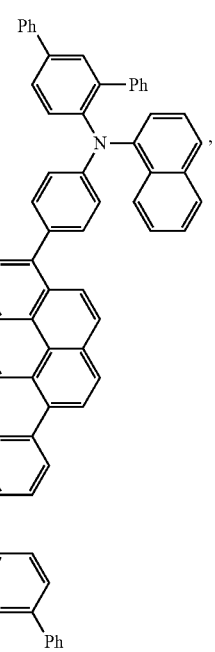

Compound 27
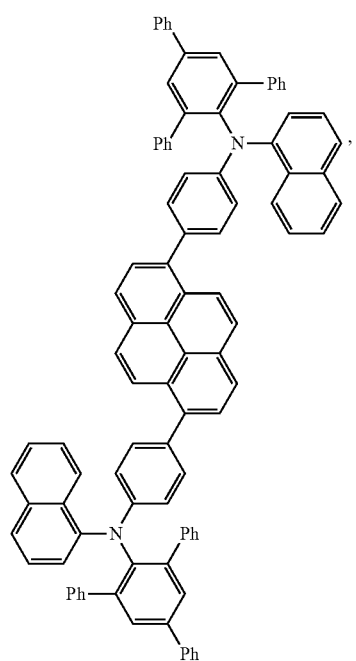
Compound 28
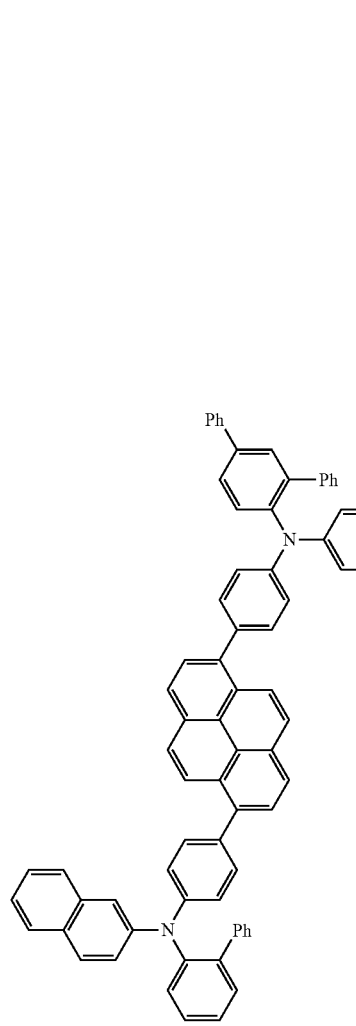
Compound 29
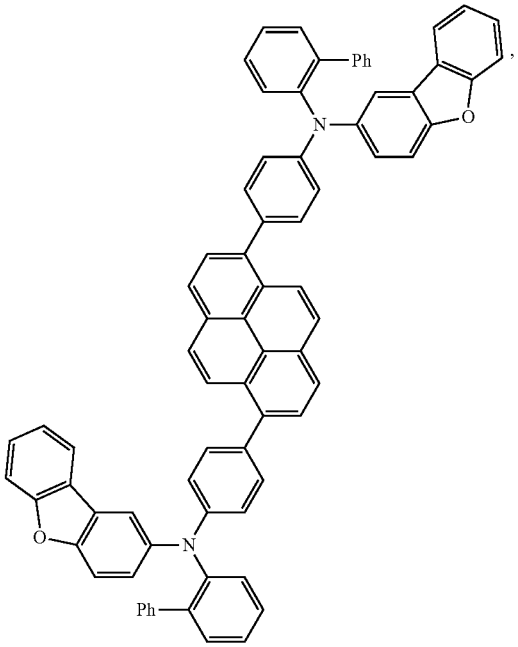
Compound 30
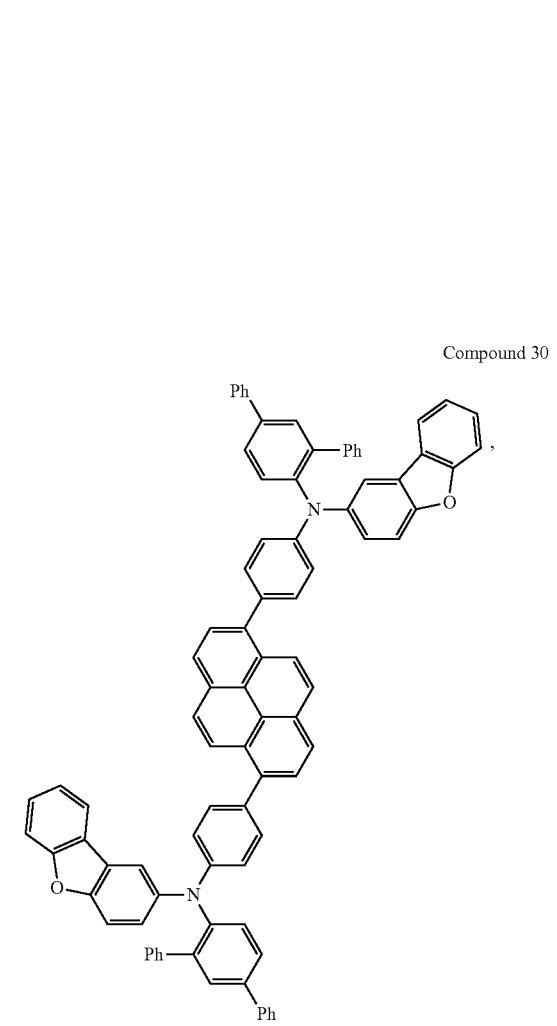

Compound 31
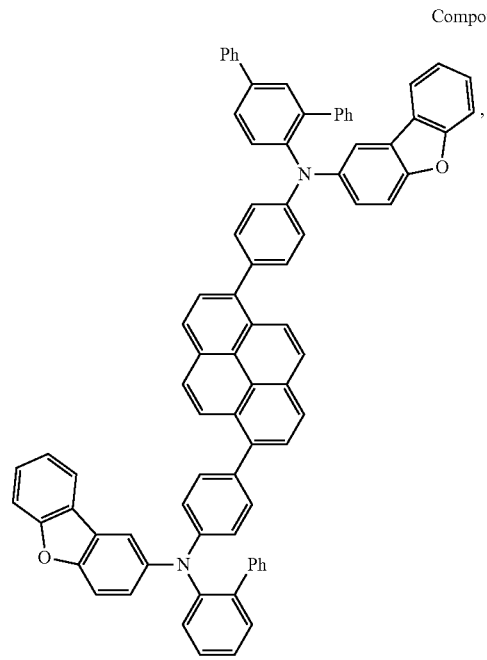
Compound 32
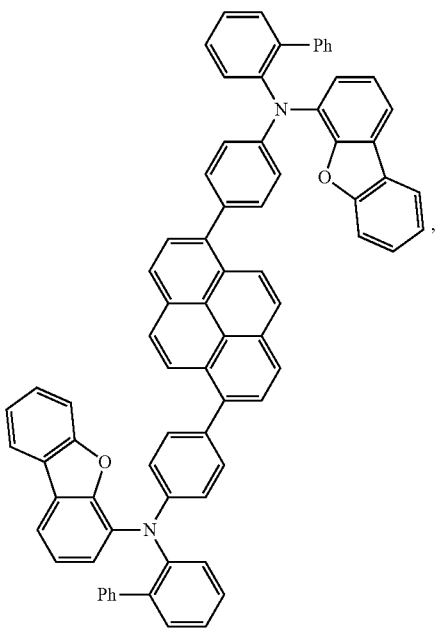
Compound 33
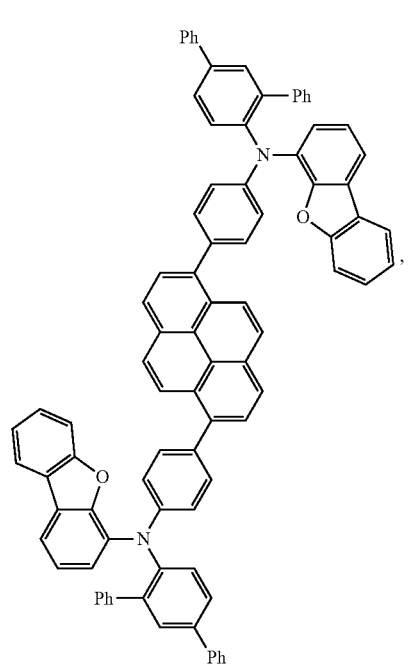
Compound 34
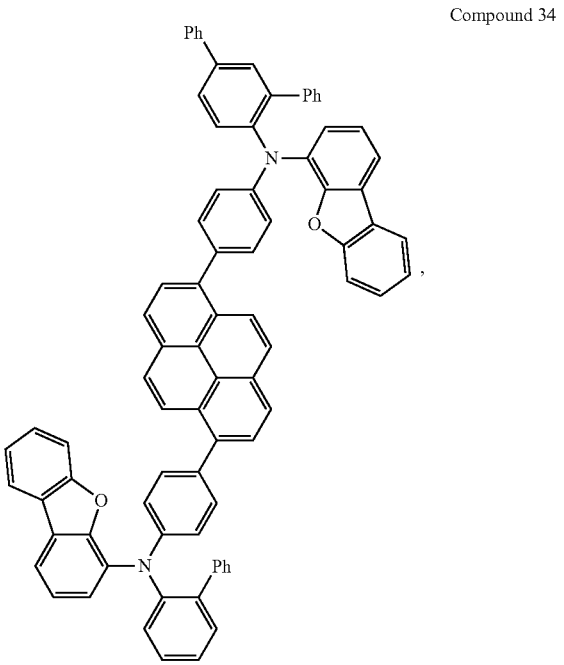

Compound 35
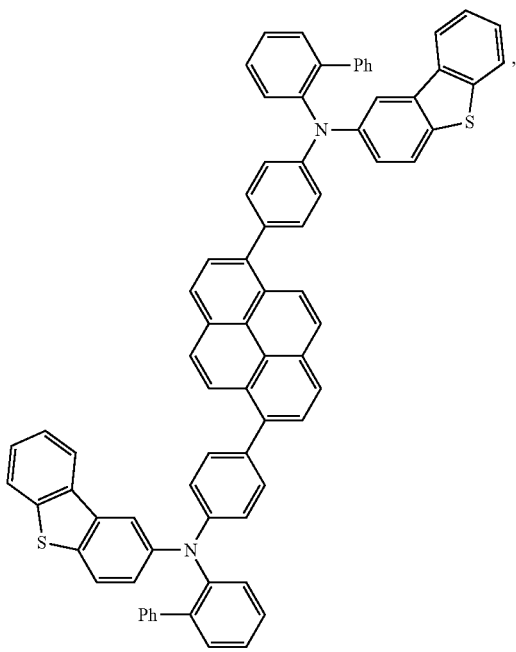
Compound 36
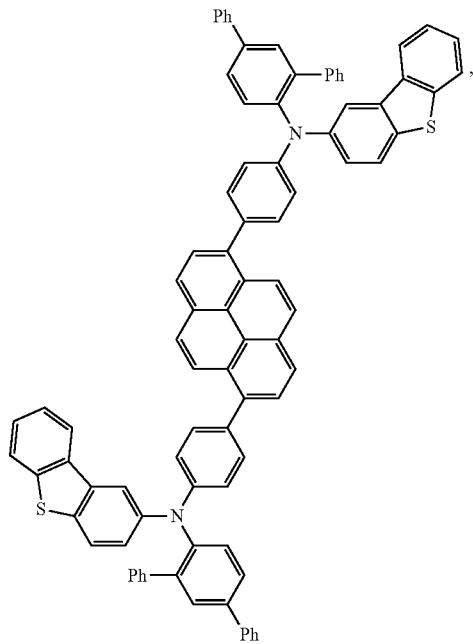
Compound 37
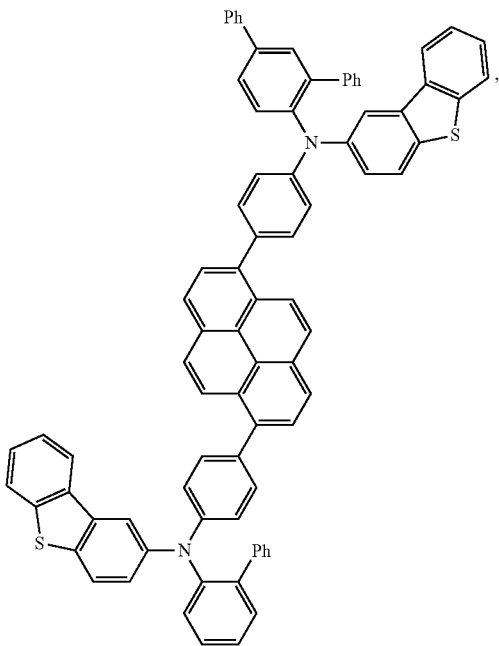
Compound 38
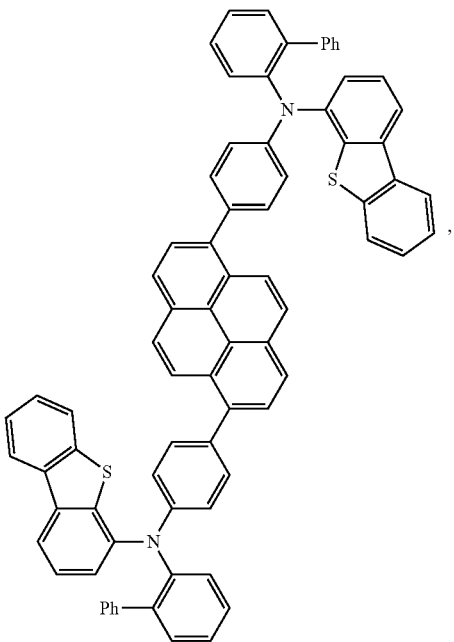

-continued
Compound 39
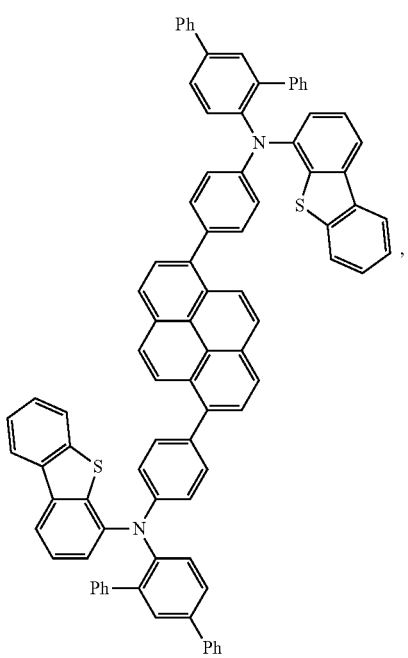
Compound 40
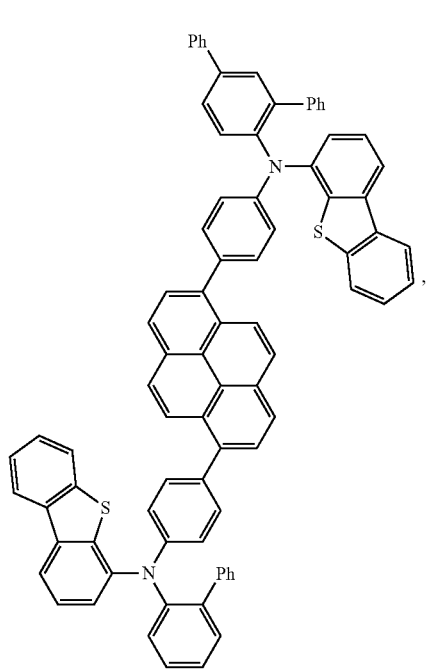
Compound 41
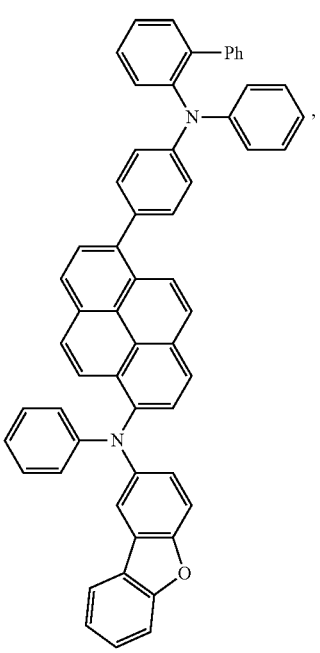
Compound 42
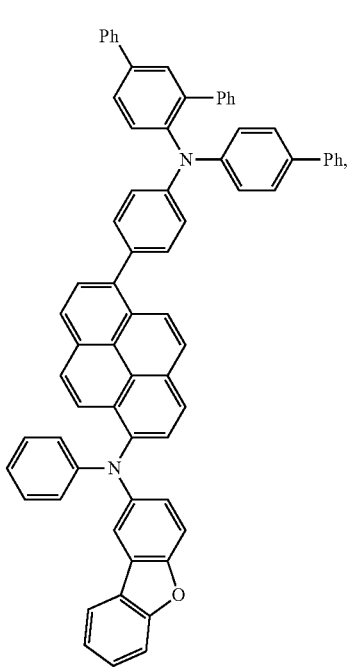

Compound 43
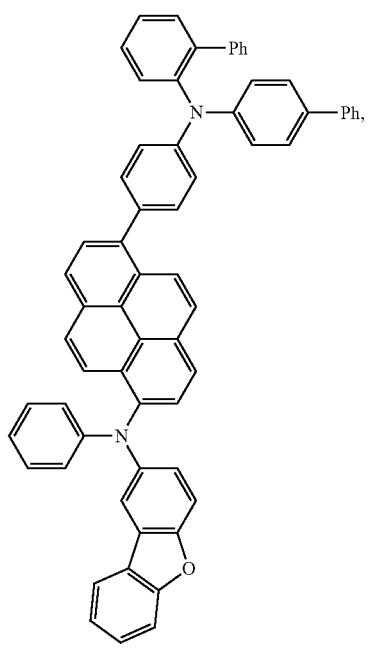
Compound 48
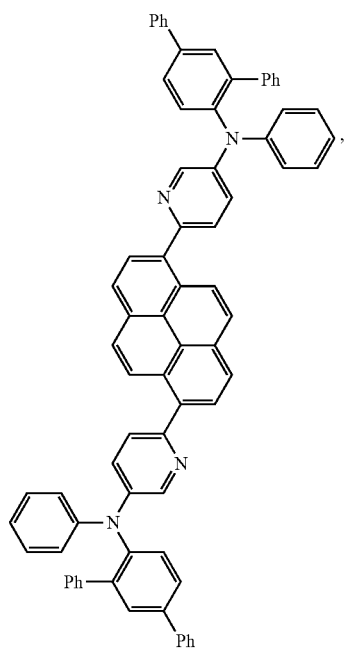
Compound 47
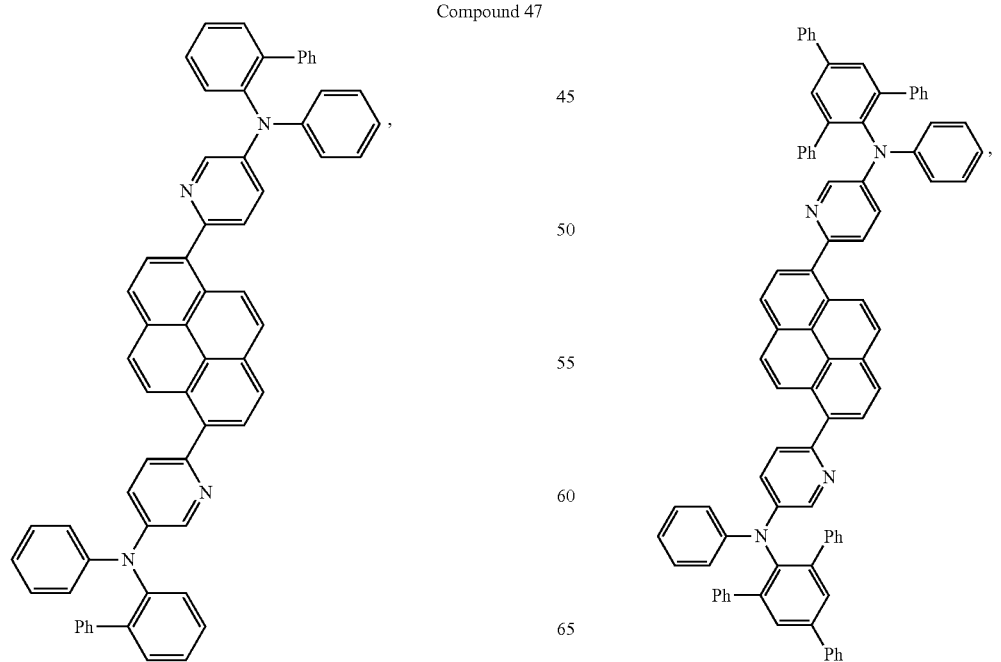
Compound 49
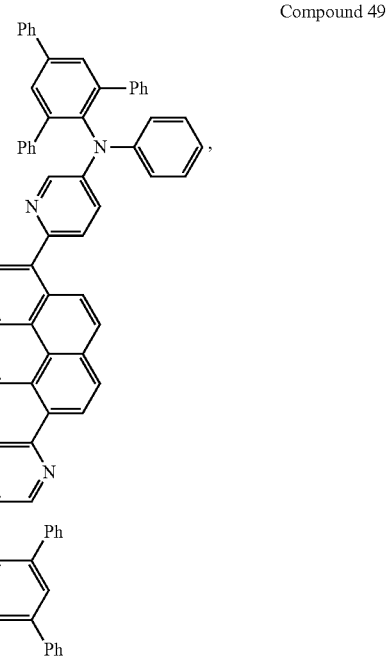

Compound 50
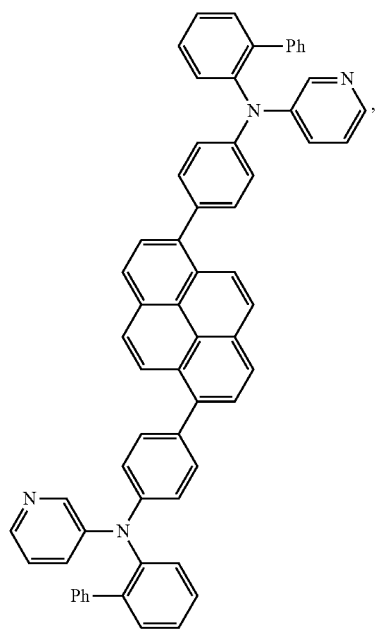
Compound 51
Compound 52
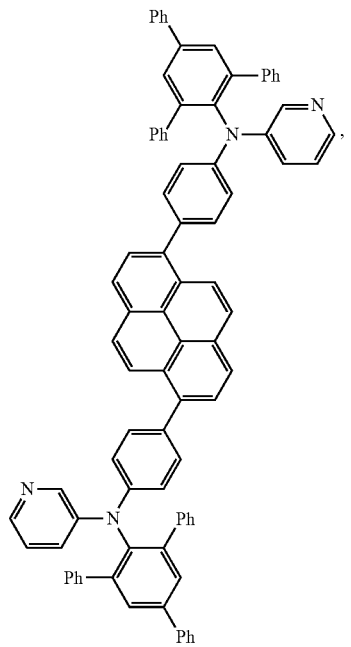
Compound 53
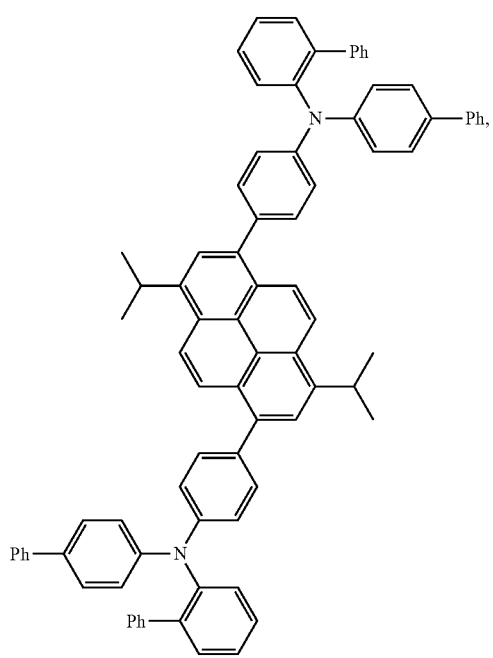

Compound 54
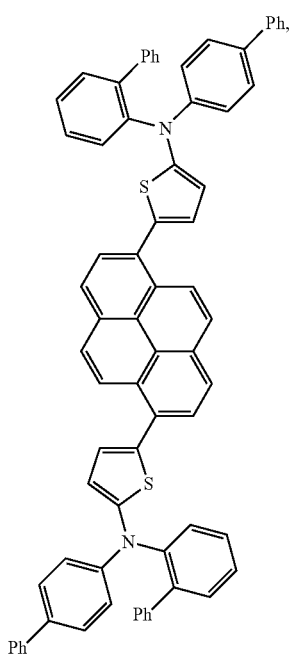
Compound 56
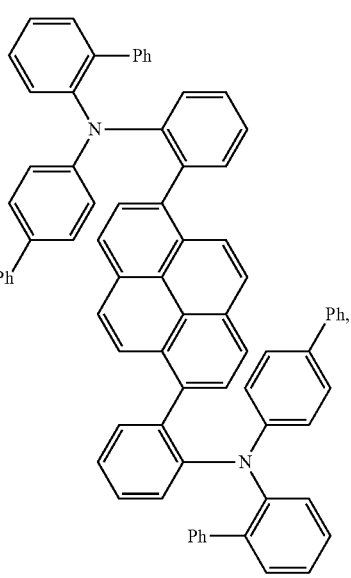
Compound 55
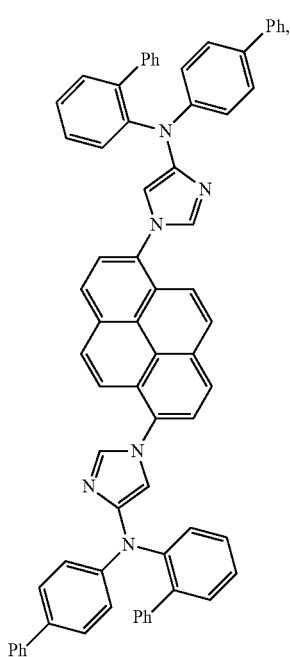
Compound 57
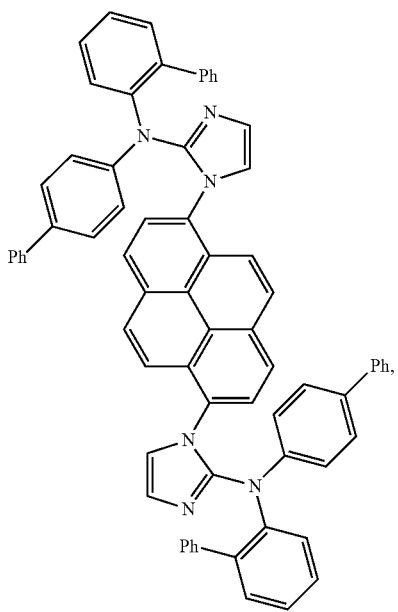

Compound 58
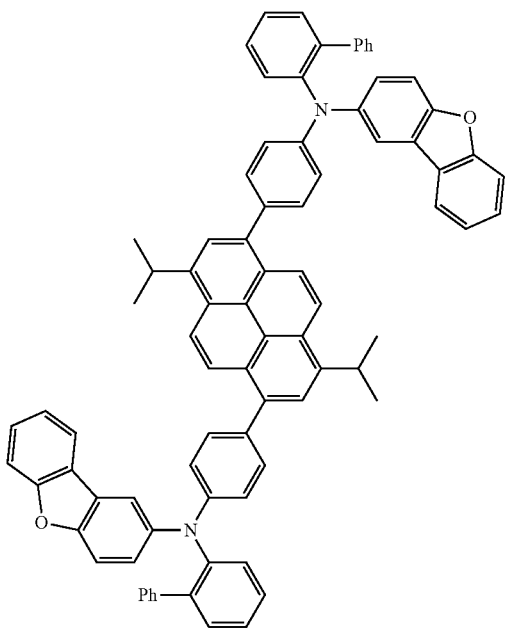
Compound 60
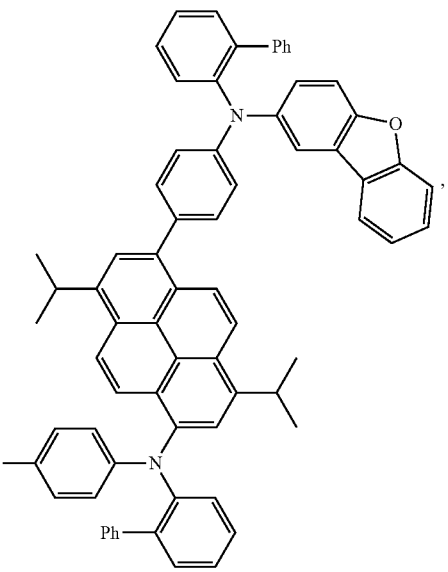
Compound 59
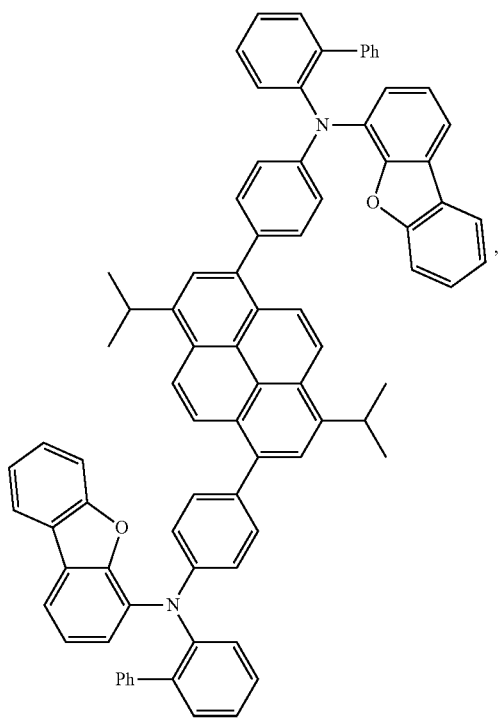
Compound 61
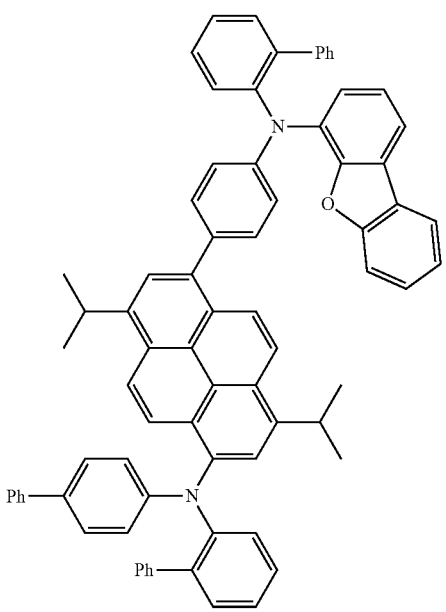

Compound 62
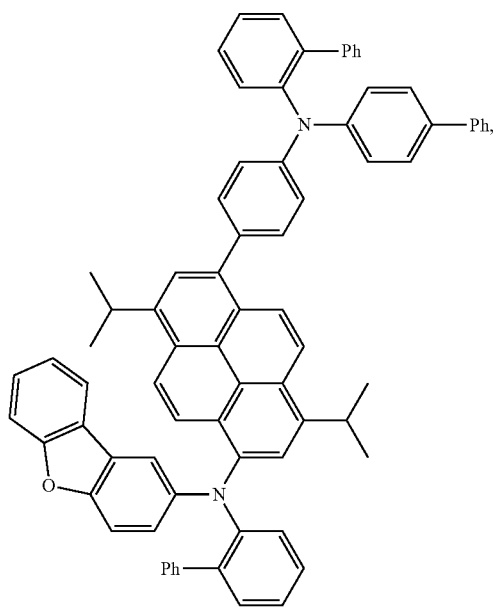
Compound 64
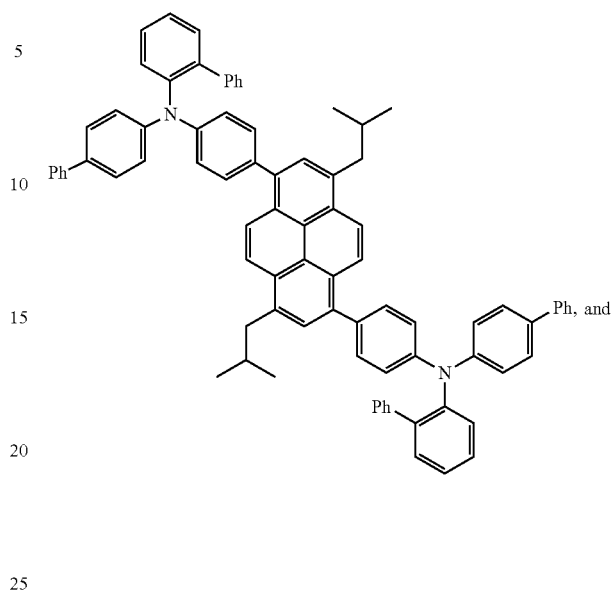
Compound 65
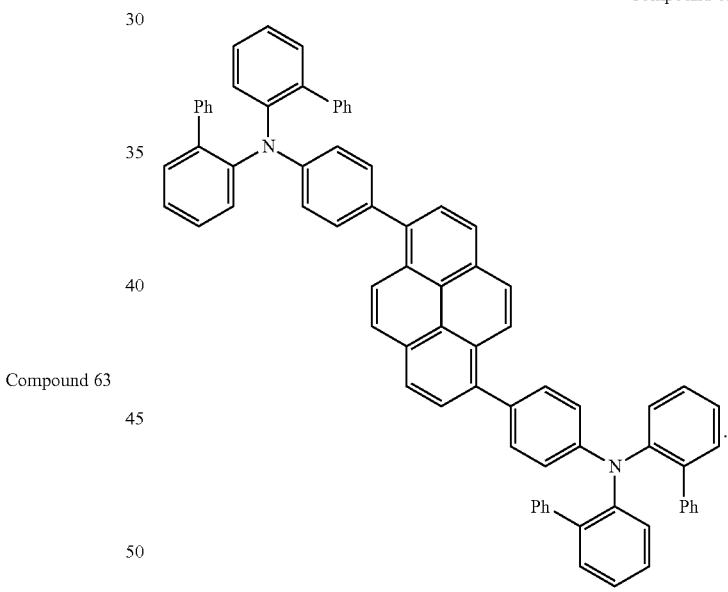
Compound 63
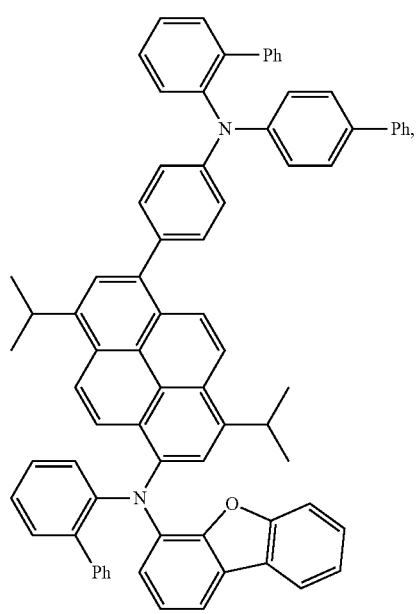
In some embodiments, $R^1$ has the formula
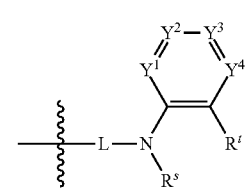
T1
and $R^6$ is amino. In some specific embodiments, such compounds can be selected from the group consisting of:

Compound 16
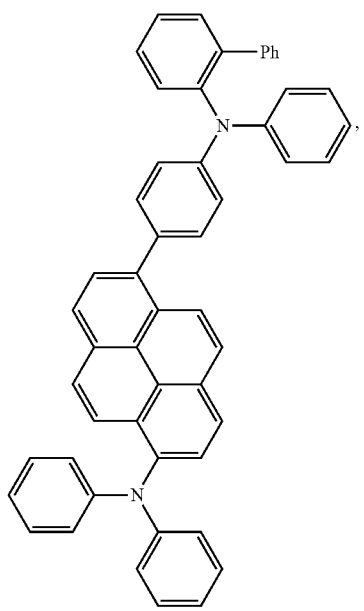
Compound 17
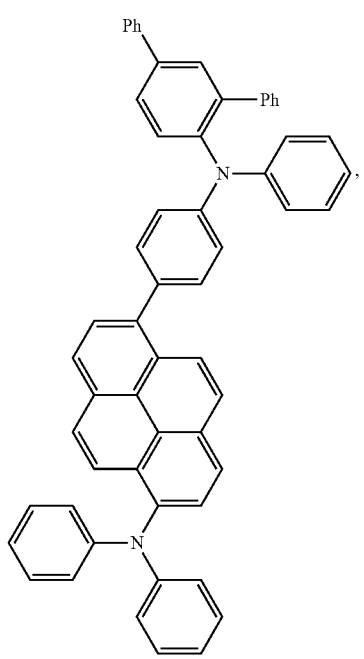
Compound 18
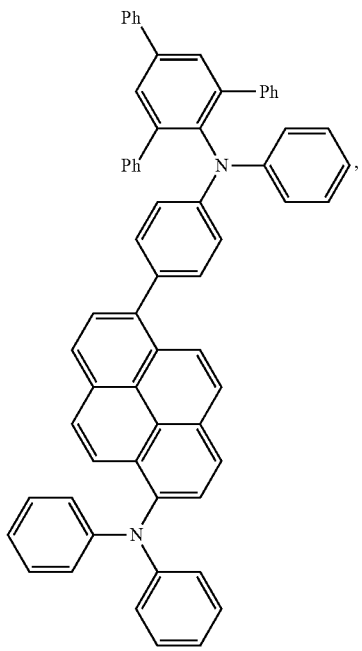
Compound 19
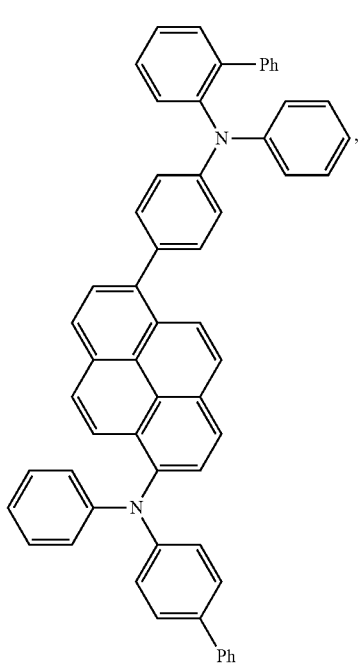

Compound 20
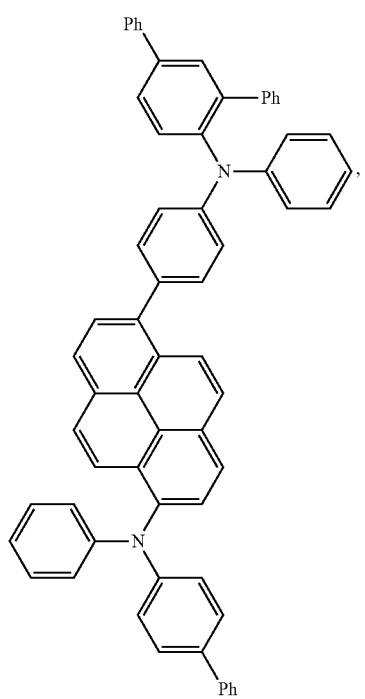
Compound 21
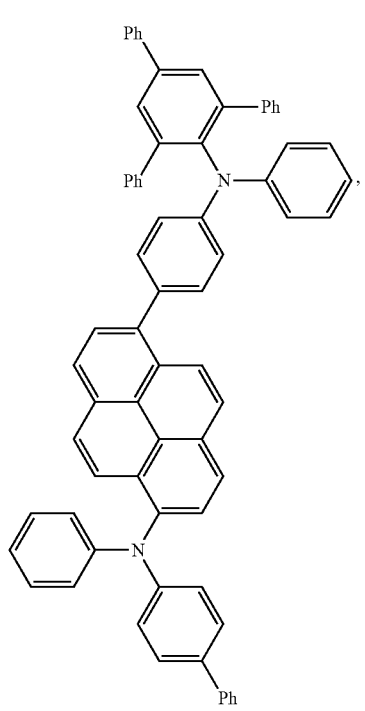
Compound 41
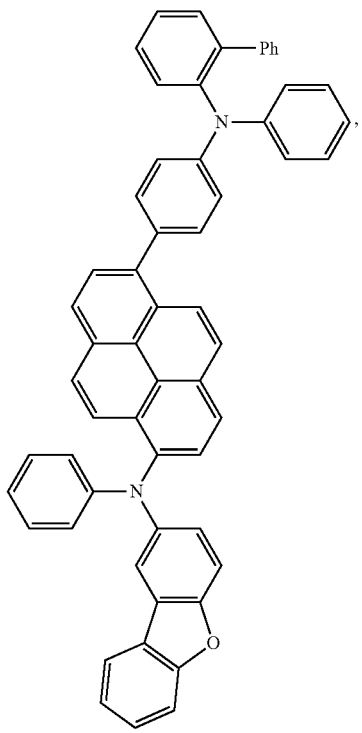
Compound 42
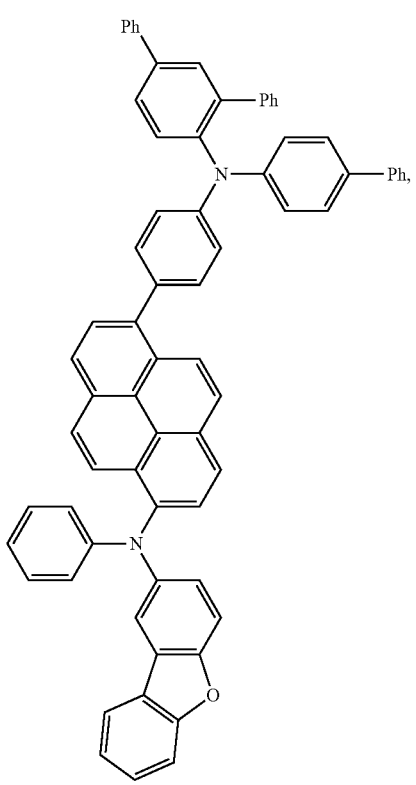

Compound 43
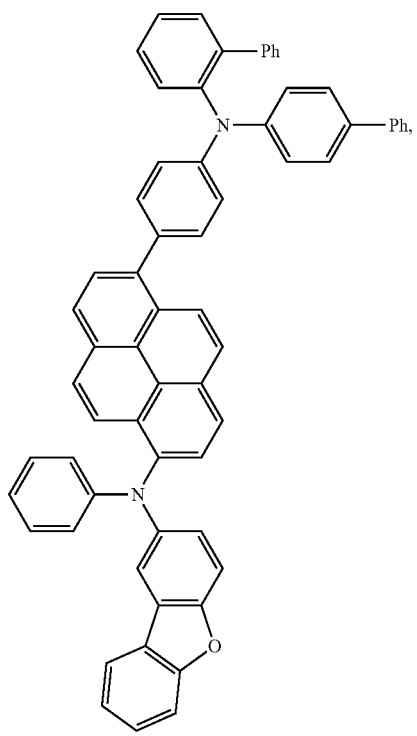
Compound 45
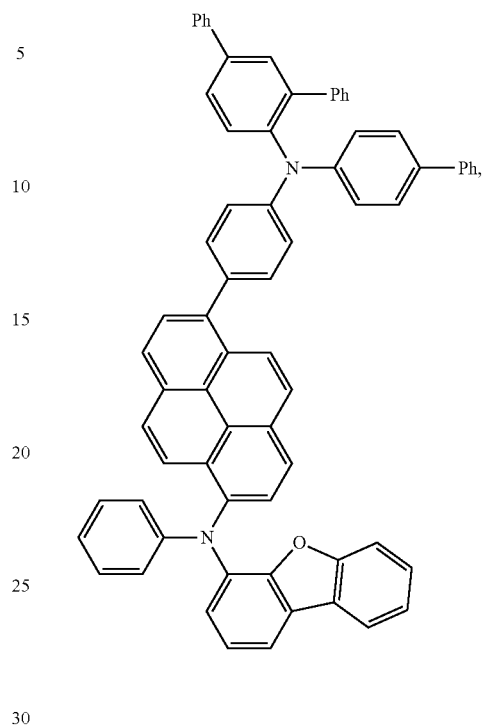
Compound 44
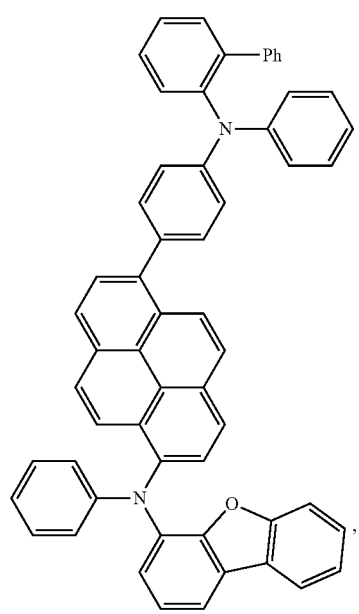
Compound 46
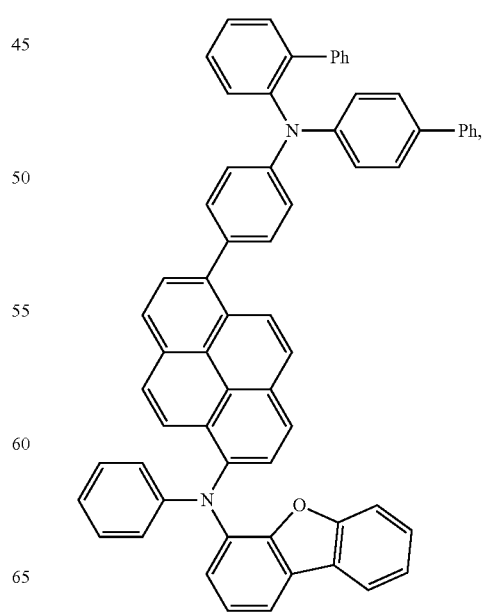

Compound 60

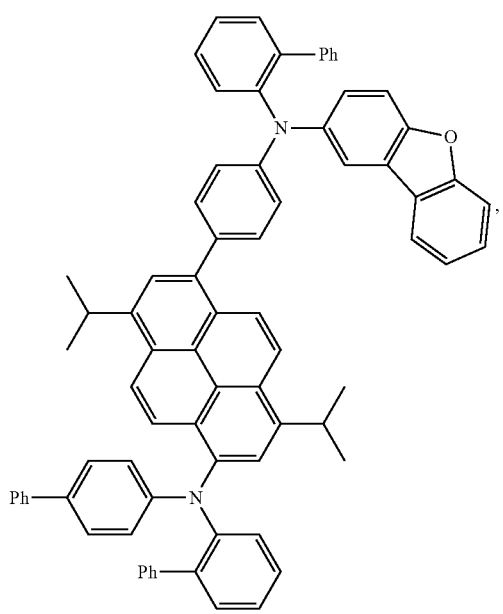

Compound 61

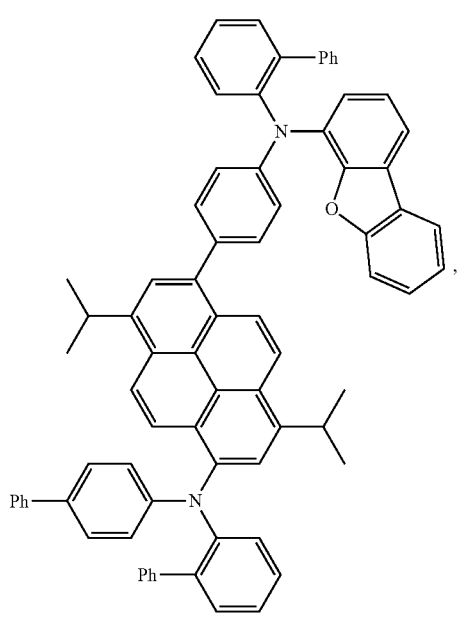

Compound 62

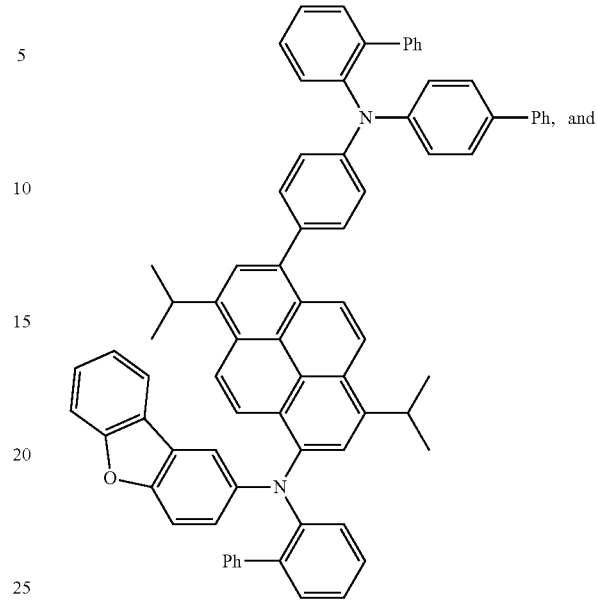

Compound 63

According to another aspect of the present disclosure, a first device is also provided. The first device includes a first organic light emitting device, that includes an anode, a cathode, and an organic layer disposed between the anode and the cathode. The organic layer can include a host and a phosphorescent dopant. The organic layer can include a compound according to Formula I, and its variations as described herein. In some embodiments, the organic layer can also include a host material. In some embodiments, the host material can contain aromatic groups selected from the group consisting of naphthalene, triphenylene, anthracene, chrysene, triazene, carbazole, dibenzofuran, dibenzothiophene, dibenzoselenophene, and various aza analogs thereof.

The first device can be one or more of a consumer product, an organic light-emitting device and a lighting panel. The organic layer can be an emissive layer and the compound can be an emissive dopant in some embodiments, while the compound can be a non-emissive dopant in other embodiments.

In yet another aspect of the present disclosure, a formulation that comprises a compound according to Formula I is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

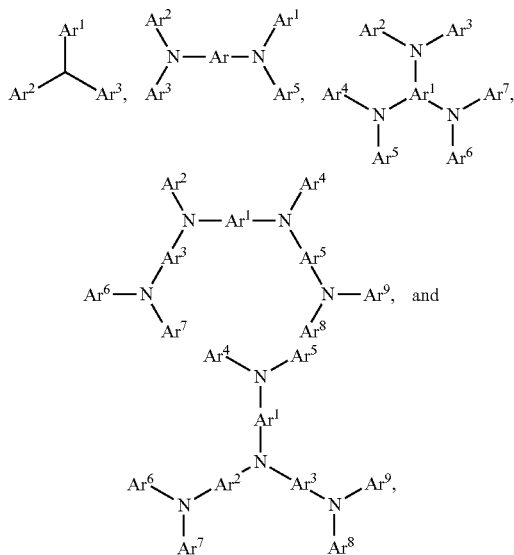

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

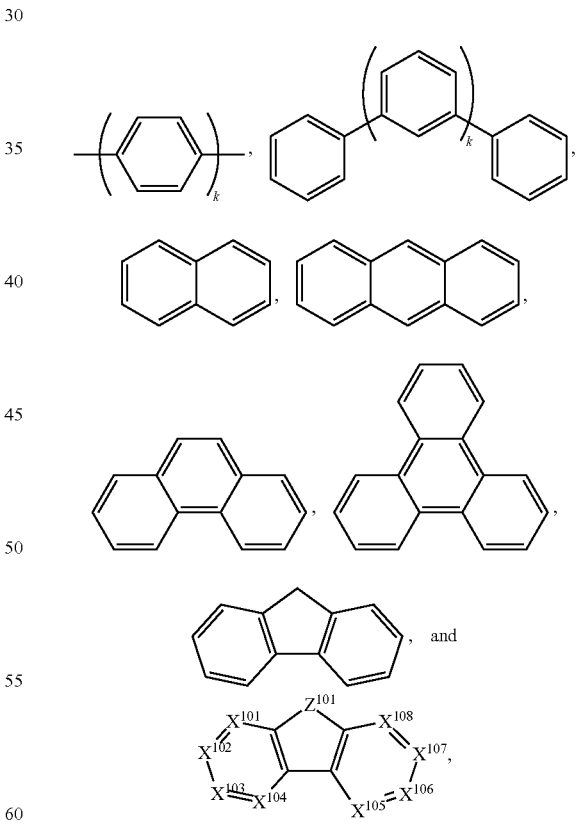

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

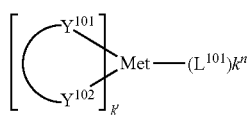

wherein Met is a metal, which can have an atomic weight greater than 40; ($Y^{101}$—$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$—$Y^{102}$) is a 2-phenylpyridine derivative. In another aspect, ($Y^{101}$—$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.
Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

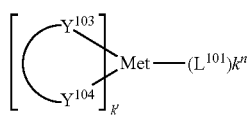

wherein Met is a metal; ($Y^{103}$—$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

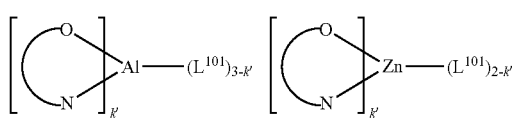

wherein (O—N) is a bidentate ligand, having metal coordinated to atoms O and N.

In another aspect, Met is selected from Ir and Pt. In a further aspect, ($Y^{103}$—$Y^{104}$) is a carbene ligand.

Examples of organic compounds used as host are selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

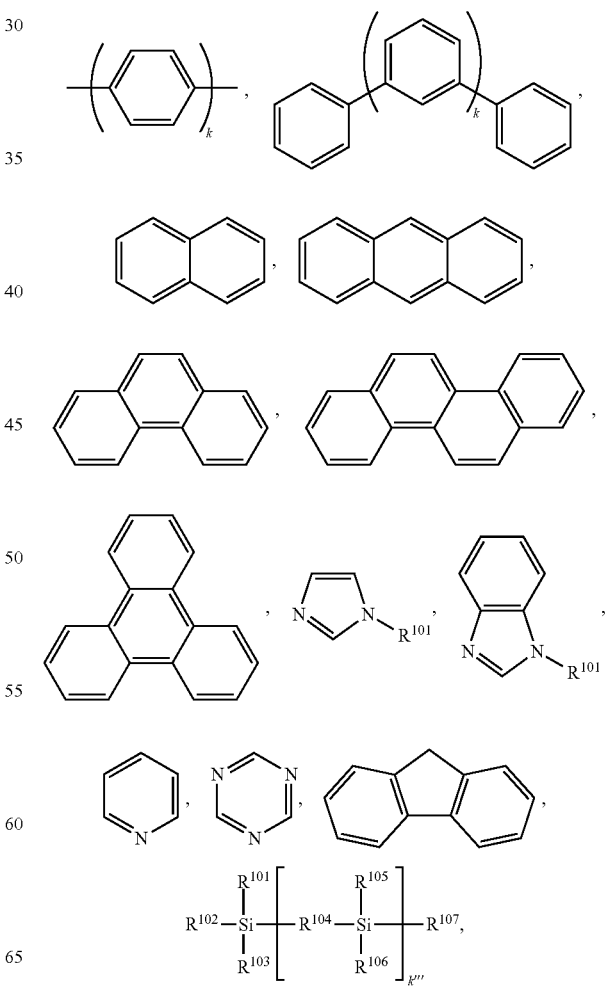

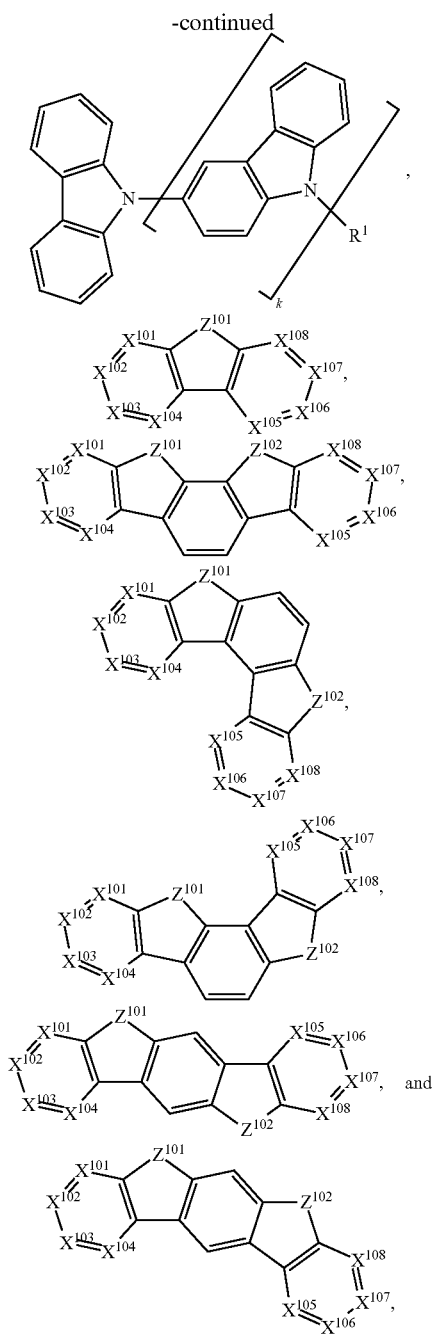

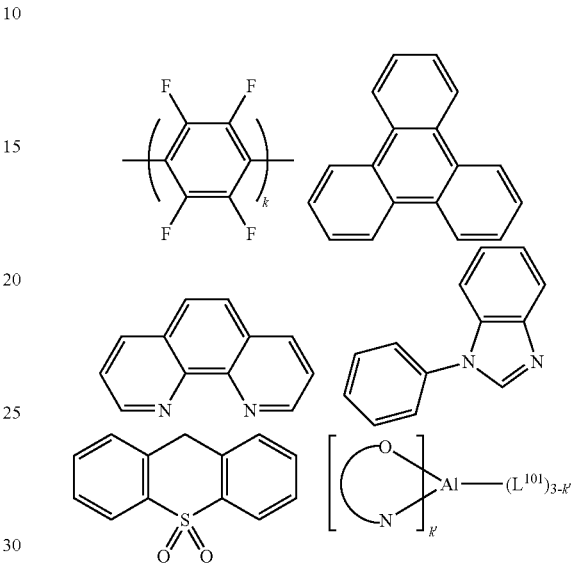

in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

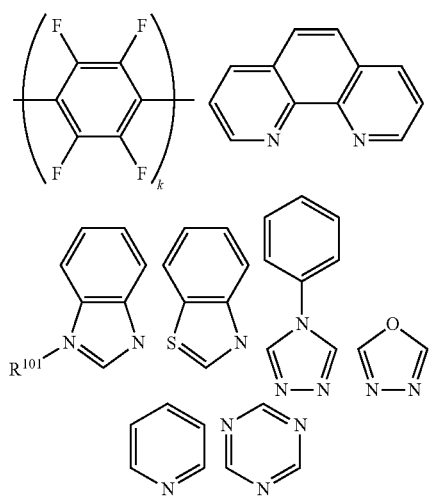

wherein $R^{101}$ and $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result -continued

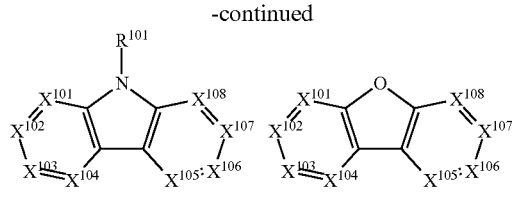

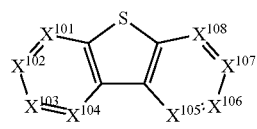

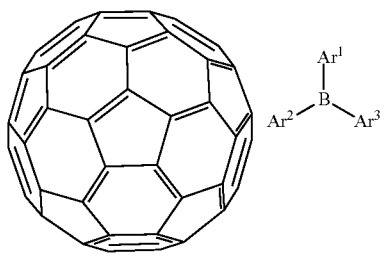

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

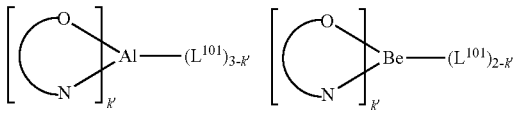

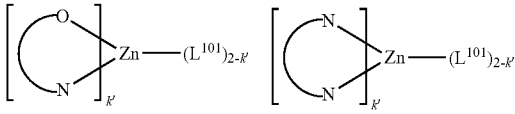

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1

| MATERIAL | EXAMPLES OF MATERIAL | PUBLICATIONS |
|---|---|---|
| Hole injection materials | | |
| Phthalocyanine and porphyrin compounds | | Appl. Phys. Lett. 69, 2160 (1996) |

TABLE 1-continued

| MATERIAL | EXAMPLES OF MATERIAL | PUBLICATIONS |
| --- | --- | --- |
| Starburst triarylamines | | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polypthiophene) | | Synth. Met. 87, 171 (1997) WO2007002683 |
| Phosphonic acid and sliane SAMs | | US20030162053 |
| Triarylamine or polythiophene polymers with conductivity dopants | and | EP1725079A1 |

TABLE 1-continued
| MATERIAL | EXAMPLES OF MATERIAL | PUBLICATIONS |
|---|---|---|
| | 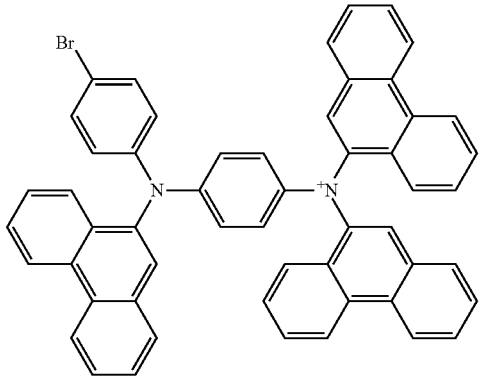 [SMILES: Brc1ccc(N(c2ccc([NH+](c3cc4ccccc4c4ccccc34)c3cc4ccccc4c4ccccc34)cc2)c2cc3ccccc3c3ccccc23)cc1] | |
| | 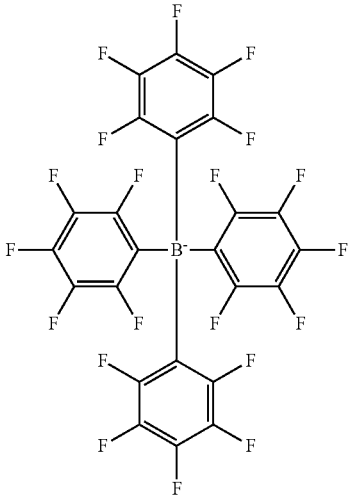 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Organic compounds with conductive inorganic compounds, such as molybdenum and tungsten oxides | 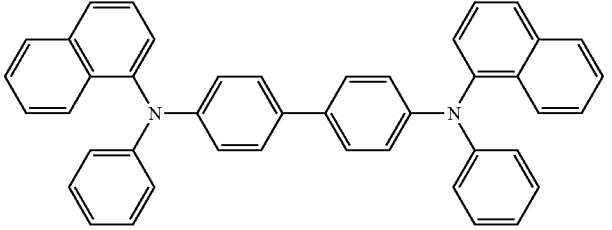 | US20050123751<br>SID Symposium Digest, 37, 923 (2006)<br>WO2009018009 |
| n-type semiconducting organic complexes | 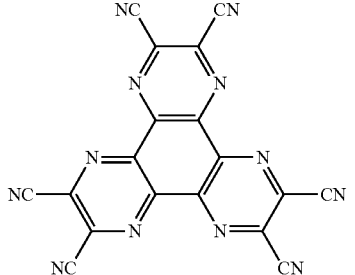 [SMILES: N#Cc1nc2c3nc(C#N)c(C#N)nc3c3nc(C#N)c(C#N)nc3c2nc1C#N] | US20020158242 |

TABLE 1-continued

| MATERIAL | EXAMPLES OF MATERIAL | PUBLICATIONS |
| --- | --- | --- |
| Metal organometallic complexes | | US20060240279 |
| Cross-linkable compounds | | US20080220265 |
| Polythiophene based polymers and copolymers | | WO 2011075644<br>EP2350216 |

Hole transporting materials

| | | |
| --- | --- | --- |
| Triarylamines (e.g., TPD, α-NPD) | | Appl. Phys. Lett. 51, 913 (1987) |

TABLE 1-continued
| MATERIAL | EXAMPLES OF MATERIAL | PUBLICATIONS |
|---|---|---|
| | 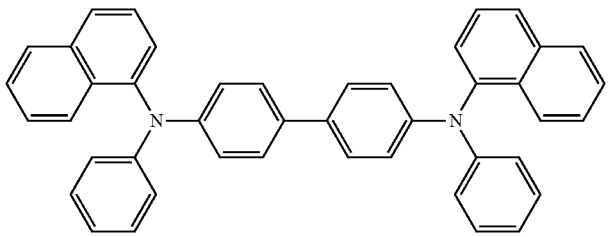 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |
| | 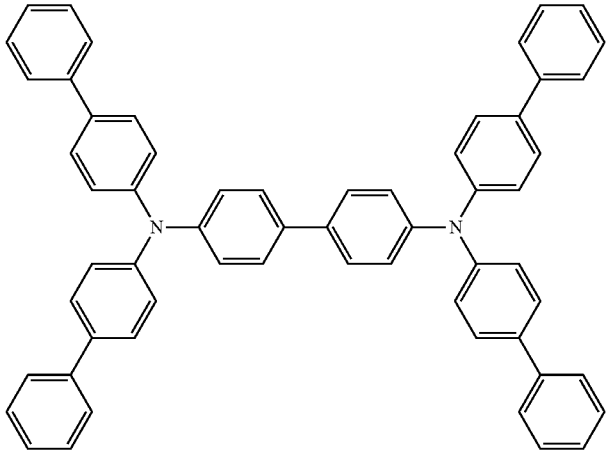 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 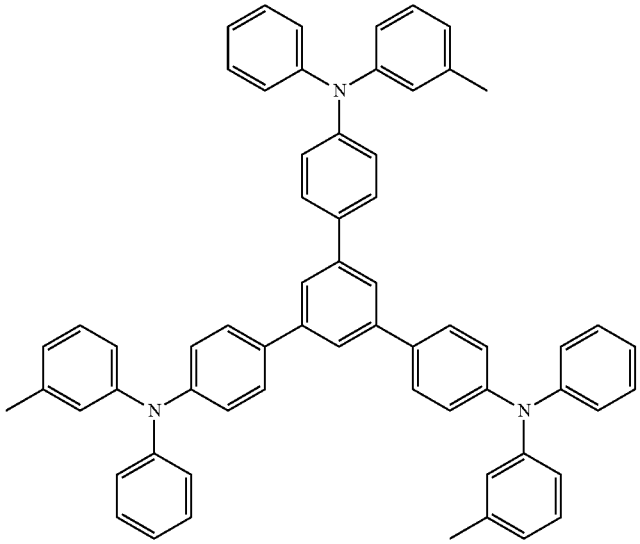 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 1-continued

| MATERIAL | EXAMPLES OF MATERIAL | PUBLICATIONS |
| --- | --- | --- |
| | | Appl. Phys. Lett. 90, 183503 (2007) |
| | | Appl. Phys. Lett. 90, 183503 (2007) |
| Triaylamine on spirofluorene core | | Synth. Met. 91, 209 (1997) |
| Arylamine carbazole compounds | | Adv. Mater. 6, 677 (1994), US20080124572 |

TABLE 1-continued
| MATERIAL | EXAMPLES OF MATERIAL | PUBLICATIONS |
|---|---|---|
| Triarylamine with (di)benzothiophene/ (di)benzofuran | 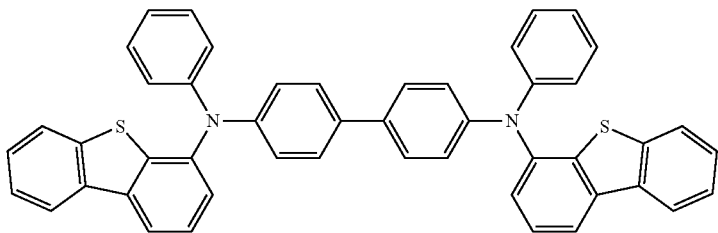 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 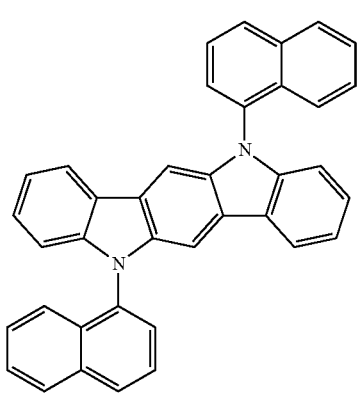 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 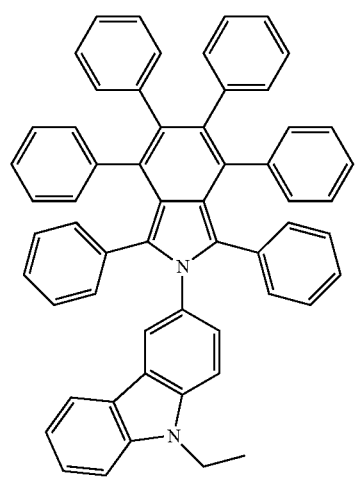 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 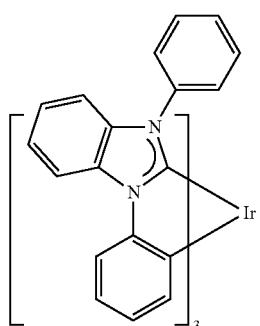 | US20080018221 |
Phosphorescent OLED host materials
Red hosts TABLE 1-continued
| MATERIAL | EXAMPLES OF MATERIAL | PUBLICATIONS |
|---|---|---|
| Arylcarbazoles | 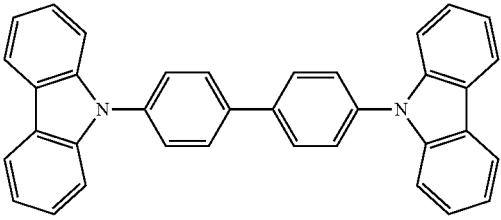 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., Alq$_3$, BAlq) | 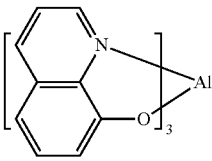 | Nature 395, 151 (1998) |
|  | 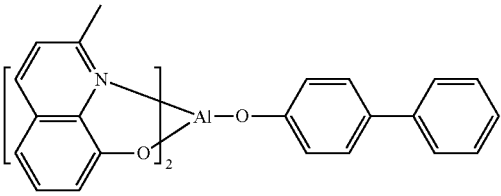 | US20060202194 |
|  | 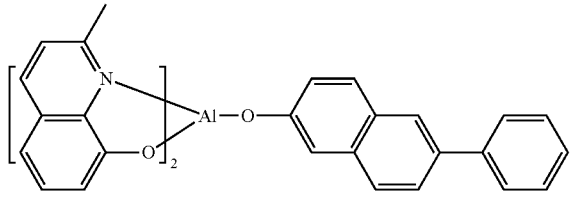 | WO2005014551 |
|  | 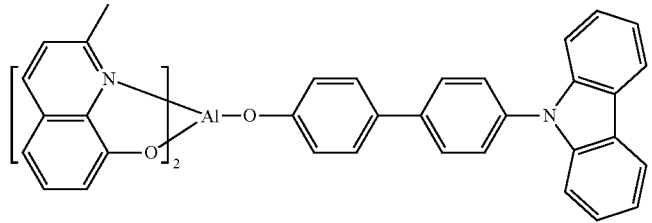 | WO2006072002 |
| Metal phenoxybenzothiazole compounds | 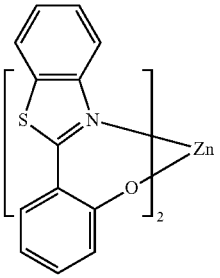 | Appl. Phys. Lett. 90, 123509 (2007) |
| Conjugated oligomers and polymers (e.g., polyfluorene) | 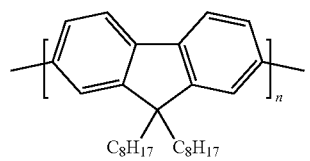 | Org. Electron. 1, 15 (2000) |

TABLE 1-continued

| MATERIAL | EXAMPLES OF MATERIAL | PUBLICATIONS |
| --- | --- | --- |
| Aromatic fused rings | | WO2009066779, WO2009066778, WO2009063833, US20090045731, US20090045730, WO2009008311, US20090008605, US20090009065 |
| Zinc complexes | | WO2010056066 |
| Chrysene based compounds | | WO2011086863 |
| Green hosts | | |
| Arylcarbazoles | | Appl. Phys. Lett. 78, 1622 (2001) |
| | | US20030175553 |
| | | WO2001039234 |

TABLE 1-continued
| MATERIAL | EXAMPLES OF MATERIAL | PUBLICATIONS |
|---|---|---|
| Aryltriphenylene compounds | 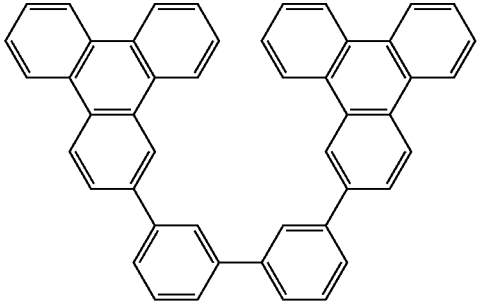 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 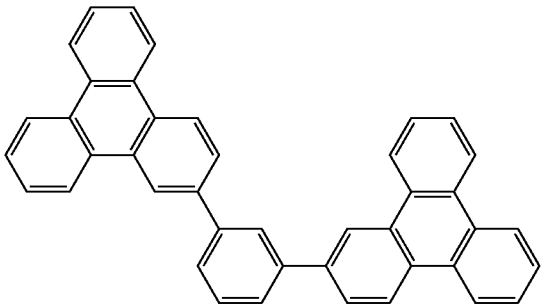 [SMILES: c1cc(-c2ccc3c4ccccc4c4ccccc4c3c2)cc(-c2ccc3c4ccccc4c4ccccc4c3c2)c1] | US20060280965 |
| | 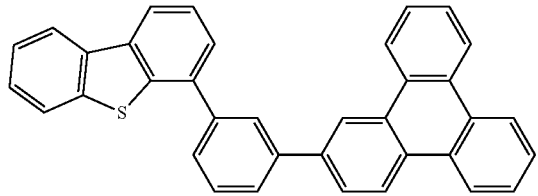 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 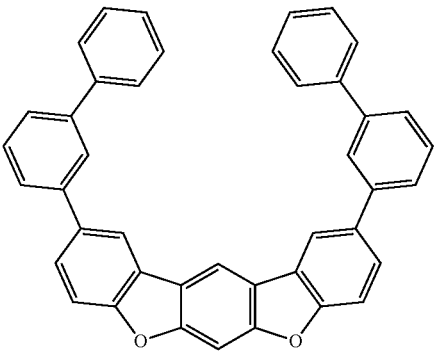 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 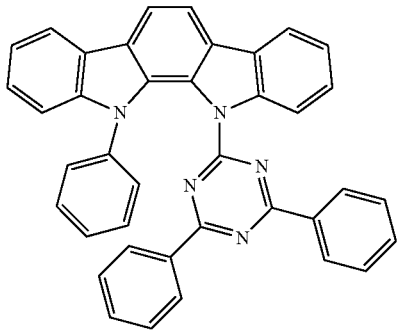 [SMILES: c1ccc(-c2nc(-c3ccccc3)nc(-n3c4ccccc4c4ccc5c6ccccc6n(-c6ccccc6)c5c43)n2)cc1] | WO2008056746 |

TABLE 1-continued
| MATERIAL | EXAMPLES OF MATERIAL | PUBLICATIONS |
|---|---|---|
| | 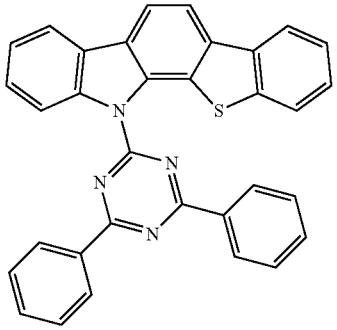 [SMILES: c1ccc(-c2nc(-c3ccccc3)nc(-n3c4ccccc4c4ccc5c6ccccc6sc5c43)n2)cc1] | WO2010107244 |
| Aza-carbazole/ DBT/DBF | 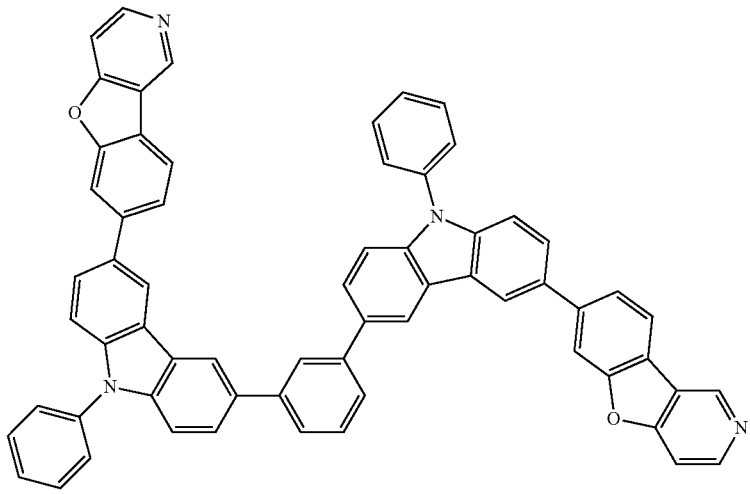 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 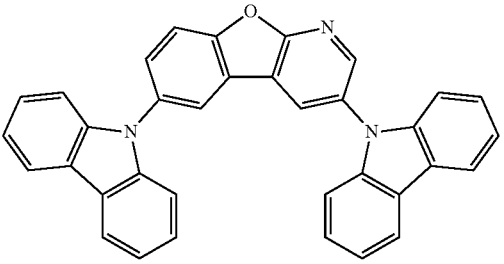 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 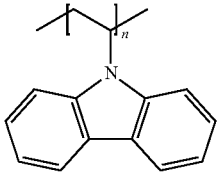 | Appl. Phys. Lett. 77, 2280 (2000) |
| Spirofluorene compounds | 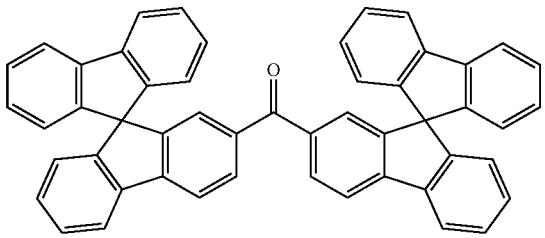 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |

TABLE 1-continued

| MATERIAL | EXAMPLES OF MATERIAL | PUBLICATIONS |
|---|---|---|
| Metal phenoxybenzooxazole compounds | | WO2005089025 |
| | | WO2006132173 |
| | | JP200511610 |
| Spirofluorene-carbazole compounds | | JP2007254297 |
| | | JP2007254297 |

TABLE 1-continued

| MATERIAL | EXAMPLES OF MATERIAL | PUBLICATIONS |
| --- | --- | --- |
| Indolocabazoles | | WO2007063796 |
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |

TABLE 1-continued

| MATERIAL | EXAMPLES OF MATERIAL | PUBLICATIONS |
| --- | --- | --- |
| Metal phenoxypyridine compounds | | WO2005030900 |
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
| | | US20070190359 |
| Dibenzothiophene/ Dibenzofuran- carbazole compounds | | WO2006114966, US20090167162 |
| | | US20090167162 |

TABLE 1-continued
| MATERIAL | EXAMPLES OF MATERIAL | PUBLICATIONS |
|---|---|---|
| | 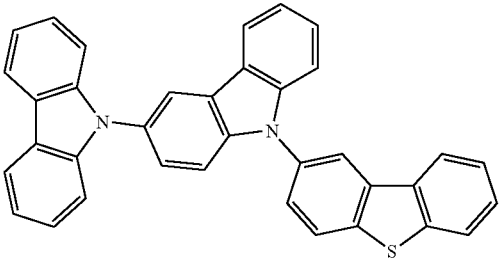 [SMILES: c1ccc2c(c1)sc1ccc(-n3c4ccccc4c4cc(-n5c6ccccc6c6ccccc65)ccc43)cc12] | WO2009086028 |
| | 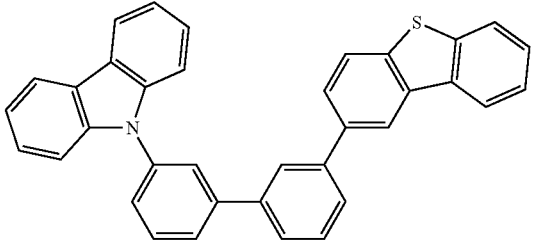 [SMILES: c1cc(-c2cccc(-n3c4ccccc4c4ccccc43)c2)cc(-c2ccc3sc4ccccc4c3c2)c1] | US20090030202, US20090017330 |
| | 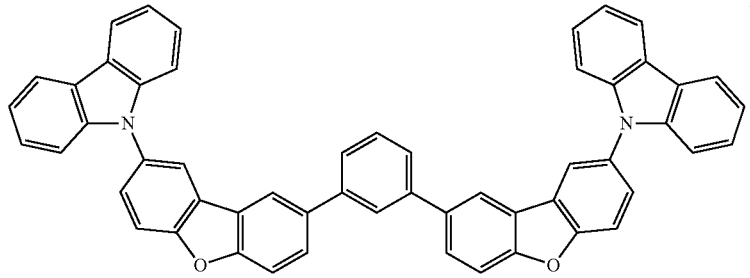 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 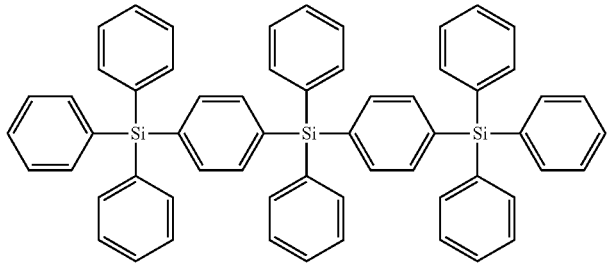 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 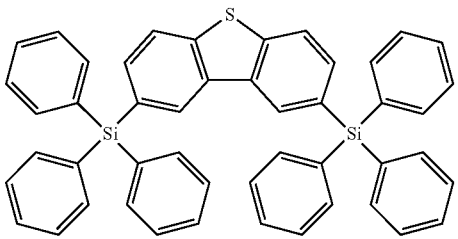 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| Carbazole linked by non-conjugated groups | | US20040115476 |
| Aza-carbazoles | | US20060121308 |
| High triplet metal organometallic complex | | U.S. Pat. No. 7,154,114 |

Phosphorescent dopants
Red dopants

TABLE 1-continued

| MATERIAL | EXAMPLES OF MATERIAL | PUBLICATIONS |
| --- | --- | --- |
| Heavy metal porphyrins (e.g., PtOEP) | | Nature 395, 151 (1998) |
| Iridium (III) organometallic complexes | | Appl. Phys. Lett. 78, 1622 (2001) |
| | | US20030072964 |
| | | US20030072964 |
| | | US20060202194 |

TABLE 1-continued

| MATERIAL | EXAMPLES OF MATERIAL | PUBLICATIONS |
|---|---|---|
| | | US20060202194 |
| | | US20070087321 |
| | | US20080261076<br>US20100090591 |
| | | US20070087321 |
| | | Adv. Mater. 19, 739 (2007) |

TABLE 1-continued

| MATERIAL | EXAMPLES OF MATERIAL | PUBLICATIONS |
|---|---|---|
| | | WO2009100991 |
| | | WO2008101842 |
| | | U.S. Pat. No. 7,232,618 |
| Platinum (II) organometallic complexes | | WO2003040257 |
| | | US20070103060 |

TABLE 1-continued

| MATERIAL | EXAMPLES OF MATERIAL | PUBLICATIONS |
| --- | --- | --- |
| Osmium (III) complexes | | Chem. Mater. 17, 3532 (2005) |
| Ruthenium (II) complexes | | Adv. Mater. 17, 1059 (2005) |
| Rhenium (I), (II), and (III) complexes | | US20050244673 |
| | Green dopants | |
| Iridium (III) organometallic complexes | and its derivatives | Inorg. Chem. 40, 1704 (2001) |
| | | US20020034656 |

TABLE 1-continued
| MATERIAL | EXAMPLES OF MATERIAL | PUBLICATIONS |
|---|---|---|
| | 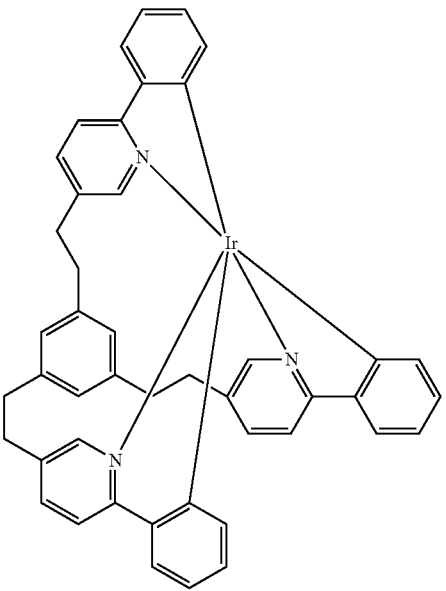 | U.S. Pat. No. 7,332,232 |
| | 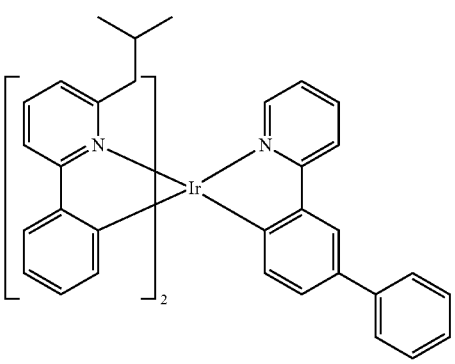 | US20090108737 |
| | 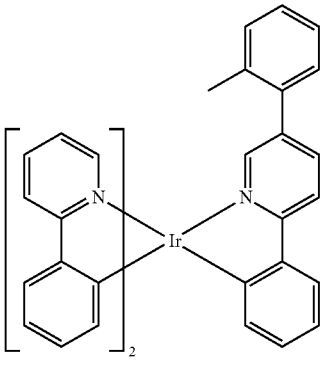 | WO2010028151 |

TABLE 1-continued
| MATERIAL | EXAMPLES OF MATERIAL | PUBLICATIONS |
|---|---|---|
|  | 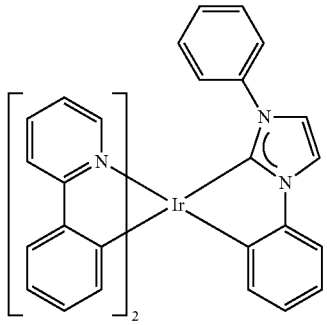 | EP1841834B |
|  | 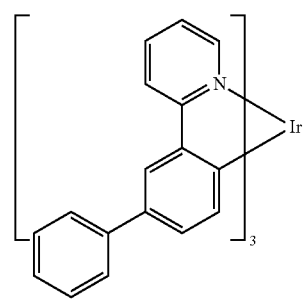 | US20060127696 |
|  | 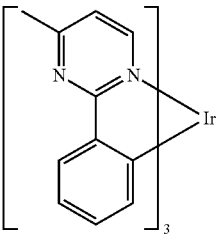 | US20090039776 |
|  | 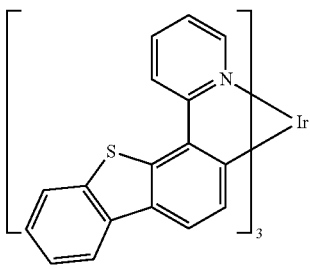 | U.S. Pat. No. 6,921,915 |
|  | 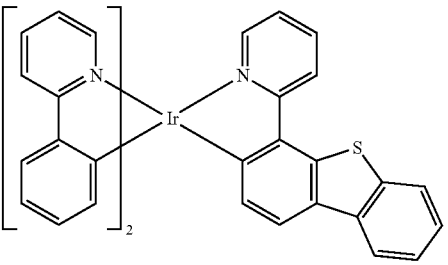 | US20100244004 |

TABLE 1-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US 20060008670 JP2007123392 |
| | | WO2010086089, WO2011044988 |
| | | Adv. Mater. 16, 2003 (2004) |

TABLE 1-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| | | US20010015432 |
| | | US20100295032 |

TABLE 1-continued

| MATERIAL | EXAMPLES OF MATERIAL | PUBLICATIONS |
|---|---|---|
| Monomer for polymeric metal organometallic compounds | | U.S. Pat. No. 7,250,226, U.S. Pat. No. 7,396,598 |
| Pt (II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |
| | | WO2002015645 |

TABLE 1-continued
| MATERIAL | EXAMPLES OF MATERIAL | PUBLICATIONS |
|---|---|---|
| | 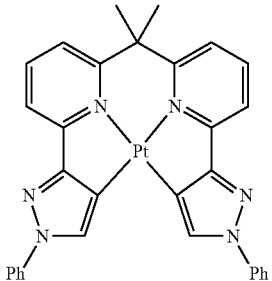 | US20060263635 |
| | 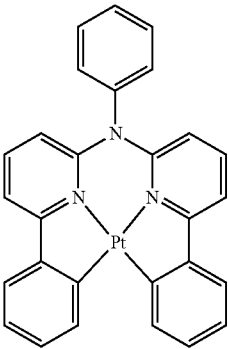 | US20060182992<br>US20070103060 |
| Cu complexes | 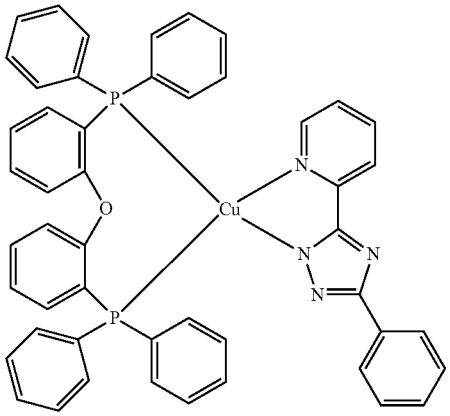 | WO2009000673 |
| | 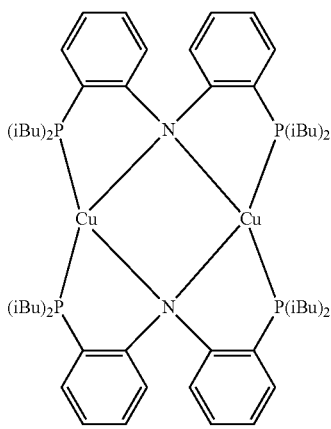 | US20070111026 |

TABLE 1-continued
| MATERIAL | EXAMPLES OF MATERIAL | PUBLICATIONS |
|---|---|---|
| Gold complexes | 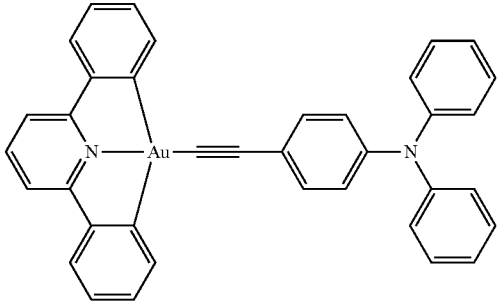 | Chem. Commun. 2906 (2005) |
| Rhenium (III) complexes | 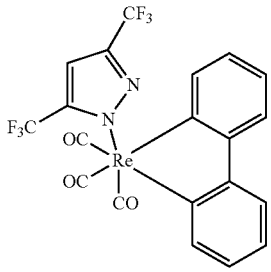 | Inorg. Chem. 42, 1248 (2003) |
| Osmium (II) complexes | 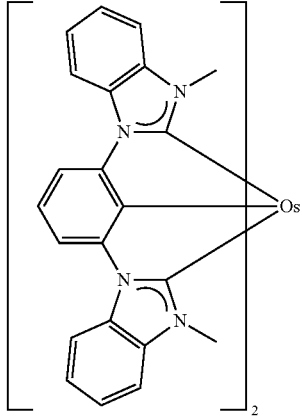 | U.S. Pat. No. 7,279,704 |
| Deuterated organometallic complexes | 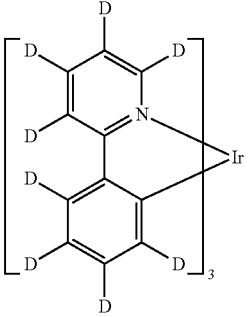 | US20030138657 |

TABLE 1-continued
| MATERIAL | EXAMPLES OF MATERIAL | PUBLICATIONS |
|---|---|---|
| Organometallic complexes with two or more metal centers | 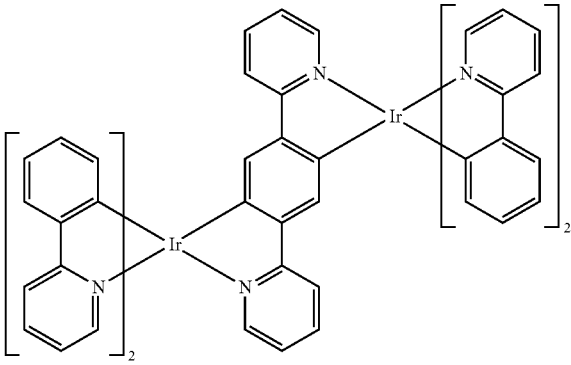 | US20030152802 |
| | 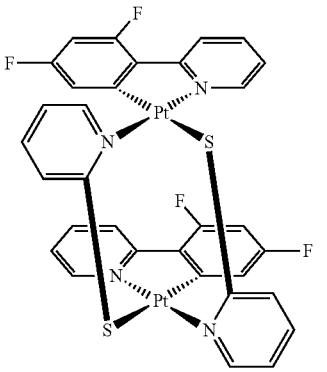 | U.S. Pat. No. 7,090,928 |
| Blue dopants | | |
| Iridium (III) organometallic complexes | 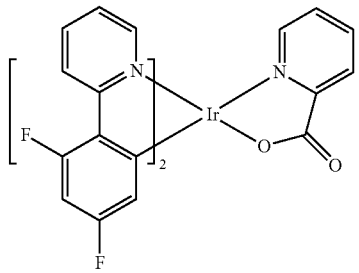 | WO2002002714 |
| | 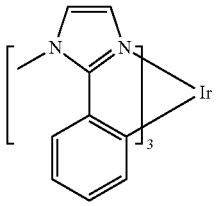 | WO2006009024 |
| | 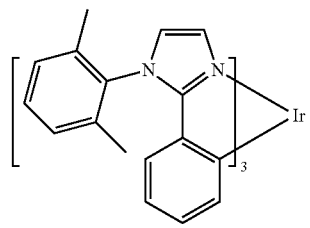 | US20060251923<br>US20110057559<br>US20110204333 |

TABLE 1-continued
| MATERIAL | EXAMPLES OF MATERIAL | PUBLICATIONS |
|---|---|---|
| | 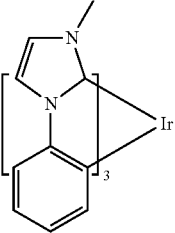 | U.S. Pat. No. 7,393,599, WO2006056418, US20050260441, WO2005019373 |
| | 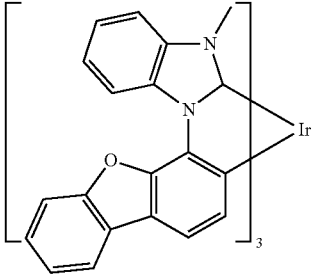 | U.S. Pat. No. 7,534,505 |
| | 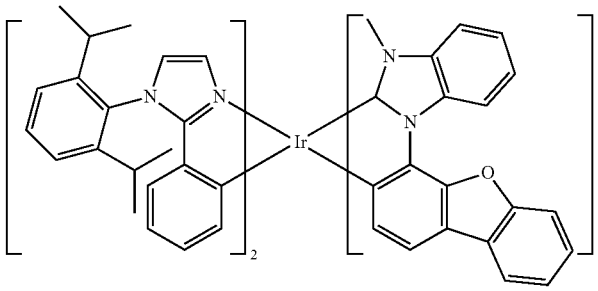 | WO2011051404 |
| | 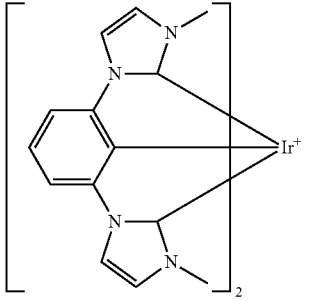 | U.S. Pat. No. 7,445,855 |
| | 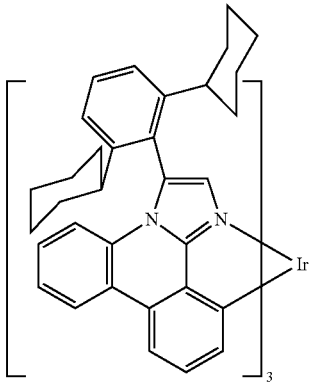 | US20070190359, US20080297033 US20100148663 |

| MATERIAL | EXAMPLES OF MATERIAL | PUBLICATIONS |
|---|---|---|
| | 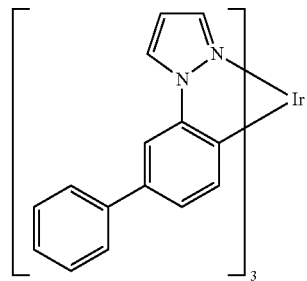 | U.S. Pat. No. 7,338,722 |
| | 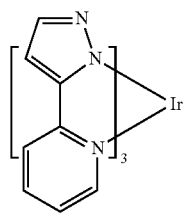 | US20020134984 |
| | 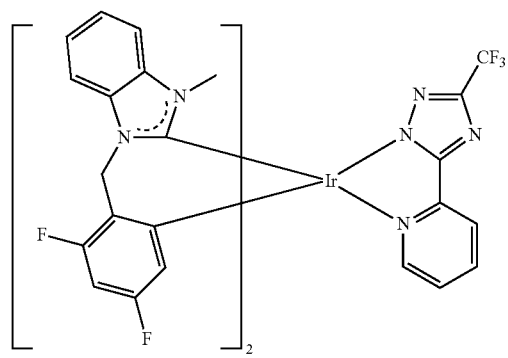 | Angew. Chem. Int. Ed. 47, 4542 (2008) |
| | 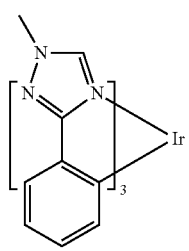 | Chem. Mater. 18, 5119 (2006) |
| | 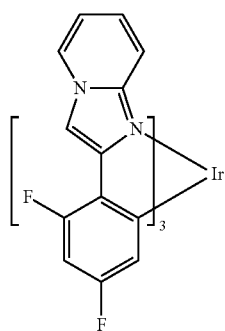 | Inorg. Chem. 46, 4308 (2007) |

TABLE 1-continued

| MATERIAL | EXAMPLES OF MATERIAL | PUBLICATIONS |
|---|---|---|
| | (Ir complex structure) | WO2005123873 |
| | (Ir complex structure) | WO2005123873 |
| | (Ir complex structure) | WO2007004380 |
| | (Ir complex structure) | WO2006082742 |
| Osmium (II) complexes | (Os complex structure) | U.S. Pat. No. 7,279,704 |

TABLE 1-continued

| MATERIAL | EXAMPLES OF MATERIAL | PUBLICATIONS |
| --- | --- | --- |
|  |  | Organometallics 23, 3745 (2004) |
| Gold complexes |  | Appl. Phys. Lett. 74, 1361 (1999) |
| Platinum (II) complexes |  | WO2006098120, WO2006103874 |
| Pt tetradentate complexes with at least one metal-carbene bond |  | U.S. Pat. No. 7,655,323 |
| Exciton/hole blocking layer materials | | |
| Bathocuprine compounds (e.g., BCP, BPhen) |  | Appl. Phys. Lett. 75, 4 (1999) |
|  |  | Appl. Phys. Lett. 79, 449 (2001) |
| Metal 8-hydroxyquinolates (e.g., BAlq) |  | Appl. Phys. Lett. 81, 162 (2002) |

TABLE 1-continued

| MATERIAL | EXAMPLES OF MATERIAL | PUBLICATIONS |
| --- | --- | --- |
| 5-member ring electron deficient heterocycles such as triazole, oxadiazole, imidazole, benzoimidazole | | Appl. Phys. Lett. 81, 162 (2002) |
| Triphenylene compounds | | US20050025993 |
| Fluorinated aromatic compounds | | Appl. Phys. Lett. 79, 156 (2001) |

TABLE 1-continued

| MATERIAL | EXAMPLES OF MATERIAL | PUBLICATIONS |
| --- | --- | --- |
| Phenothiazine-S-oxide | | WO2008132085 |
| Silylated five-membered nitrogen, oxygen, sulfur or phosphorus dibenzoheterocycles | | WO2010079051 |
| Aza-carbazoles | | US20060121308 |

Electron transporting materials

| | | |
| --- | --- | --- |
| Anthracene-benzoimidazole compounds | | WO2003060956 |
| | | US20090179554 |

TABLE 1-continued

| MATERIAL | EXAMPLES OF MATERIAL | PUBLICATIONS |
| --- | --- | --- |
| Aza triphenylene derivatives | | US20090115316 |
| Anthracene-benzothiazole compounds | | Appl. Phys. Lett. 89, 063504 (2006) |
| Metal 8-hydroxyquinolates (e.g., Alq$_3$, Zrq$_4$) | | Appl. Phys. Lett. 51, 913 (1987)<br>U.S. Pat. No. 7,230,107 |
| Metal hydroxybenzoquinolates | | Chem. Lett. 5, 905 (1993) |
| Bathocuprine compounds such as BCP, BPhen, etc | | Appl. Phys. Lett. 91, 263503 (2007) |
| | | Appl. Phys. Lett. 79, 449 (2001) |

TABLE 1-continued
| MATERIAL | EXAMPLES OF MATERIAL | PUBLICATIONS |
|---|---|---|
| 5-member ring electron deficient heterocycles (e.g., triazole, oxadiazole, imidazole, benzoimidazole) | 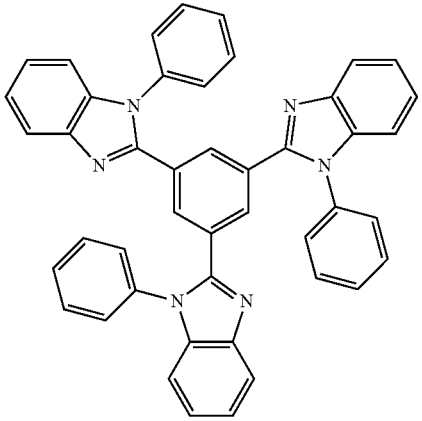 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 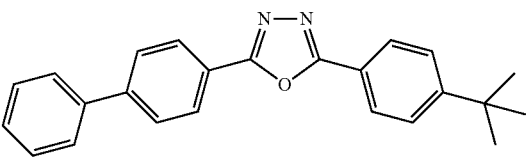 [SMILES: CC(C)(C)c1ccc(-c2nnc(-c3ccc(-c4ccccc4)cc3)o2)cc1] | Appl. Phys. Lett. 55, 1489 (1989) |
| | 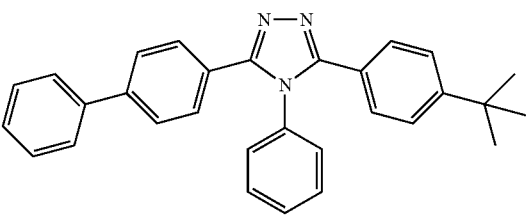 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 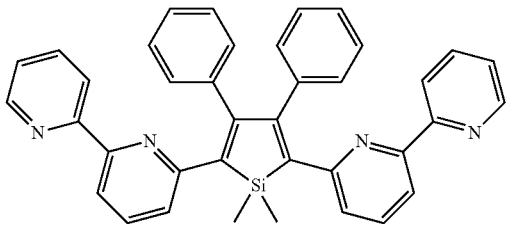 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 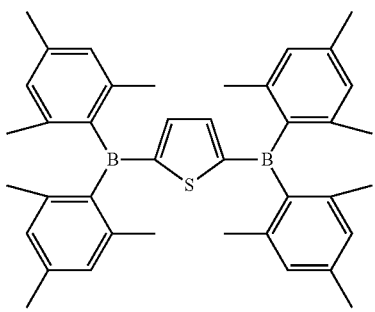 | J. Am. Chem. Soc. 120, 9714 (1998) |
| Fluorinated aromatic compounds | 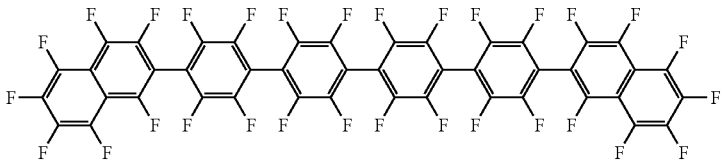 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |

TABLE 1-continued
| MATERIAL | EXAMPLES OF MATERIAL | PUBLICATIONS |
|---|---|---|
| Fullerene (e.g., C60) | 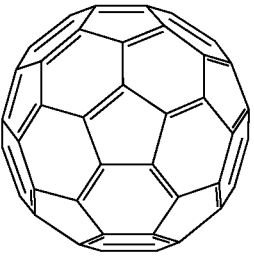 [SMILES: c1cc2c3ccc4c5ccc6c7ccc8c9ccc%10c1c1c2c2c3c4c3c5c6c4c7c8c5c9c%10c1c1c2c3c4c51] | US20090101870 |
| Triazine complexes | 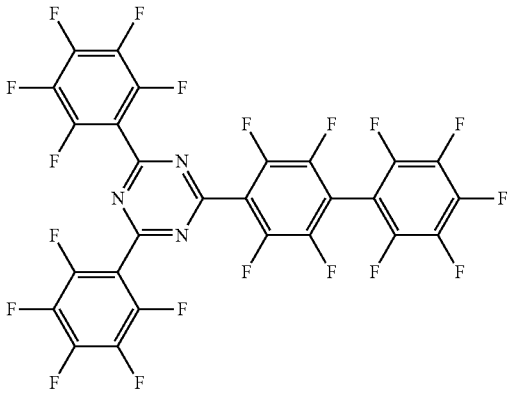 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 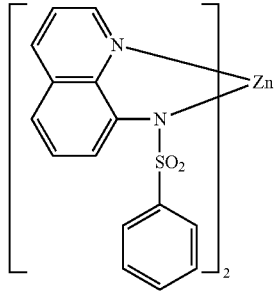 | U.S. Pat. No. 6,528,187 |

EXPERIMENTAL

Synthesis of Compound 4

Compound 4 was synthesized as follows:

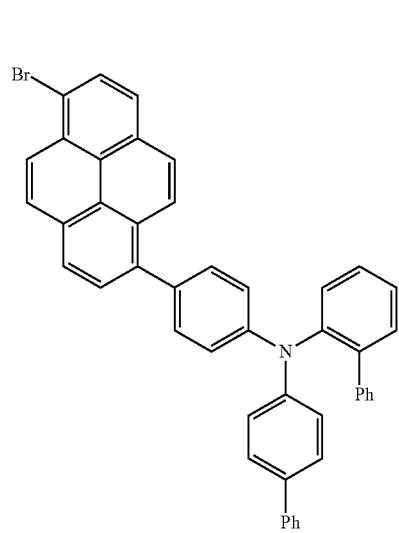

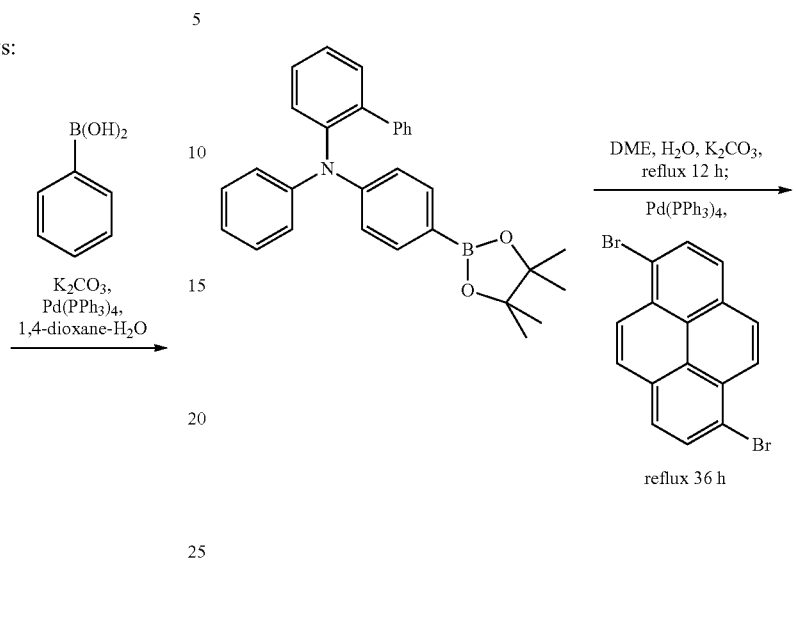

A mixture of potassium carbonate (477 mg, 3.46 mmol), phenylboronic acid (250 mg, 2.05 mmol), N-([1,1'-biphenyl]-4-yl)-N-(4-(6-bromopyren-1-yl)phenyl)-[1,1'-biphenyl]-2-amine (950 mg, 1.41 mmol), and Pd(PPh$_3$)$_4$ (82 mg, 0.07 mmol) in 1,4-dioxane-water (30 mL, 4:1) was bubbled with nitrogen for 30 min. The reaction mixture was heated to reflux for 19 h. The reaction mixture was filtered through a pad of Celite and MgSO$_4$ and washed with dichloromethane. The solvent was removed in vacuo and the residue was purified by flash column chromatography using 10% dichloromethane in hexane to give Compound 4 (0.897 g, 95% yield) as a yellow solid.

Synthesis of Compound 10

Compound 10 was synthesized as follows:

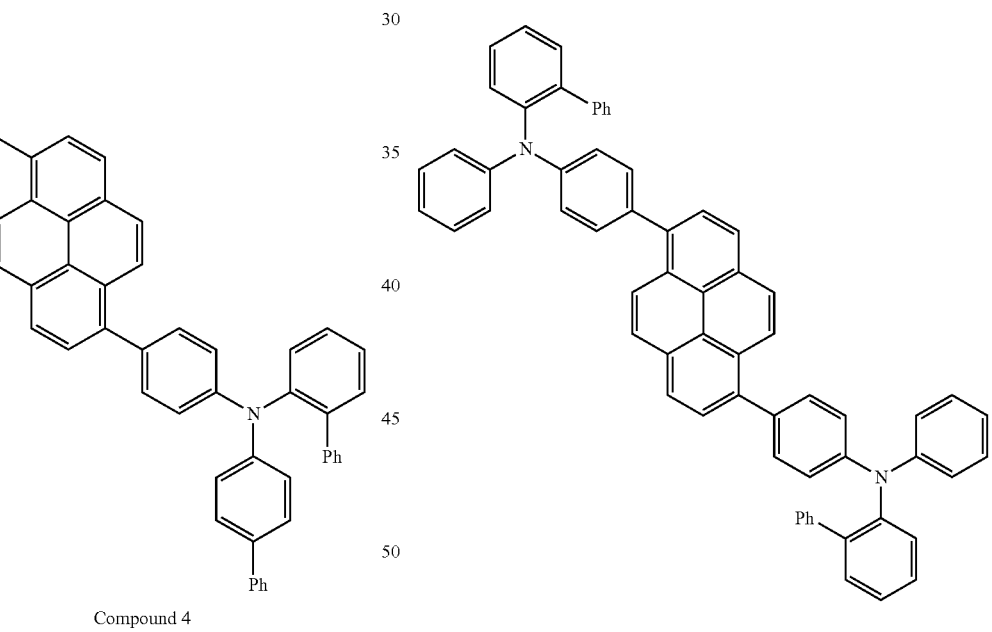

A solution of N-phenyl-N-(4-(4,4,5,5-tetramethyl-1,3,2-dioxaborolan-2-yl)phenyl)-[1,1'-biphenyl]-2-amine (4.5 g, 10.0 mmol) and K$_2$CO$_3$ (1.4 g, 10.0 mmol) in DME (30 mL) and water (30 mL) was bubbled with nitrogen for 30 min. The mixture was refluxed for 12 h. After cooling, Pd(PPh$_3$)$_4$ (0.35 g, 0.30 mmol) and 1,6-dibromopyrene (0.9 g, 2.5 mmol) were added. The mixture was bubbled with nitrogen for 15 min. The mixture was refluxed for 36 h. After cooling, the reaction mixture was diluted by hexane. The precipitate was filtered and washed by excess hexane and water. The dried precipitate was purified by flash chromatography using DCM (containing 0.5% triethylamine) to afford Compound 10 (1.7 g, 81% yield) as a yellow solid.

133
Synthesis of Compound 13

Compound 13 was synthesized as follows:

134
Synthesis of Compound 32

N-([1,1'-biphenyl]-2-yl)dibenzo[b,d]furan-4-amine was synthesized as follows

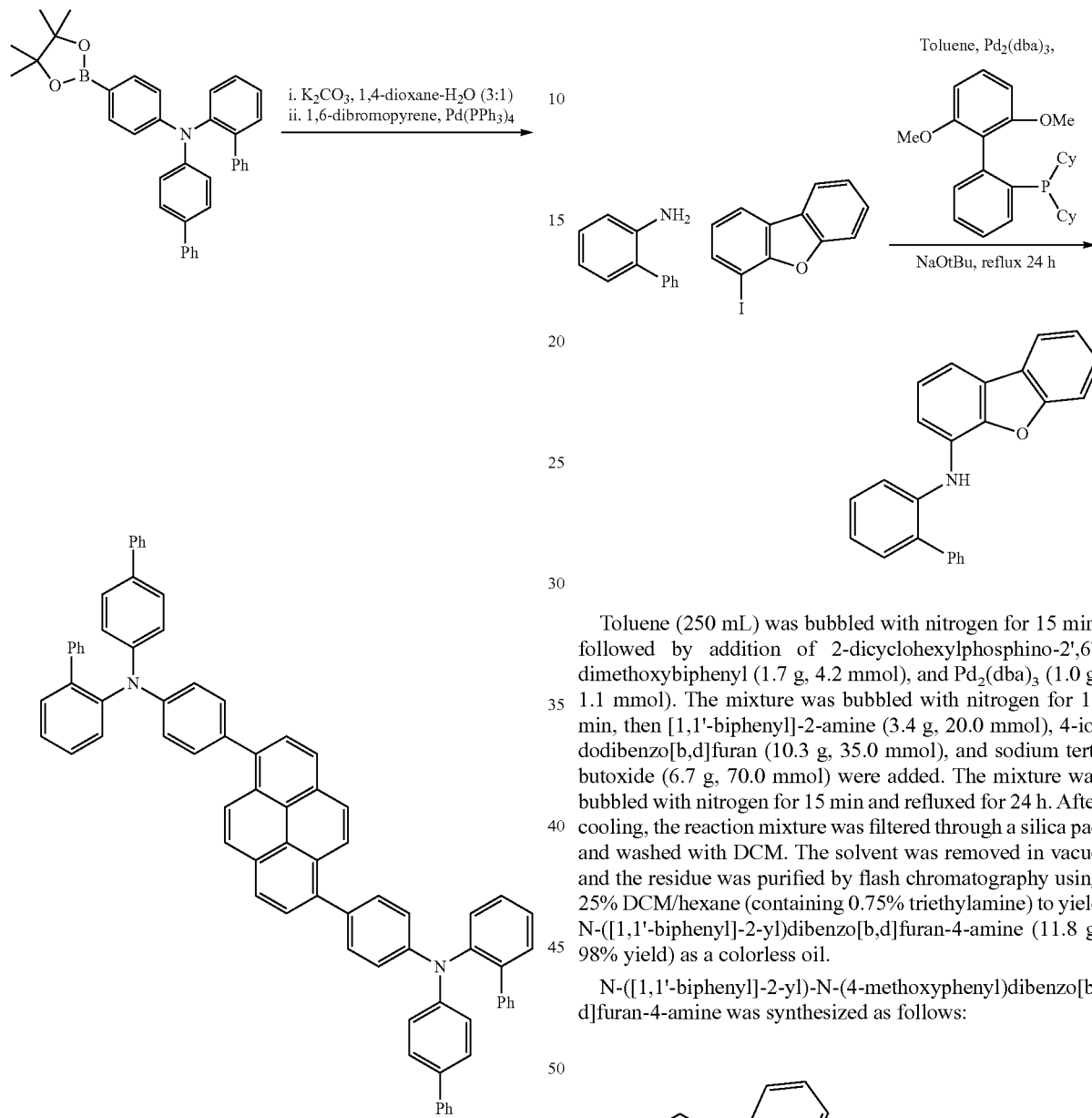

Toluene (250 mL) was bubbled with nitrogen for 15 min, followed by addition of 2-dicyclohexylphosphino-2',6'-dimethoxybiphenyl (1.7 g, 4.2 mmol), and $Pd_2(dba)_3$ (1.0 g, 1.1 mmol). The mixture was bubbled with nitrogen for 15 min, then [1,1'-biphenyl]-2-amine (3.4 g, 20.0 mmol), 4-iododibenzo[b,d]furan (10.3 g, 35.0 mmol), and sodium tert-butoxide (6.7 g, 70.0 mmol) were added. The mixture was bubbled with nitrogen for 15 min and refluxed for 24 h. After cooling, the reaction mixture was filtered through a silica pad and washed with DCM. The solvent was removed in vacuo and the residue was purified by flash chromatography using 25% DCM/hexane (containing 0.75% triethylamine) to yield N-([1,1'-biphenyl]-2-yl)dibenzo[b,d]furan-4-amine (11.8 g, 98% yield) as a colorless oil.

N-([1,1'-biphenyl]-2-yl)-N-(4-methoxyphenyl)dibenzo[b,d]furan-4-amine was synthesized as follows:

To a solution of N-([1,1'-biphenyl]-4-yl)-N-(4-(4,4,5,5-tetramethyl-1,3,2-dioxaborolan-2-yl)phenyl)-[1,1'-biphenyl]-2-amine (4.35 g, 8.31 mmol), $K_2CO_3$ (3.63 g, 26.27 mmol) in 1,4-dioxane (60 mL) and water (20 mL) was heated to reflux for 12 h. After cooling to room temperature. $Pd(PPh_3)_4$ (0.11 g, 0.09 mmol) and 1,6-dibromopyrene (0.79 g, 2.19 mmol) were added. The mixture was bubbled with nitrogen for 15 min. The resultant mixture was heated to reflux for 13 h. The precipitate was filtered and sublimed to give about 1 g of the product. The product was recrystallized twice with toluene to give about 0.7 g of the yellow solid, which was sublimed to give Compound 13 (0.53 g, 24%) as a yellow solid.

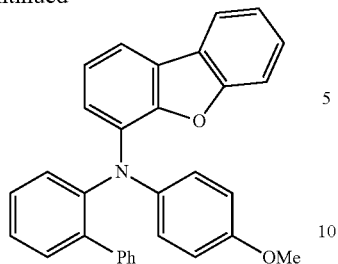

N-([1,1'-biphenyl]-2-yl)dibenzo[b,d]furan-4-amine (9.0 g, 27.0 mmol), 4-iodoanisole (23.4 g, 100.0 mmol), potassium carbonate (13.8 g, 100.0 mmol), copper powder (1.7 g, 27.0 mmol), and 18-crown-6 ether (7.1 g, 27.0 mmol) were mixed. The resultant mixture was bubbled with nitrogen for 30 min. The mixture was then refluxed for 48 h. After cooling, the solvent was removed in vacuo and the residue was purified by flash chromatography using 25% DCM/hexane (containing 0.5% triethylamine) to yield N-([1,1'-biphenyl]-2-yl)-N-(4-methoxyphenyl)dibenzo[b,d]furan-4-amine (9.9 g, 83% yield) as a colorless oil.

4-([1,1'-biphenyl]-2-yl(dibenzo[b,d]furan-4-yl)amino) phenyl trifluoromethanesulfonate was synthesized as follows:

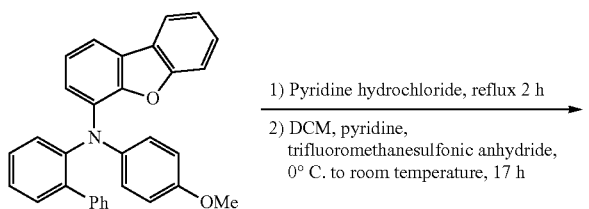

N-([1,1'-biphenyl]-2-yl)-N-(4-methoxyphenyl)dibenzo[b,d]furan-4-amine (4.2 g, 9.5 mmol) and pyridine hydrochloride (10.9 g, 95.0 mmol) were purged with nitrogen overnight. The mixture was refluxed for 2 h. After cooling, the precipitate was filtered and washed by excess water. The solid dissolved in dichloromethane (DCM) was filtered through a silica pad and washed with DCM. The solvent was removed in vacuo. The residue was dissolved in DCM (150 mL) and cooled down to 0° C. After that, pyridine (3.1 mL, 38.0 mmol) and trifluoromethanesulfonic anhydride (3.2 mL, 19.0 mmol) were added at 0° C. The mixture was stirred for 17 h from 0° C. then brought to room temperature. The reaction mixture was quenched by the addition of saturated $K_2CO_3$ solution and extracted with DCM. The extracts were dried over $MgSO_4$ and the solvent was removed in vacuo. The residue was purified by flash chromatography using 20% DCM/hexane (containing 0.25% triethylamine) to yield 4-([1,1'-biphenyl]-2-yl(dibenzo[b,d]furan-4-yl)amino)phenyl trifluoromethanesulfonate (4.9 g, 92% yield over 2 steps) as a white solid.

Synthesis of Compound 32

Compound 32 was synthesized as follows:

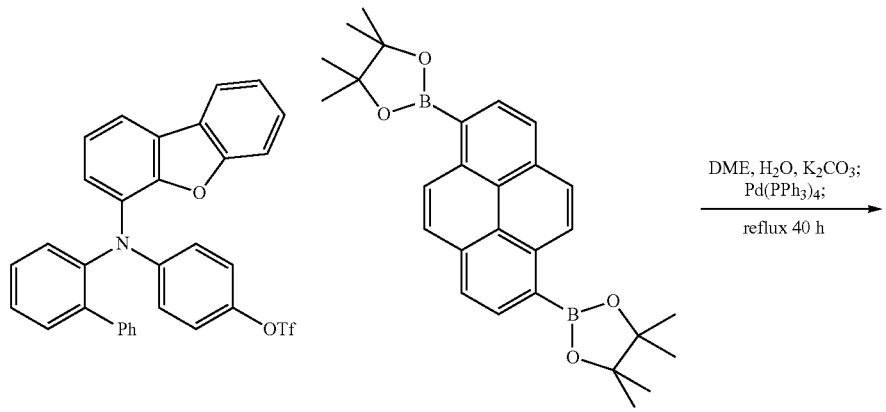

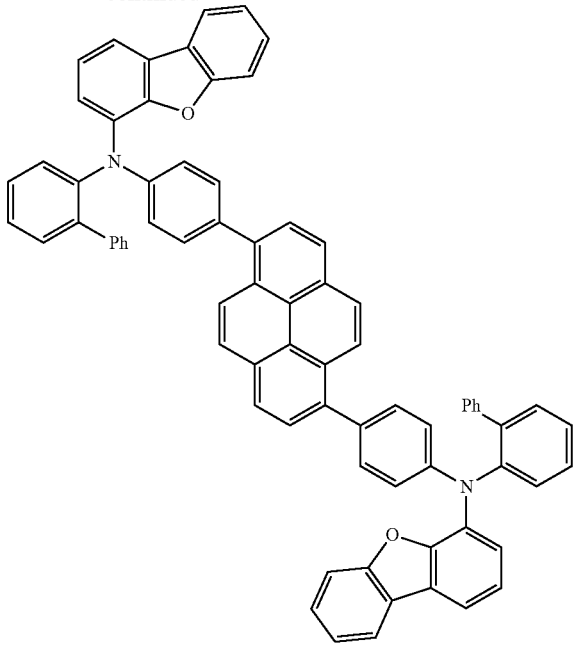

Compound 32

To a solution of 4-([1,1'-biphenyl]-2-yl(dibenzo[b,d]furan-4-yl)amino)phenyl trifluoromethanesulfonate (3.9 g, 3.5 mmol), 1,6-bis(4,4,5,5-tetramethyl-1,3,2-dioxaborolan-2-yl)pyrene (0.9 g, 2.0 mmol), K$_2$CO$_3$ (1.1 g, 8.0 mmol) in DME (12 mL) and water (24 mL) was bubbled with nitrogen for 30 min. Pd(PPh$_3$)$_4$ (0.1 g, 0.1 mmol) was added. The mixture was bubbled with nitrogen for 15 min. The resultant mixture was refluxed for 40 h. After cooling, the reaction mixture was diluted by hexane. The precipitate was filtered and washed by excess hexane and water. The dried precipitate was purified by flash chromatography using 50% DCM/hexane (containing 0.25% triethylamine) to afford Compound 32 (1.9 g, 93% yield) as a yellow solid.

Synthesis of Compound 43

Compound 43 was synthesized as follows:

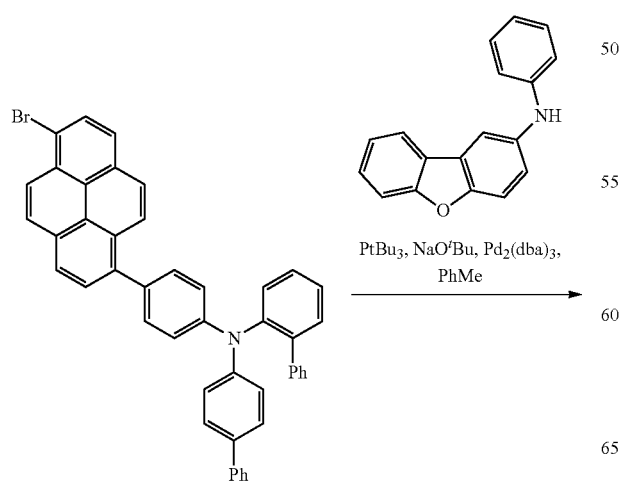

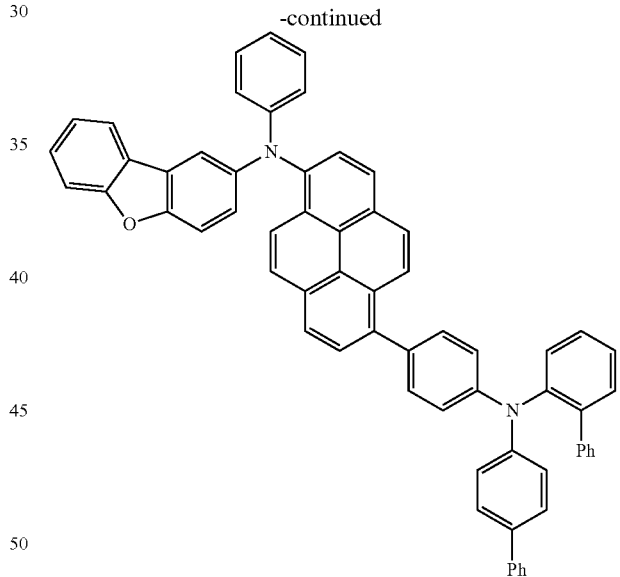

To a mixture of N-phenyldibenzo[b,d]furan-2-amine (133 mg, 0.51 mmol), N-([1,1'-biphenyl]-4-yl)-N-(4-(6-bromopyren-1-yl)phenyl)-[1,1'-biphenyl]-2-amine (225 mg, 0.33 mmol), sodium tert-butoxide (173 mg, 1.80 mmol), tri-tert-butylphosphine (10 wt % in hexane) (0.03 mL, 0.12 mmol) in toluene (60 mL) was bubbled with nitrogen for 30 min before Pd$_2$(dba)$_3$ (11 mg, 0.01 mmol) was added. The mixture was bubbled with nitrogen for 15 min. The resultant mixture was heated to reflux for 3 h. The reaction mixture was filtered through Celite pad and washed with toluene (containing 0.5% triethylamine). The solvent was removed in vacuo and the residue was purified by flash column chromatography using 10% dichloromethane in hexane (containing 0.5% triethylamine) to give Compound 43 (265 mg, 93% yield) as a yellow solid.

Synthesis of Compound 29

Compound 29 was synthesized as follows:

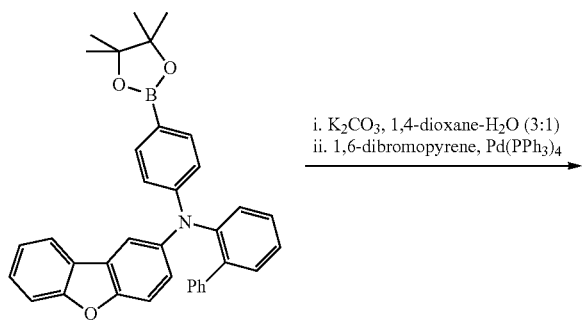

A solution of N-([1,1'-biphenyl]-2-yl)-N-(4-(4,4,5,5-tetramethyl-1,3,2-dioxaborolan-2-yl)phenyl)dibenzo[b,d]furan-2-amine (4.21 g. 7.83 mmol), $K_2CO_3$ (3.60 g. 26.09 mmol) in 1,4-dioxane (60 mL) and water (20 mL) was refluxed for 12 h. After cooling to room temperature, $Pd(PPh_3)_4$ (0.12 g, 0.10 mmol) and 1,6-dibromopyrene (0.77 g, 2.14 mmol) were added. The mixture was bubbled with nitrogen for 15 min and heated to reflux for 12 h. The solid was filtered and recrystallized with toluene to give Compound 29 (0.37 g, 54%) as a yellow solid.

Synthesis of Compound 53

Compound 53 was synthesized as follows:

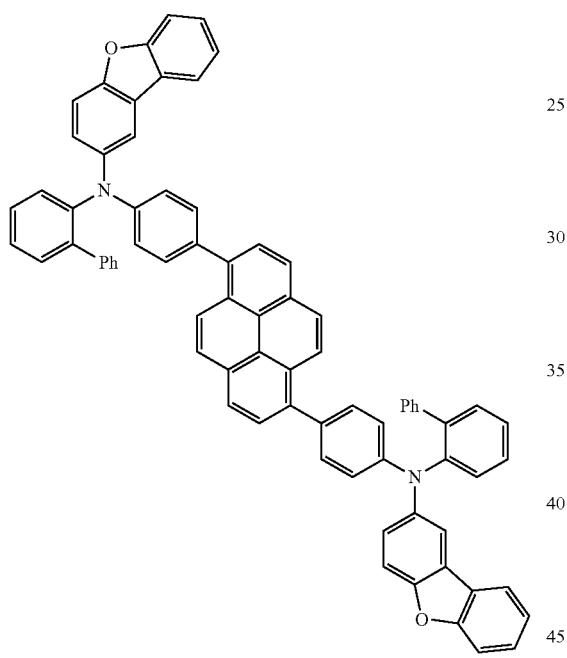

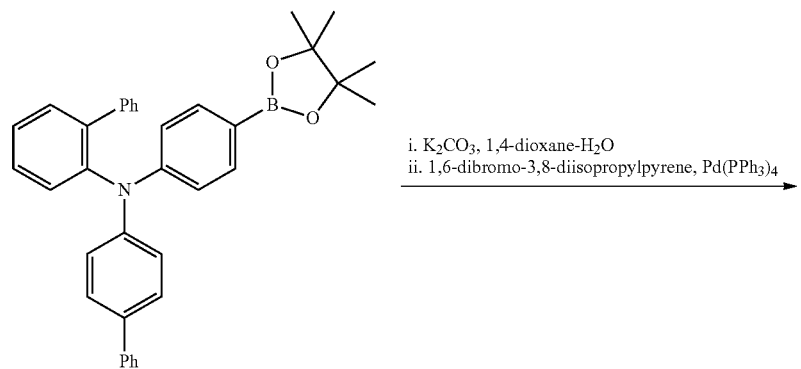

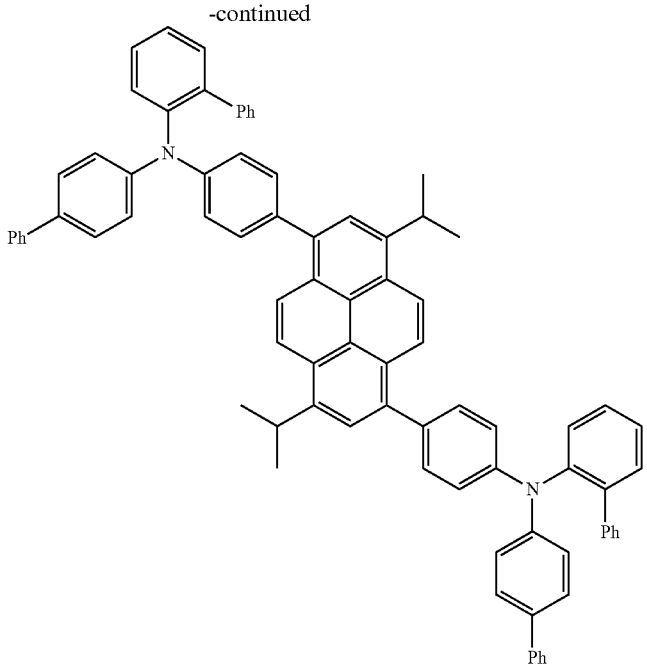

Compound 53

To a mixture of potassium carbonate (1.88 g, 13.62 mmol) and N-([1,1'-biphenyl]-4-yl)-N-(4-(4,4,5,5-tetramethyl-1,3,2-dioxaborolan-2-yl)phenyl)-[1,1'-biphenyl]-2-amine (2.26 g, 4.33 mmol) in 1,4-dioxane-water (44 mL, 3:1) was heated to 190° C. for 22 h. The reaction mixture was cooled and 1,6-dibromo-3,8-diisopropylpyrene (0.505 g, 1.14 mmol) and Pd(PPh$_3$)$_4$ (0.067 g, 0.06 mmol) were added. The reaction mixture was bubbled with nitrogen for 15 min then heated to reflux for 24 h. The solid formed was filtered and heated to dissolve in 1,2-dichlorobenzene. The reaction mixture was filtered through silica, then concentrated to give yellow solid (1.0 g). The solid was recrystallized with heptane/toluene to yield Compound 53 (0.85 g, 70% yield) as yellow solid.

Synthesis of Compound 64

1,6-Diisobutylpyrene was synthesized as follows:

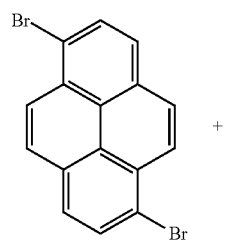

+

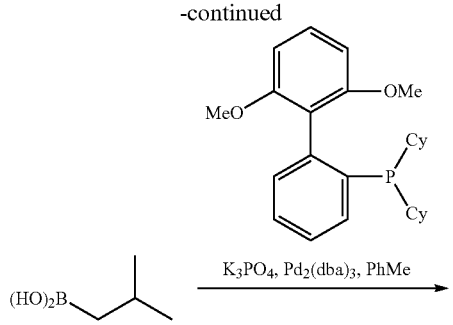

-continued

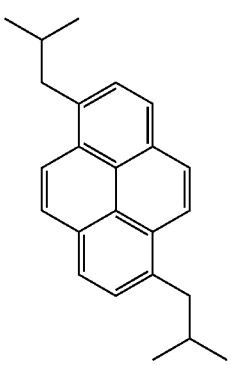

A mixture of 1,6-dibromopyrene (15.13 g, 42.0 mmol), isobutyl boronic acid (27.58 g, 270 mmol), potassium phosphate tribasic monohydrate (53.94 g, 254 mmol), Pd$_2$(dba)$_3$ (3.02 g, 3.30 mmol), and 2-dicyclohexylphosphino-2',6'-dimethoxybiphenyl (1.00 g, 2.45 mmol) in toluene (300 mL)

was fully degassing by bubbling through with nitrogen. The reaction mixture was maintained at reflux under nitrogen for 16 h. The reaction mixture was cooled, then filtered through a pad of Celite and washed with toluene. The solvent was removed in vacuo and the residue was purified by flash chromatography using hexane to yield 1,6-diisobutylpyrene (10.18 g, 77% yield) as a white solid.

1,6-Dibromo-3,8-diisobutylpyrene was synthesized as follows:

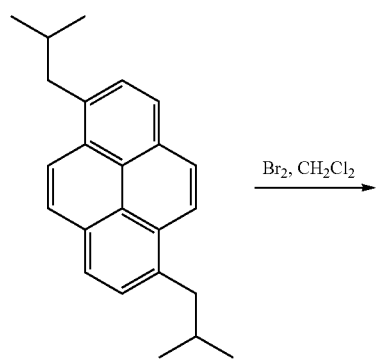

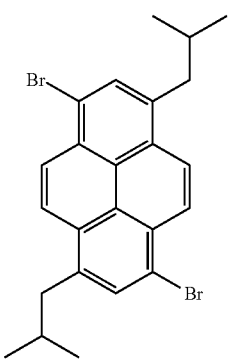

To 1,6-diisobutylpyrene (0.759 g, 2.42 mmol) in dichloromethane (15 mL) at 0° C. was added bromine (0.3 mL, 5.86 mmol) in dichloromethane (3 mL) dropwise. The reaction mixture was kept at 0° C. for 30 mins and warmed to room temperature over 12 h. Reaction was quenched with MeOH (5 mL). The solid was filtered and washed with MeOH to give 1,6-dibromo-3,8-diisobutylpyrene (1.051 g, 93%) as a white powder.

Synthesis of Compound 64

Compound 64 was synthesized as follows:

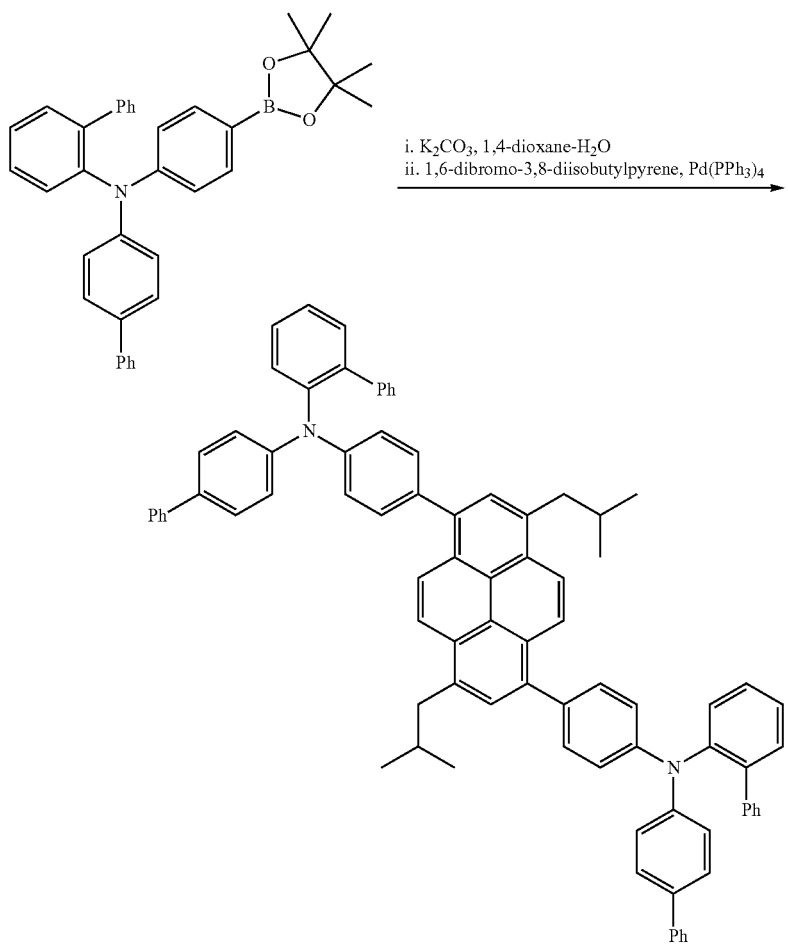

Compound 64

A mixture of potassium carbonate (1.63 g, 11.79 mmol) and N-([1,1'-biphenyl]-4-yl)-N-(4-(4,4,5,5-tetramethyl-1,3,2-dioxaborolan-2-yl)phenyl)-[1,1'-biphenyl]-2-amine (1.53 g, 2.92 mmol) in 1,4-dioxane-water (23 mL-7 mL) was heated to 190° C. for 24 h. Reaction mixture was cooled and both 1,6-dibromo-3,8-diisobutylpyrene (0.367 g, 0.78 mmol) and Pd(PPh$_3$)$_4$ (0.055 g, 0.05 mmol) were added to the mixture. The reaction mixture was bubbled through nitrogen for 15 min then heated to reflux for 24 h. The solid formed was filtered and heated to dissolve in 1,2-dichlorobenzene. The reaction mixture was filtered through silica, then concentrated to give yellow solid (0.9 g). The solid was recrystallized with heptane/toluene to yield Compound 64 (0.75 g, 87% yield) as a yellow solid.

Synthesis of Compound 65

N-([1,1'-biphenyl]-2-yl)-N-(4-methoxyphenyl)-[1,1'-biphenyl]-2-amine was synthesized as follows:

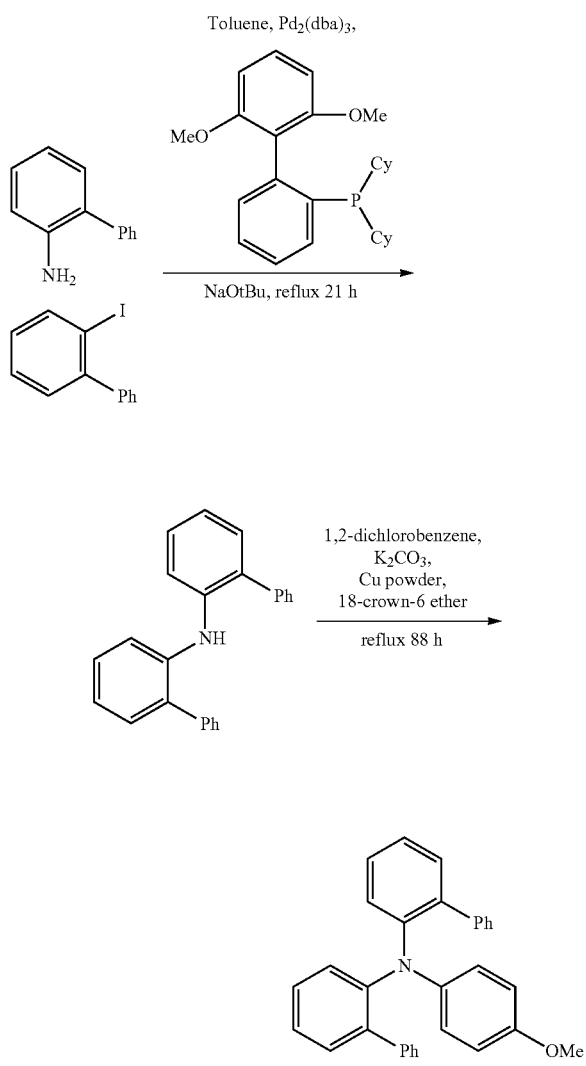

Toluene (100 mL) was bubbled with nitrogen for 15 min, followed by the addition of 2-dicyclohexylphosphino-2',6'-dimethoxybiphenyl (1.0 g, 2.4 mmol) and Pd$_2$(dba)$_3$ (0.5 g, 0.6 mmol). The mixture was bubbled with nitrogen for 15 min, then [1,1'-biphenyl]-2-amine (3.4 g, 20.0 mmol), 2-iodobiphenyl (3.5 mL, 20.0 mmol), and sodium tert-butoxide (3.8 g, 40.0 mmol) were added. The mixture was bubbled with nitrogen for 15 min and refluxed for 21 h. After cooling, the reaction mixture was filtered through a silica pad and washed with 50% DCM/hexane. The solvent was removed in vacuo. The residue was dissolved in 1,2-dichlorobenzene (80 mL). After that, 4-iodoanisole (18.7 g, 80.0 mmol), potassium carbonate (5.5 g, 40.0 mmol), copper powder (1.3 g, 20.0 mmol), and 18-crown-6 ether (5.3 g, 20.0 mmol) were added. The resultant mixture was bubbled with nitrogen for 30 min. The mixture was refluxed for 88 h. After cooling, the solvent was removed in vacuo and the residue was purified by flash chromatography using 25% DCM/hexane to yield N-([1,1'-biphenyl]-2-yl)-N-(4-methoxyphenyl)-[1,1'-biphenyl]-2-amine (7.4 g, 87% yield) as a colorless oil.

4-(di([1,1'-biphenyl]-2-yl)amino)phenyl trifluoromethanesulfonate was synthesized as follows;

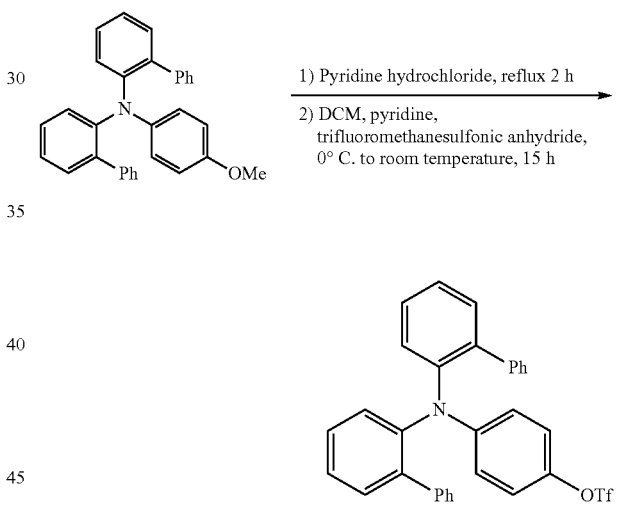

N-([1,1'-biphenyl]-2-yl)-N-(4-methoxyphenyl)-[1,1'-biphenyl]-2-amine (7.4 g, 17.3 mmol) and pyridine hydrochloride (23.0 g, 200.0 mmol) were purged with nitrogen overnight. The mixture was then refluxed for 2 h. After cooling, the precipitate was filtered and washed with excess water. The solid dissolved in DCM was filtered through a silica pad and washed with DCM. The solvent was removed in vacuo. The residue was dissolved in DCM (60 mL) and cooled down to 0° C. After that, pyridine (6.5 mL, 80.0 mmol) and trifluoromethanesulfonic anhydride (6.7 mL, 40.0 mmol) were added at 0° C. The mixture was stirred for 15 h as the temperature increased from 0° C. to room temperature. The reaction mixture was quenched by the addition of saturated K$_2$CO$_3$ solution and extracted with DCM. The extracts were dried over MgSO$_4$ and the solvent was removed in vacuo. The residue was purified by flash chromatography using 20% DCM/hexane to yield 4-(di([1,1'-biphenyl]-2-yl)amino)phenyl trifluoromethanesulfonate (7.2 g, 76% yield over 2 steps) as a white solid.

Synthesis of Compound 65

Compound 65 was synthesized as follows:

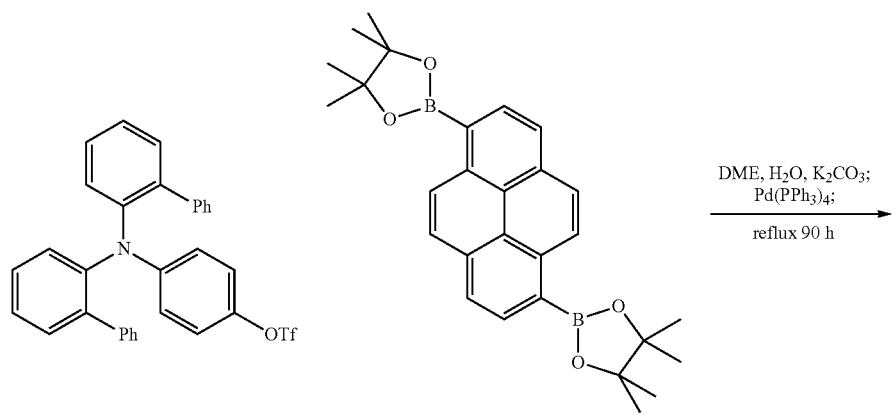

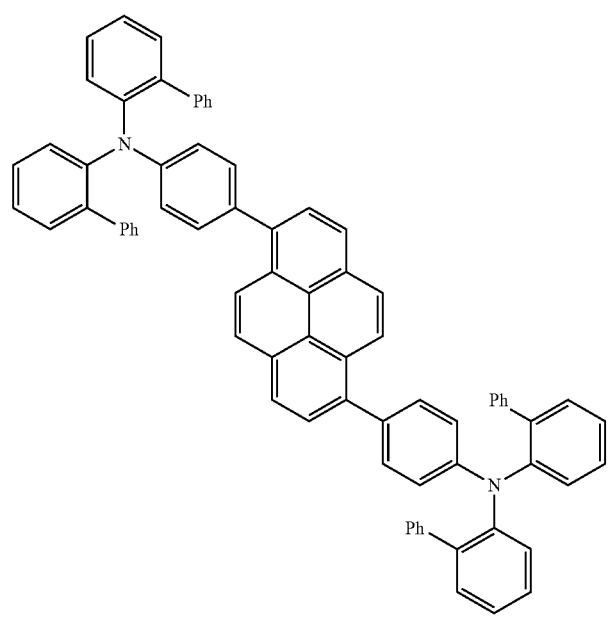

Compound 65

A solution of 4-(di([1,1'-biphenyl]-2-yl)amino)phenyl trifluoromethanesulfonate (3.3 g, 6.0 mmol), 1,6-bis(4,4,5,5-tetramethyl-1,3,2-dioxaborolan-2-yl)pyrene (0.9 g, 2.0 mmol), and K$_2$CO$_3$ (1.1 g, 8.0 mmol) in DME (20 mL) and water (20 mL) was bubbled with nitrogen for 30 min. Pd(PPh$_3$)$_4$ (0.1 g, 0.1 mmol) was then added to the mixture. The mixture was bubbled with nitrogen for 15 min. The resultant mixture was refluxed for 90 h. After cooling, all solvent was removed in vacuo. The solid dissolved in DCM was filtered through a silica pad and MgSO$_4$, then washed with DCM. The solvent was removed in vacuo. The residue was purified by re-crystallization in 1,2-dichloroethane to yield Compound 65 (1.7 g, 86% yield) as a yellow solid.

Synthesis of Compound 66

4-cyclohexyldibenzo[b,d]furan was synthesized as follows:

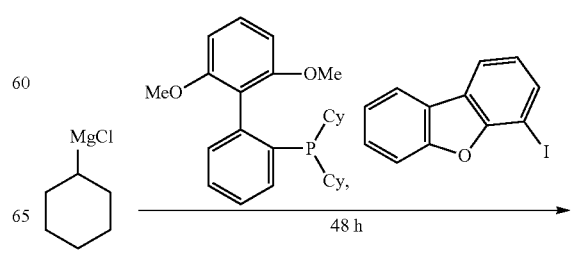

-continued

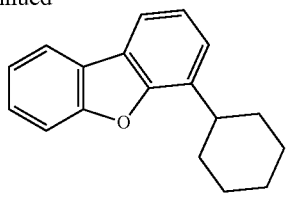

ZnCl$_2$ (13.6 g, 100.0 mmol) and THF (600 mL) were cooled to 0° C. After that, cyclohexylmagnesium chloride (70.0 mL, 70.0 mmol, 1M in THF) was added at 0° C. The mixture was stirred for 15 min from 0° C. to room temperature. The mixture was bubbled with nitrogen for 15 min, followed by the addition of 4-iododibenzo[b,d]furan (11.8 g, 40.0 mmol), 2-dicyclohexylphosphino-2',6'-dimethoxybiphenyl (3.3 g, 8.0 mmol), and Pd$_2$(dba)$_3$ (1.8 g, 2.0 mmol). The resultant mixture was bubbled with nitrogen for 15 min and stirred for 48 h. The reaction mixture was quenched by the addition of saturated K$_2$CO$_3$ solution and extracted with DCM. The extracts were dried over MgSO$_4$ and the solvent was removed in vacuo. The residue was purified by flash chromatography using 10% DCM/hexane to yield 4-cyclohexyldibenzo[b,d]furan (9.0 g, 90% yield) as a colorless oil.

4-cyclohexyl-6-iododibenzo[b,d]furan was synthesized as follows:

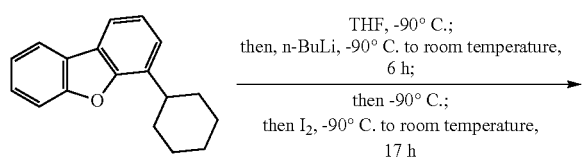

-continued

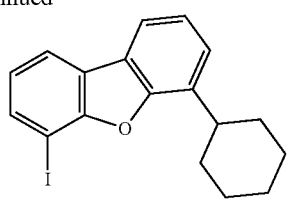

4-Cyclohexyldibenzo[b,d]furan (11.3 g, 45.0 mmol) and THF (1000 mL) were cooled down to −90° C. After that, n-BuLi (56.2 mL, 90.0 mmol, 1.6 M in THF) was added at −90° C. The mixture was stirred for 6 h and allowed to warm from −90° C. to room temperature. The mixture was then cooled to −90° C., and iodine (22.9 g, 90.0 mmol) was added at −90° C. The resultant mixture was stirred for 17 h and allowed to warm from −90° C. to room temperature. The reaction mixture was then quenched by the addition of saturated Na$_2$S$_2$O$_3$ solution and extracted with DCM. The extracts were dried over MgSO$_4$ and the solvent was removed in vacuo. The residue was purified by flash chromatography using 5% DCM/hexane to yield 4-cyclohexyl-6-iododibenzo[b,d]furan (9.8 g, 58% yield) as a white solid.

N-([1,1'-biphenyl]-2-yl)-6-cyclohexyldibenzo[b,d]furan-4-amine was synthesized as follows:

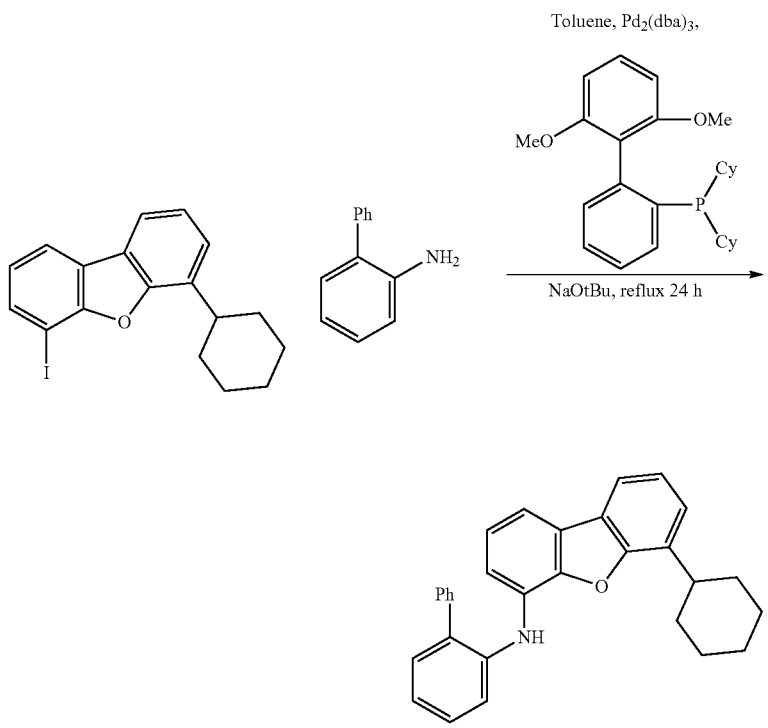

Toluene (250 mL) was bubbled with nitrogen for 15 min, followed by addition of 2-dicyclohexylphosphino-2',6'-dimethoxybiphenyl (1.0 g, 2.4 mmol) and Pd$_2$(dba)$_3$ (0.5 g, 0.6 mmol). The mixture was bubbled with nitrogen for 15 min, then [1,1'-biphenyl]-2-amine (3.4 g, 20.0 mmol), 4-cyclohexyl-6-iododibenzo[b,d]furan (7.5 g, 20.0 mmol), and sodium tert-butoxide (3.8 g, 40.0 mmol) were added. The mixture was bubbled with nitrogen for 15 min and refluxed for 24 h. After cooling, the reaction mixture was filtered through a silica pad and washed with 50% DCM/hexane. After cooling, the solvent was removed in vacuo and the residue was purified by flash chromatography using 15% DCM/hexane to yield N-([1,1'-biphenyl]-2-yl)-6-cyclohexyldibenzo[b,d]furan-4-amine (8.3 g, 100% yield) as a colorless oil.

N-([1,1'-biphenyl]-2-yl)-6-cyclohexyl-N-(4-methoxyphenyl)dibenzo[b,d]furan-4-amine was synthesized as follows:

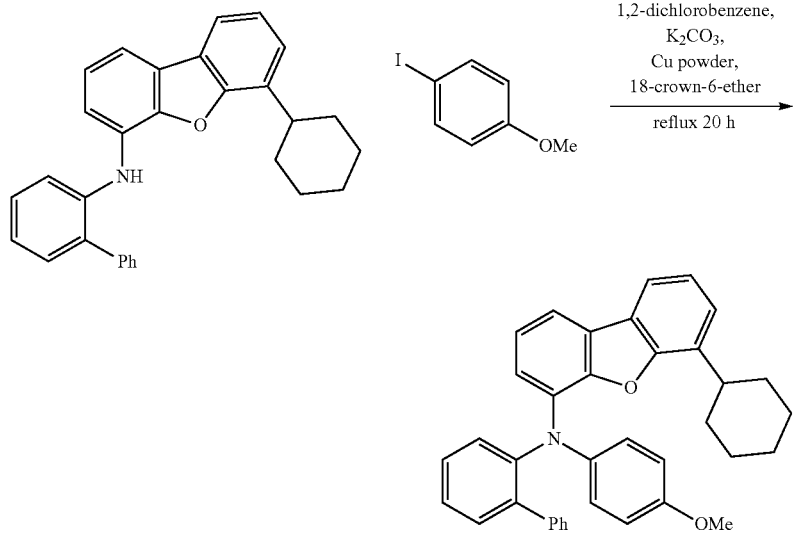

N-([1,1'-biphenyl]-2-yl)-6-cyclohexyldibenzo[b,d]furan-4-amine (8.3 g. 20.0 mmol), 4-iodoanisole (18.7 g, 80.0 mmol), potassium carbonate (5.5 g, 40.0 mmol), copper powder (1.3 g, 20.0 mmol), and 18-crown-6 ether (5.3 g, 20.0 mmol) were mixed. The resultant mixture was bubbled with nitrogen for 30 min. The mixture was refluxed for 20 h. After cooling, the solvent was removed in vacuo and the residue was purified by flash chromatography using 15% DCM/hexane (containing 1% triethylamine) to yield N-([1,1'-biphenyl]-2-yl)-6-cyclohexyl-N-(4-methoxyphenyl)dibenzo[b,d]furan-4-amine (9.0 g, 86% yield) as a white solid.

4-([1,1'-biphenyl]-2-yl(6-cyclohexyldibenzo[b,d]furan-4-yl)amino)phenol was synthesized as follows:

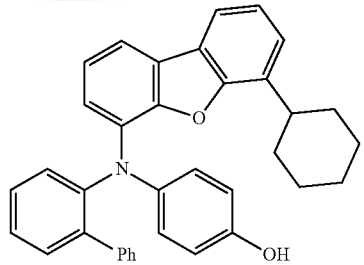

A mixture of N-([1,1'-biphenyl]-2-yl)-6-cyclohexyl-N-(4-methoxyphenyl)dibenzo[b,d]furan-4-amine (8.9 g, 17.0 mmol) and pyridine hydrochloride (19.6 g, 170.0 mmol) was purged with nitrogen overnight. The mixture was then refluxed for 2 h. After cooling, the precipitate was filtered and washed by excess water. The residue was purified by flash chromatography using 90% DCM/hexane (containing 1% triethylamine) to yield 4-([1,1'-biphenyl]-2-yl(6-cyclohexyldibenzo[b,d]furan-4-yl)amino)phenol (6.5 g, 75% yield) as a white solid.

4-([1,1'-biphenyl]-2-yl(6-cyclohexyldibenzo[b,d]furan-4-yl)amino)phenyl trifluoromethanesulfonate was synthesized as follows:

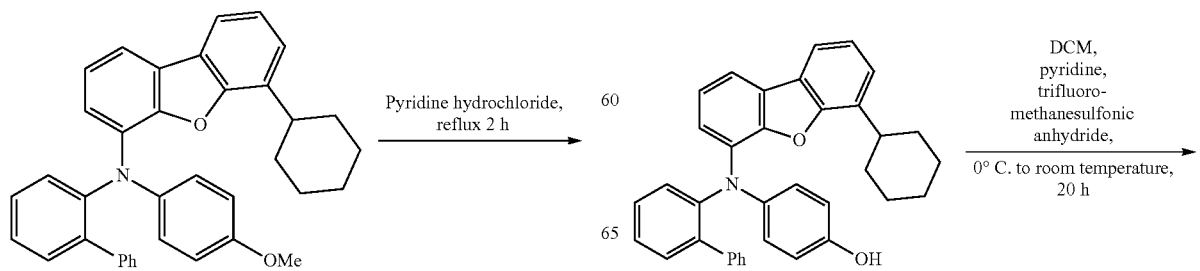

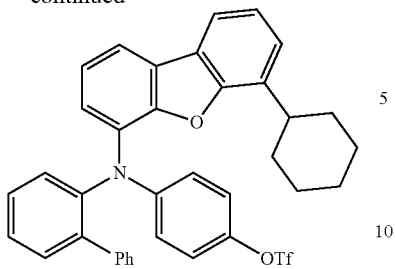

4-([1,1'-biphenyl]-2-yl(6-cyclohexyldibenzo[b,d]furan-4-yl)amino)phenol (8.1 g, 16.0 mmol) was dissolved in DCM (100 mL) and the mixture was cooled down to 0° C. After that, pyridine (4.2 mL, 52.0 mmol) and trifluoromethanesulfonic anhydride (4.4 mL, 26.0 mmol) were added at 0° C. The mixture was stirred for 20 h and allowed to warm from 0° C. to room temperature. The reaction mixture was quenched by the addition of saturated $K_2CO_3$ solution and extracted by DCM. The extracts were dried over $MgSO_4$ and the solvent was removed in vacuo. The residue was purified by flash chromatography using 5% DCM/hexane (containing 0.25% triethylamine) to yield 4-([1,1'-biphenyl]-2-yl(6-cyclohexyldibenzo[b,d]furan-4-yl)amino)phenyl trifluoromethanesulfonate (8.6 g, 84% yield) as a white solid.

1-([1,1'-biphenyl]-3-yl)-6-bromopyrene was synthesized as follows:

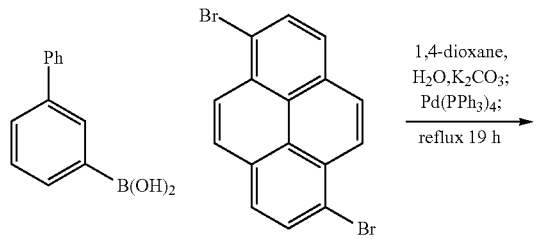

To a solution of 1,6-dibromopyrene (5.4 g, 15.0 mmol), [1,1'-biphenyl]-3-ylboronic acid (3.3 g, 16.5 mmol), and $K_2CO_3$ (10.4 g, 75.0 mmol) in 1,4-dioxane (320 mL) and water (50 mL) was bubbled with nitrogen for 15 min. $Pd(PPh_3)_4$ (0.87 g, 0.75 mmol) was then added to the mixture. The mixture was bubbled with nitrogen for 15 min. The resultant mixture was refluxed for 19 h. The reaction mixture was then extracted by DCM. The extracts were dried over $MgSO_4$ and the solvent was removed in vacuo. The residue was purified by flash chromatography using 15% DCM/hexane (containing 0.25% triethylamine) to yield 1-([1,1'-biphenyl]-3-yl)-6-bromopyrene (4.5 g, 70% yield) as a white solid.

2-(6-([1,1'-biphenyl]-3-yl)pyren-1-yl)-4,4,5,5-tetramethyl-1,3,2-dioxaborolane was synthesized as follows:

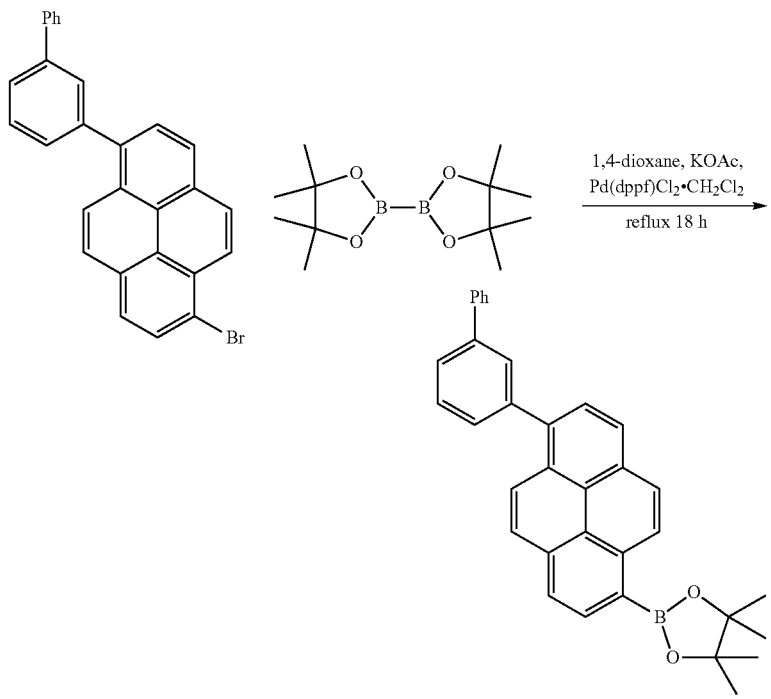

Bis(pinacolato)diboron (5.1 g, 20.0 mmol) and KOAc (2.0 g, 20.0 mmol) were added to a solution of 1-([1,1'-biphenyl]-3-yl)-6-bromopyrene (4.5 g, 10.0 mmol) in 1,4-dioxane (125 mL), and the solution was bubbled with nitrogen for 15 min. Pd(dppf)Cl$_2$.CH$_2$Cl$_2$ (0.4 g, 0.5 mmol) was then added to the solution, and the reaction mixture was bubbled with nitrogen for 15 min. The resultant mixture was refluxed for 18 h. After cooling, the reaction mixture was filtered through a silica pad and washed with DCM (containing 0.5% triethylamine). The solvent was removed in vacuo and the residue was purified by flash chromatography using 20-60% DCM/hexane (containing 0.5% triethylamine) to yield 2-(6-([1,1'-biphenyl]-3-yl)pyren-1-yl)-4,4,5,5-tetramethyl-1,3,2-dioxaborolane (3.5 g, 73% yield) as a yellow solid.

Synthesis of Compound 66

Compound 66 was synthesized as follows:

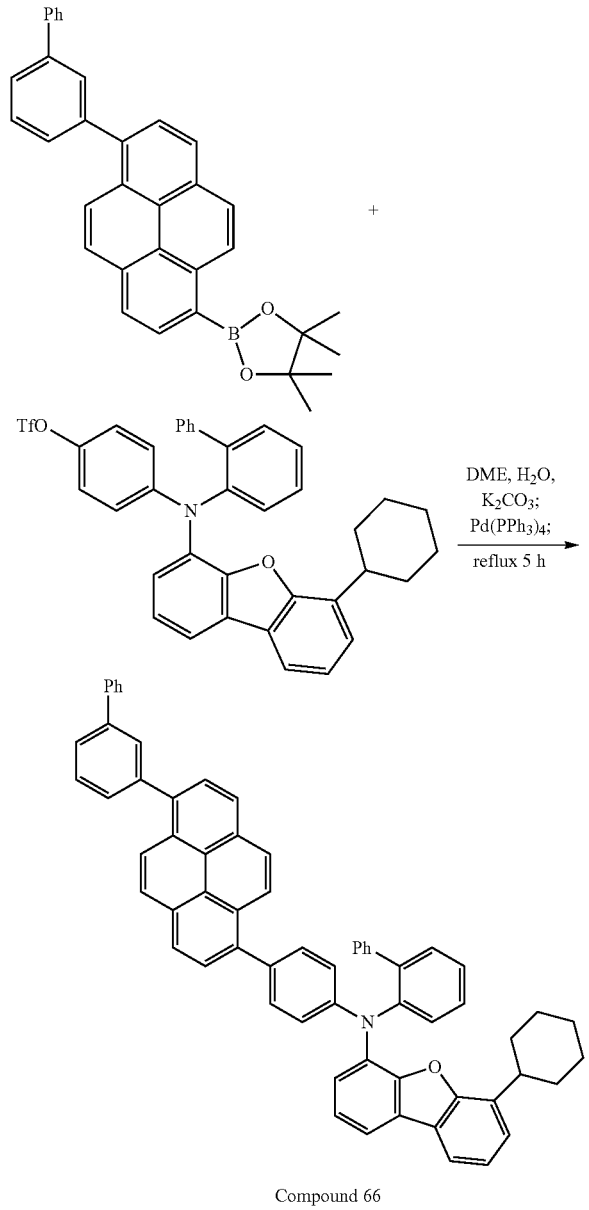

Compound 66

A solution of 2-(6-([1,1'-biphenyl]-3-yl)pyren-1-yl)-4,4,5,5-tetramethyl-1,3,2-dioxaborolane (0.41 g, 0.85 mmol), 4-([1,1'-biphenyl]-2-yl(6-cyclohexyldibenzo[b,d]furan-4-yl)amino)phenyl trifluoromethanesulfonate (0.68 g, 1.1 mmol), and K$_2$CO$_3$ (0.24 g, 1.7 mmol) in DME (15 mL) and water (5 mL) was bubbled with nitrogen for 30 min. Pd(PPh$_3$)$_4$ (0.05 g, 0.04 mmol) was added to the mixture. The mixture was bubbled with nitrogen for 15 min, then refluxed for 5 h. The reaction mixture was extracted by DCM. The extracts were dried over MgSO$_4$ and the solvent was removed in vacuo. The residue was purified by flash chromatography using 20% DCM/hexane (containing 0.25% triethylamine) to yield Compound 66 (0.68 g, 93% yield) as a yellow solid.

Synthesis of Compound 67

Compound 67 was synthesized as follows:

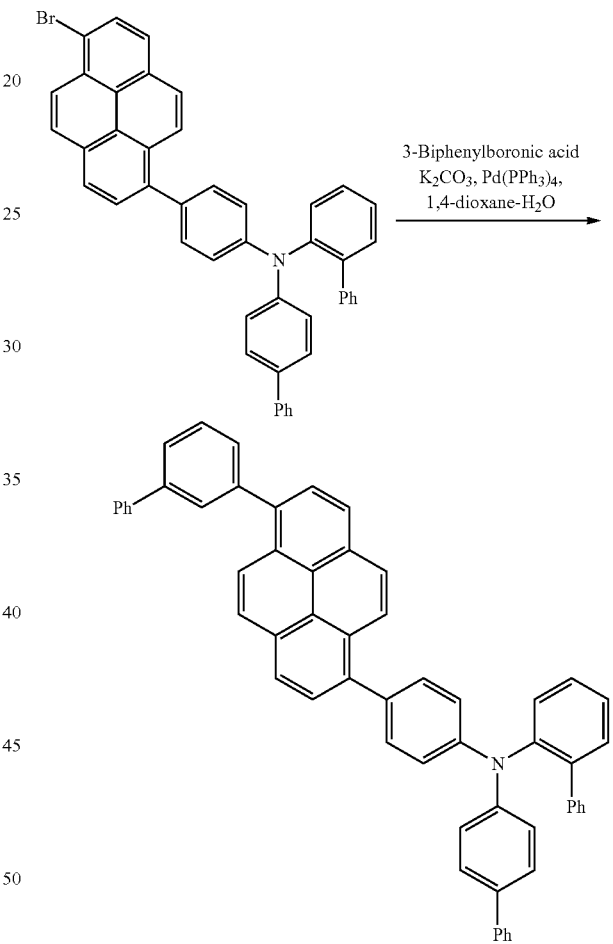

Compound 67

A mixture of potassium carbonate (500 mg, 3.62 mmol), 3-biphenylboronic acid (372 mg, 1.88 mmol), N-([1,1'-biphenyl]-4-yl)-N-(4-(6-bromopyren-1-yl)phenyl)-[1,1'-biphenyl]-2-amine (919 mg, 1.36 mmol), and Pd(PPh$_3$)$_4$ (75 mg, 0.06 mmol) in 1,4-dioxane-water (30 mL, 4:1) was bubbled with nitrogen for 30 min. The reaction mixture was heated to reflux for 19 h. The reaction mixture was filtered through a pad of Celite and MgSO$_4$ and washed with dichloromethane. The solvent was removed in vacuo and the residue was purified by flash column chromatography using 10% dichloromethane in hexane to yield Compound 67 (0.849 g, 83% yield) as a yellow solid.

Synthesis of Compound 68

Compound 68 was synthesized as follows:

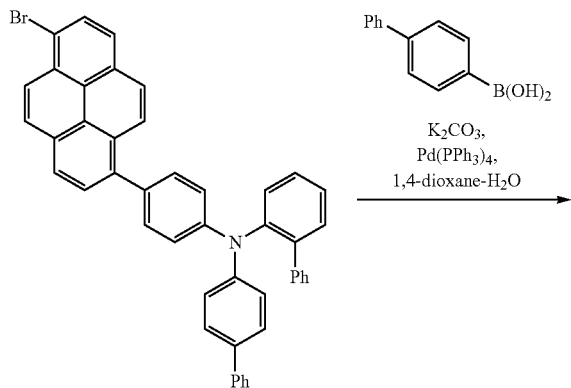

A mixture of potassium carbonate (501 mg, 3.62 mmol), 4-biphenylboronic acid (402 mg, 2.03 mmol), N-([1,1'-biphenyl]-4-yl)-N-(4-(6-bromopyren-1-yl)phenyl)-[1,1'-biphenyl]-2-amine (972 mg, 1.44 mmol) and Pd(PPh$_3$)$_4$ (88 mg, 0.08 mmol) in 1,4-dioxane-water (30 mL, 4:1) was bubbled with nitrogen for 30 min. The reaction mixture was heated to reflux for 19 h. The reaction mixture was filtered through a pad of Celite and MgSO$_4$, then washed with dichloromethane. The solvent was removed in vacuo and the residue was purified by flash column chromatography using 10% dichloromethane in hexane to yield Compound 68 (0.97 g, 90% yield) as a yellow solid.

Synthesis of Compound 69

N-([1,1'-biphenyl]-2-yl)-N-(4-(6-([1,1'-biphenyl]-3-yl)pyren-1-yl)phenyl)-[1,1'-biphenyl]-2-amine was synthesized as follows:

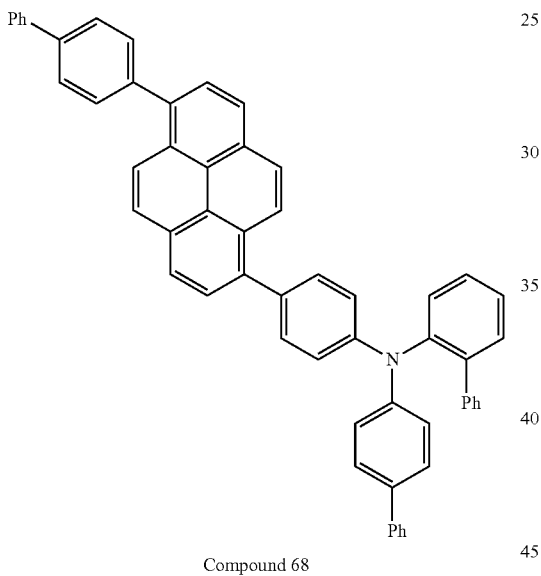

Compound 68

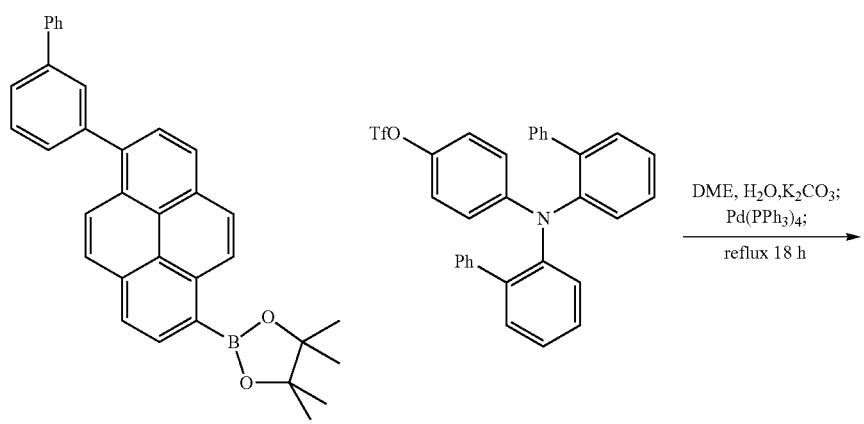

-continued

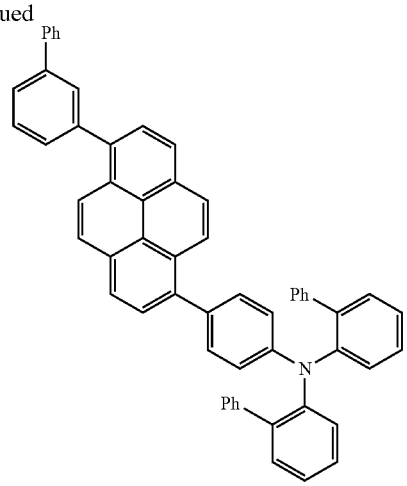

Compound 69

A solution of 2-(6-([1,1'-biphenyl]-3-yl)pyren-1-yl)-4,4,5,5-tetramethyl-1,3,2-dioxaborolane (0.72 g, 1.5 mmol), 4-(di([1,1'-biphenyl]-2-yl)amino)phenyl trifluoromethanesulfonate (0.82 g, 1.5 mmol), and $K_2CO_3$ (0.41 g, 3.0 mmol) in DME (45 mL) and water (5 mL) was bubbled with nitrogen for 30 min. $Pd(PPh_3)_4$ (0.09 g, 0.08 mmol) was added to the mixture, which was then bubbled with nitrogen for 15 min. The resultant mixture was refluxed for 18 h. The reaction mixture was extracted by DCM. The extracts were dried over $MgSO_4$ and the solvent was removed in vacuo. The residue was purified by flash chromatography using 15% DCM/hexane (containing 0.5% triethylamine) to yield Compound 69 (1.1 g, 90% yield) as a yellow solid.

Synthesis of Compound 70

Compound 70 as synthesized as follows:

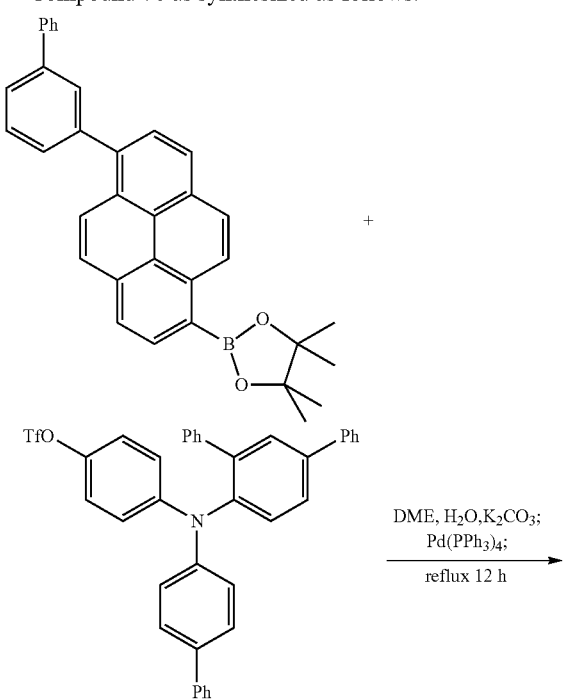

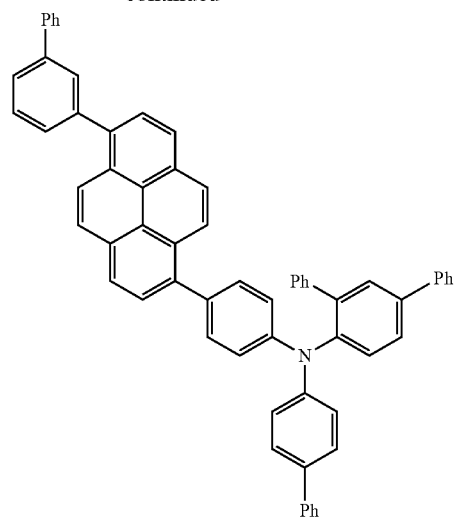

Compound 70

A solution of 2-(6-([1,1'-biphenyl]-3-yl)pyren-1-yl)-4,4,5,5-tetramethyl-1,3,2-dioxaborolane (1.0 g, 2.1 mmol), 4-([1,1'-biphenyl]-4-yl([1,1':3',1''-terphenyl]-4'-yl)amino)phenyl trifluoromethanesulfonate (1.2 g, 2.0 mmol), and $K_2CO_3$ (0.6 g, 4.0 mmol) in DME (45 mL) and water (5 mL) was bubbled with nitrogen for 30 min. $Pd(PPh_3)_4$ (0.1 g, 0.1 mmol) was added to the mixture, which was then bubbled with nitrogen for 15 min. The resultant mixture was refluxed for 12 h. The reaction mixture was extracted by DCM. The extracts were dried over $MgSO_4$ and the solvent was removed in vacuo. The residue was purified by flash chromatography using 35% toluene/hexane (containing 0.25% triethylamine) to yield Compound 70 as a yellow solid.

Synthesis of Compound 71

Compound 71 was synthesized as follows:

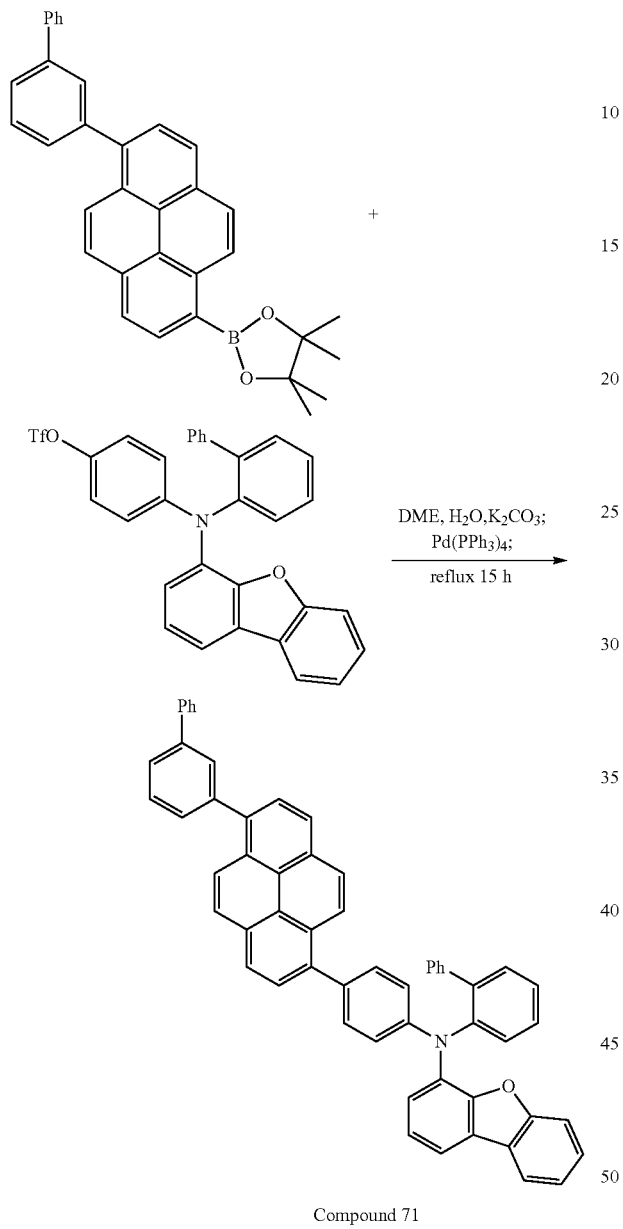

Compound 71

A solution of 2-(6-([1,1'-biphenyl]-3-yl)pyren-1-yl)-4,4,5,5-tetramethyl-1,3,2-dioxaborolane (0.8 g, 1.7 mmol), 4-([1,1'-biphenyl]-2-yl(dibenzo[b,d]furan-4-yl)amino)phenyl trifluoromethanesulfonate (1.2 g, 2.2 mmol), and $K_2CO_3$ (0.5 g, 3.4 mmol) in DME (45 mL) and water (5 mL) was bubbled with nitrogen for 30 min. $Pd(PPh_3)_4$ (0.1 g, 0.1 mmol) was added to the solution, which was then bubbled with nitrogen for 15 min. The resultant mixture was refluxed for 15 h. The reaction mixture was extracted by DCM. The extracts were dried over $MgSO_4$ and the solvent was removed in vacuo. The residue was purified by flash chromatography using 25% toluene/hexane (containing 0.25% triethylamine) to yield Compound 71 (0.8 g, 62% yield) as a yellow solid.

PLQY Evaluations

Photoluminescence and photoluminescence quantum yield (PLQY) experiments were carried out and summarized in Table 2. Poly(methyl methacrylate) (PMMA) doped film (95:5 by weight of PMMA:emitter) were fabricated by solution drop casting on quartz substrates.

TABLE 2

| Compound | PLQY | $Em_{max}$ (nm) |
|---|---|---|
| Cmpd 10 | 90% | 455 |
| Cmpd 13 | 90% | 461 |
| Cmpd 29 | 88% | 456 |
| Cmpd 43 | 94% | 481 |
| Comparative Cmpd 1 | 81% | 456 |
| Comparative Cmpd 2 | 81% | 482 |
| Comparative Cmpd 3 | 87% | 463 |

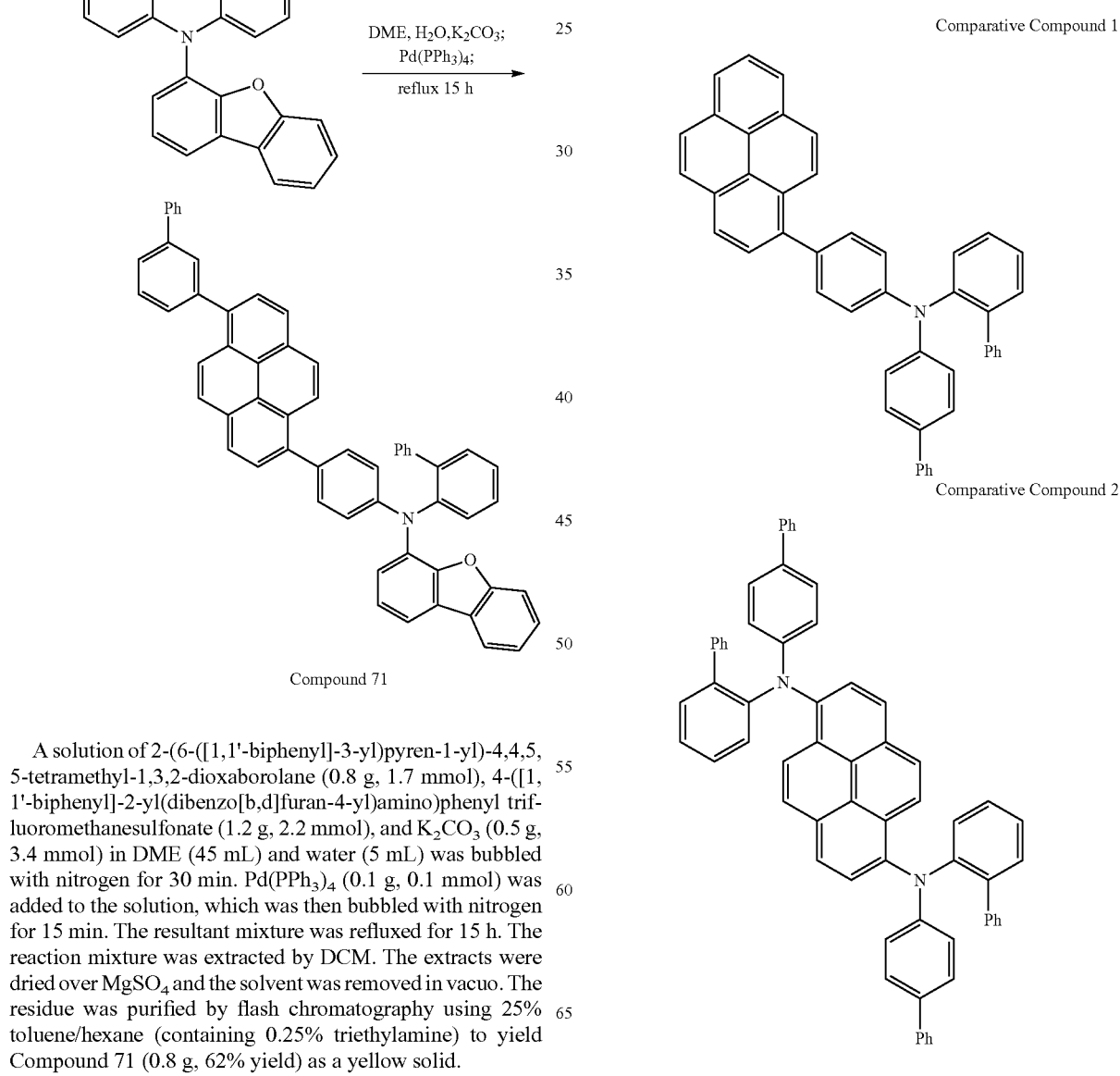

Comparative Compound 1

Comparative Compound 2

-continued

Comparative Compound 3

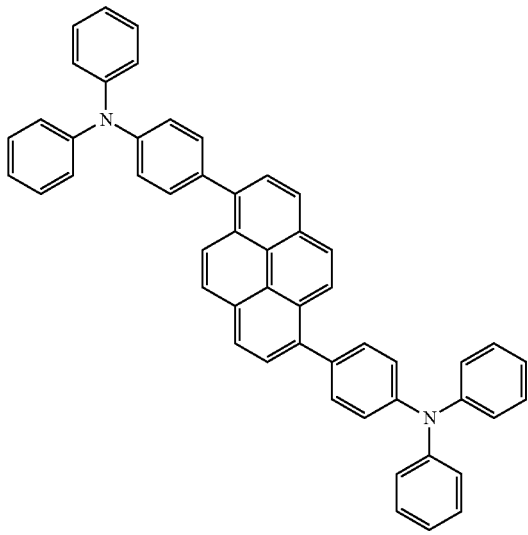

As shown by the PLQY data, disubstituted pyenes of Compound 10 and Compound 13 have a significantly higher PLQY than the mono-substituted pyrene of Comparative Compound 1. The unexpected improvement in PLQY is believed to be due to reduced π-stacking when 2 substitutents are present compared to 1. In addition, if the amino N is directly connected to the pyrene ring without any spacer/linker group, the emission is significantly red shifted and the PLQY is lower as demonstrated by comparing Comparative Compound 2 (PLQY=81%, $Em_{max}$=482 nm) with Compound 13 (PLQY=90%, $Em_{max}$=461 nm). Furthermore, if there is no ortho aryl group $R^t$, the emission is red shifted and the PLQY is lower as demonstrated by comparing Comparative Compound 3 (PLQY=87%, $Em_{max}$=463 nm) with Compound 10 (PLQY=90%, $Em_{max}$=455 nm) and Compound 13 (PLQY=90%, $Em_{max}$=461 nm). It is expected that the PLQY will further decrease and emission will further redshift for emitters without the ortho aryl group $R^t$ when doped in aromatic host matrices due to increased π-stacking between the emitter and the host molecules. It is therefore highly beneficial to a spacer/linker group between the amino N and the pyrene ring and the ortho aryl group $R^t$ simultaneously.

As an intrinsic property, a high PLQY value indicates a compound may be particularly useful as an emissive compound in an OLED device. Having a high PLQY is particularly important because maximum efficiencies in OLED devices are generally 5-8% of the PLQY value for fluorescent OLED. Thus, while the device can be optimized to increase quantum efficiency, the maximum quantum efficiency that can be achieved by a given compound is dictated by the intrinsic property of photoluminescent quantum yield. In view of this situation, if the PLQY value of a compound is low to start with, it is unlikely the compound would be useful as an emitter in an OLED device.

Device Examples

Compounds 10 and 13 were evaluated as possible fluorescent emitters in OLED devices. The organic stack of Device Example 1 consisted of sequentially, from the ITO surface, 100 Å of LG101 (LG Chem, Korea) as the hole injection layer (HIL), 300 Å of α-NPB as the hole transporting layer (HTL), 300 Å of CBP doped with 20% of Compound 10 as the emissive layer (EML), 100 Å of BAlq as the ETL2 and 400 Å of LG-201 (LG Chem, Korea) as the ETL1. The external quantum efficiency was 4.2% at 1000 cd/m² and the CIE was 0.144, 0.201. These results are summarized in Table 3.

Device Example 2 consisted of 100 Å of LG101 (LG Chem, Korea) as the hole injection layer (HIL), 300 Å of α-NPB as the hole transporting layer (HTL), 300 Å of CBP doped with 10% of Compound 13 as the emissive layer (EML), 400 Å of LG-201 (LG Chem, Korea) as the ETL. The external quantum efficiency was 4.8% at 1000 cd/m², and the CIE was 0.141, 0.193. These results are summarized in Table 3.

Device Example 3 consisted of 100 Å of LG101 (LG Chem, Korea) as the hole injection layer (HIL), 300 Å of α-NPB as the hole transporting layer (HTL), 300 Å of Compound A doped with 10% of Compound 13 as the emissive layer (EML), 400 Å of LG-201 (LG Chem, Korea) as the ETL. The external quantum efficiency was 4.8% at 1000 cd/m², and the CIE was 0.141, 0.193.

Device Example 4 consisted of 100 Å of LG101 (LG Chem, Korea) as the hole injection layer (HIL), 550 Å of Compound B as the first hole transporting layer (HTL1), 650 Å of α-NPB as the second hole transporting layer (HTL2), 100 Å of Compound C as the third hole transporting layer (HTL3), 250 Å of Compound A doped with 3% of Compound 10 as the emissive layer (EML), 100 Å of Compound D as ETL2 and 150 Å of Compound E as ETL1. The external quantum efficiency was 7.8% at 1000 cd/m², and the CIE was 0.141, 0.118.

Device Example 5 consisted of 100 Å of LG101 (LG Chem, Korea) as the hole injection layer (HIL), 550 Å of Compound B as the first hole transporting layer (HTL1), 650 Å of α-NPB as the second hole transporting layer (HTL2), 100 Å of Compound C as the third hole transporting layer (HTL3), 250 Å of Compound A doped with 3% of Compound 43 as the emissive layer (EML), 100 Å of Compound D as ETL2 and 150 Å of Compound E as ETL1. The external quantum efficiency was 7.9% at 1000 cd/m², and the CIE was 0.137, 0.167.

Device Example 6 consisted of 100 Å of LG101 (LG Chem, Korea) as the hole injection layer (HIL), 550 Å of Compound B as the first hole transporting layer (HTL1), 650 Å of α-NPB as the second hole transporting layer (HTL2), 100 Å of Compound C as the third hole transporting layer (HTL3), 250 Å of Compound A doped with 3% of Compound 29 as the emissive layer (EML), 100 Å of Compound D as ETL2 and 150 Å of Compound E as ETL1. The external quantum efficiency was 7.6% at 1000 cd/m², and the CIE was 0.144, 0.114.

Device Example 7 consisted of 100 Å of LG101 (LG Chem, Korea) as the hole injection layer (HIL), 550 Å of Compound B as the first hole transporting layer (HTL1), 650 Å of α-NPB as the second hole transporting layer (HTL2), 100 Å of Compound C as the third hole transporting layer (HTL3), 250 Å of Compound A doped with 3% of Compound 32 as the emissive layer (EML), 100 Å of Compound D as ETL2 and 150 Å of Compound E as ETL1. The external quantum efficiency was 6.9% at 1000 cd/m², and the CIE was 0.146, 0.100.

The results for Device Examples 1-7 are summarized in Table 3.

Compound A

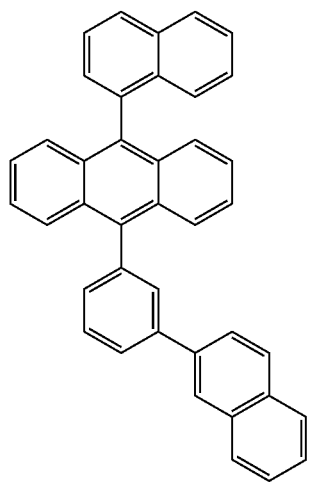

TABLE 3

|  | EQE (at 1000 cd/m2) | CIEx | CIEy |
|---|---|---|---|
| Device 1 | 4.2% | 0.144 | 0.201 |
| Device 2 | 4.8% | 0.141 | 0.193 |
| Device 3 | 4.8% | 0.140 | 0.219 |
| Device 4 | 7.8% | 0.141 | 0.118 |
| Device 5 | 7.9% | 0.137 | 0.167 |
| Device 6 | 7.6% | 0.144 | 0.114 |
| Device 7 | 6.9% | 0.146 | 0.100 |

This device data shows that pyrene compounds, which contain amino group with an ortho aryl arrangement such that the steric bulkiness imposes a heavy twisting of the aryl rings, can be used as emitters in OLEDs to give high efficiency.

Device Examples 8-14

Compounds used in device examples 8-14 include:

Compound B

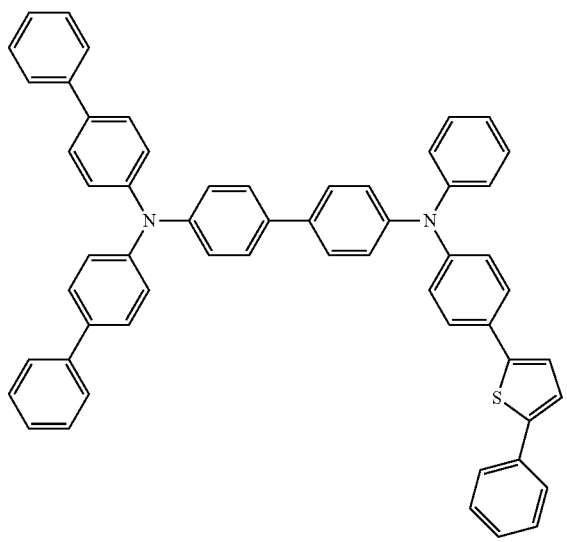

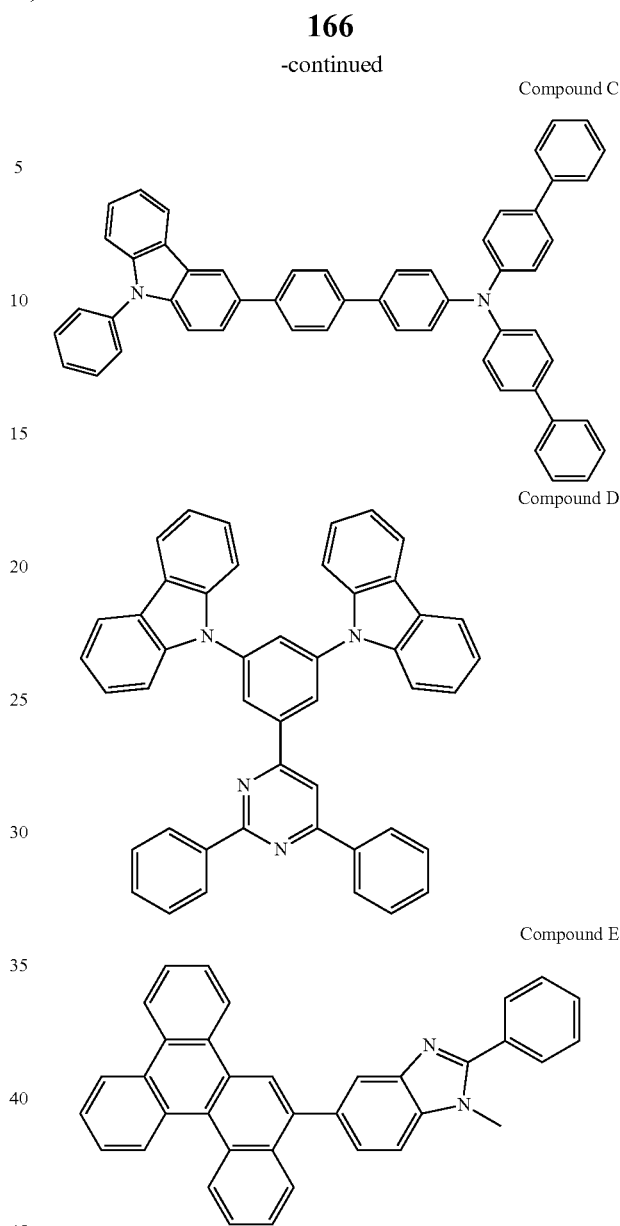

Device Examples 8-14 were formed using 100 Å of LG101 (LG Chem, Korea) as the hole injection layer (HIL), 550 Å of Compound B as the first hole transporting layer (HTL1), 650 Å of α-NPB as the second hole transporting layer (HTL2), 100 Å of Compound C as the third hole transporting layer (HTL3), 250 Å of Compound A doped with 3% one of Compound 66, Compound 67, Compound 4, Compound 68, Compound 69, Compound 70 and Compound 71 as the emissive layer (EML), 100 Å of Compound D as ETL2, and 150 Å of Compound E as ETL 1. The device data at L=1000 cd/m² is summarized below in Table 4.

TABLE 4

| Emitter | CIE x | CIE y | $Em_{max}$ [nm] | FWHM [nm] | Voltage [V] | LE [cd/A] | EQE [%] | PE [lm/W] |
|---|---|---|---|---|---|---|---|---|
| Cmpd 66 | 0.148 | 0.090 | 450 | 46.3 | 8.4 | 4.3 | 5.4 | 1.6 |
| Cmpd 67 | 0.146 | 0.100 | 454 | 46.1 | 8 | 5.1 | 5.8 | 2 |
| Cmpd 4 | 0.146 | 0.099 | 454 | 45.6 | 7 | 5.5 | 6.2 | 2.4 |

TABLE 4-continued

| Emitter | CIE x | CIE y | Em$_{max}$ [nm] | FWHM [nm] | Voltage [V] | LE [cd/A] | EQE [%] | PE [lm/W] |
|---|---|---|---|---|---|---|---|---|
| Cmpd 68 | 0.145 | 0.113 | 455 | 46.5 | 6.6 | 6.5 | 6.7 | 3.1 |
| Cmpd 69 | 0.147 | 0.094 | 451 | 45.3 | 6.1 | 5.6 | 6.6 | 2.9 |
| Cmpd 70 | 0.146 | 0.105 | 454 | 45.6 | 5.9 | 6.5 | 7.1 | 3.5 |
| Cmpd 71 | 0.147 | 0.088 | 450 | 46.1 | 6.4 | 4.5 | 5.6 | 2.2 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having Formula 1:

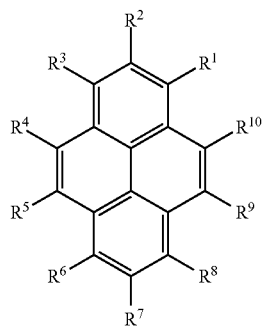

Formula 1 wherein $R^1$—$R^{10}$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, wherein at least two of $R^1$—$R^{10}$ are not H,
wherein at least one of $R^1$—$R^{10}$ has the formula T1

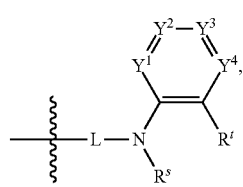

T1 wherein L is an organic linker,
wherein $Y^1$ to $Y^4$ are CR or N,
wherein R is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, wherein adjacent R moieties can form fused rings, wherein $R^s$ and $R^t$ are independently aryl or heteroaryl, either of which may independently be further substituted, and wherein $R^s$ and $R^t$ do not form fused rings with any part of the molecule.

2. The compound of claim 1, wherein linker L is alkyl, aryl or heteroaryl.

3. The compound of claim 1, wherein $R_s$ can comprise a moiety selected from the group consisting of dibenzothiophene, dibenzofuran, dibenzoselenophene, aza-dibenzothiophene, aza-dibenzofuran, or aza-dibenzoselenophene, phenyl, pyridine, and combinations thereof.

4. The compound of claim 1, wherein linker L is selected from the group consisting of:

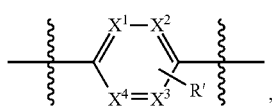

L1

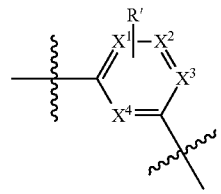

L2

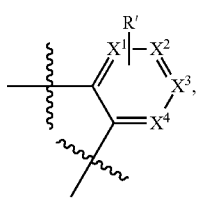

L3

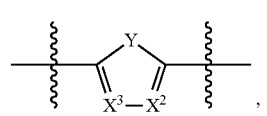

L4

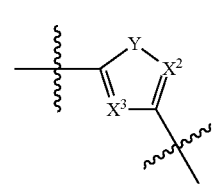

L5

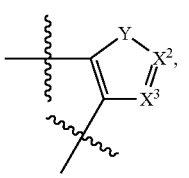

L6

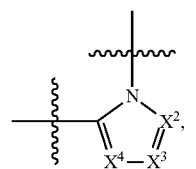

L7

-continued
L8
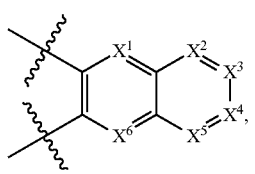
L9
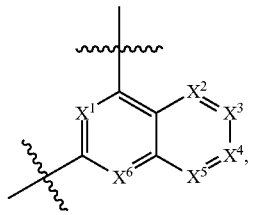
L10
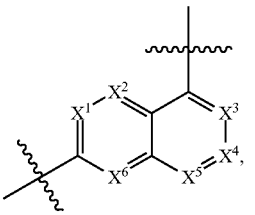
L11
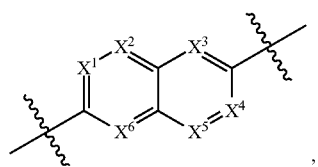,
L12
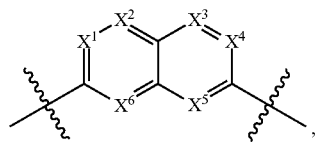,
L13
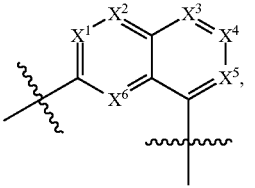,
L14
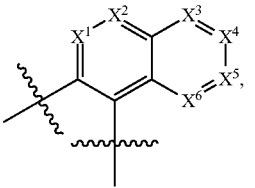,
L15
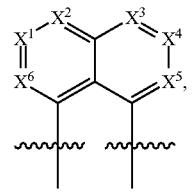,
-continued
L16
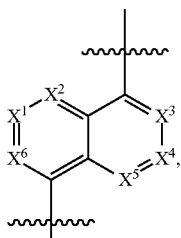
L17
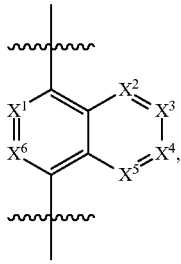,
L18
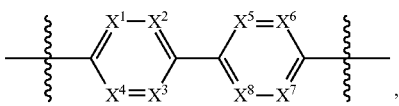,
L19
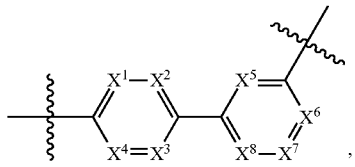,
L20
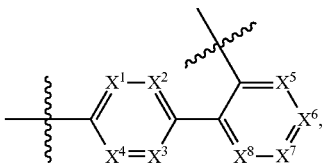,
L21
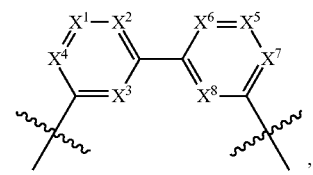,
L22
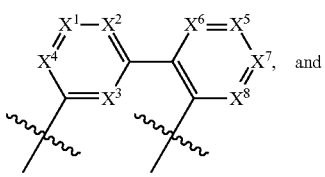, and
L23
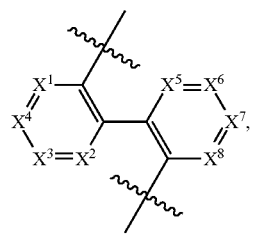, wherein $X^1$ to $X^8$ are CR' or N, wherein Y is NR", O or S, and wherein R' and R" are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

5. The compound of claim 1, wherein $R^1$ has the formula

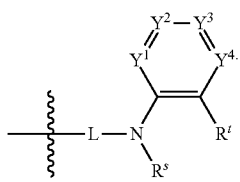

T1

6. The compound of claim 1, wherein $R^1$ has the formula

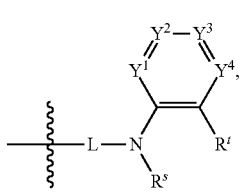

T1 and $R^6$ is alkyl, aryl or heteroaryl.

7. The compound of claim 6, wherein the compound is selected from the group consisting of:

Compound 1

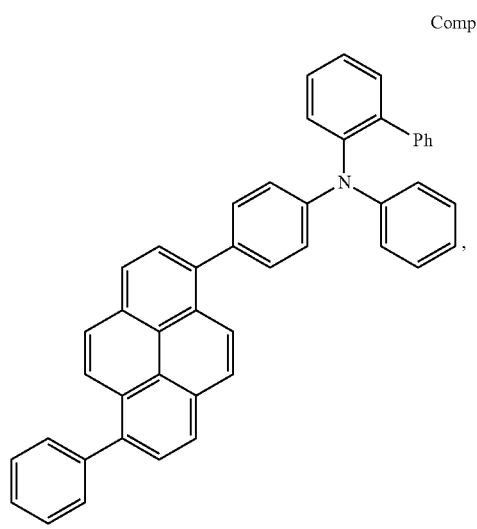

Compound 2

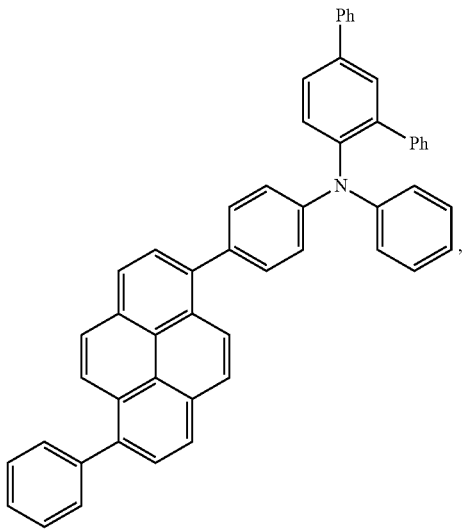

Compound 3

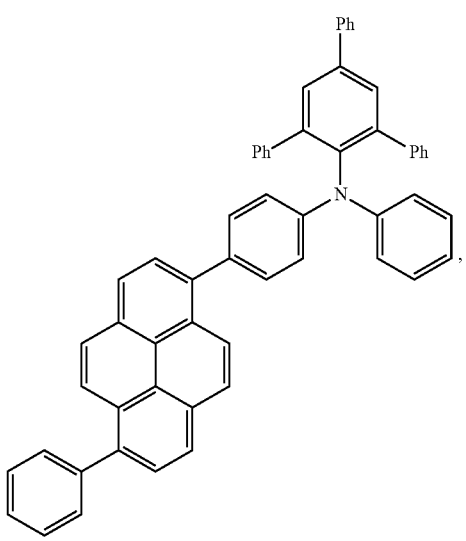

Compound 4

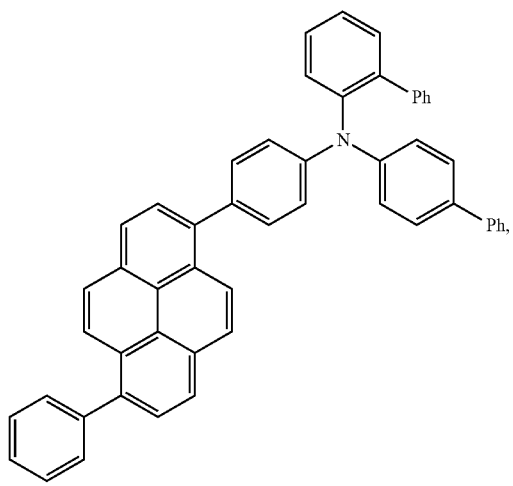

Compound 5
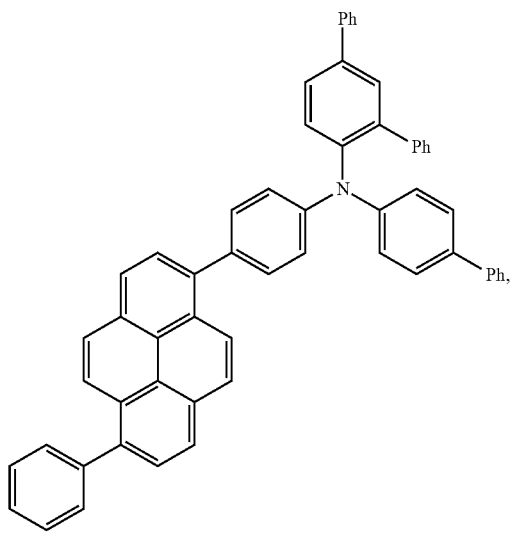
Compound 6
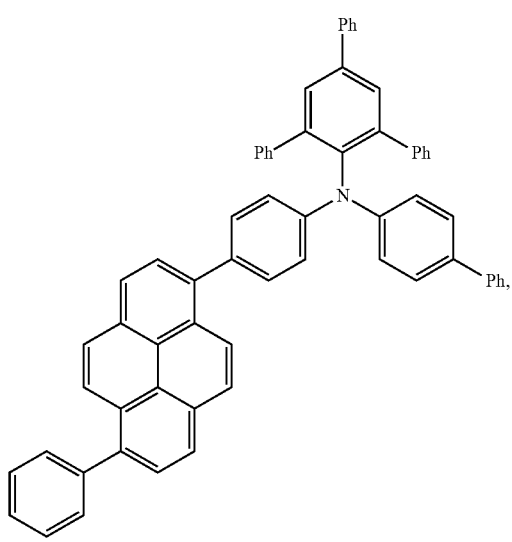
Compound 7
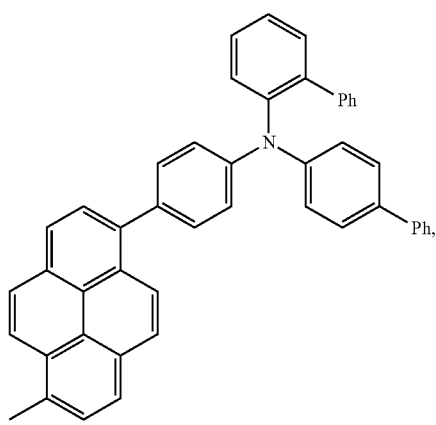
Compound 8
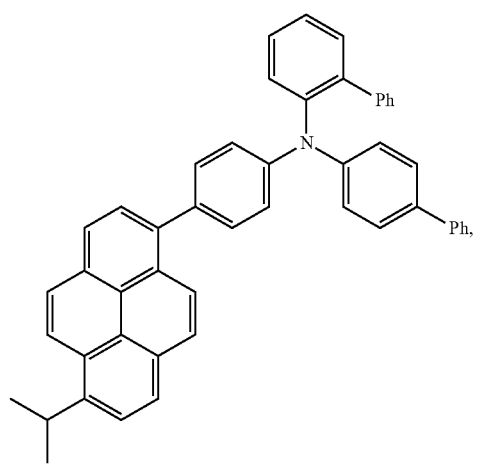
Compound 9
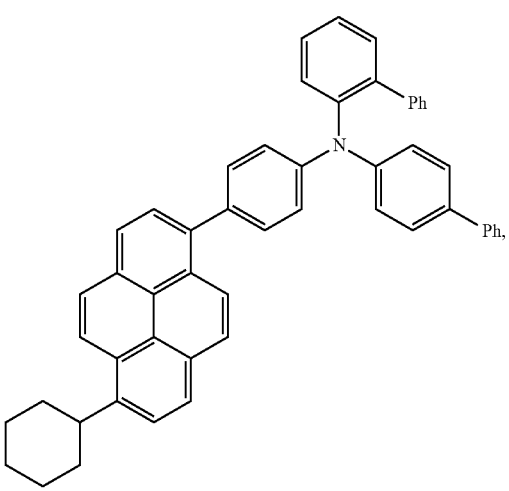
Compound 66
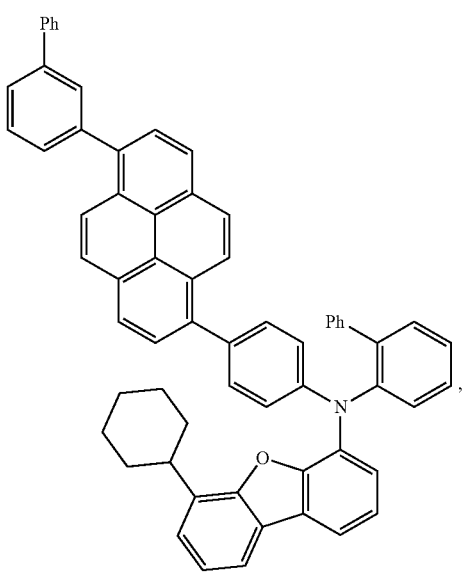

Compound 67
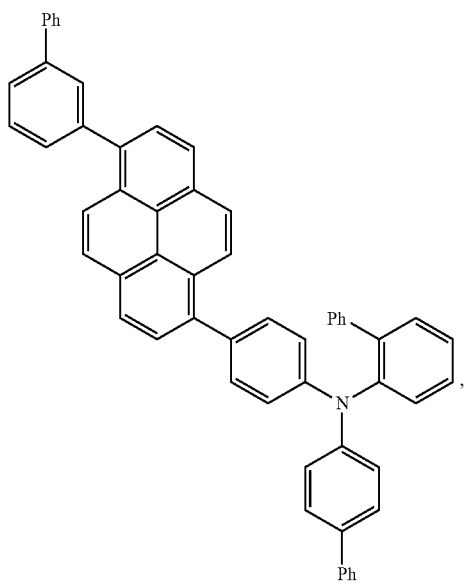
Compound 68
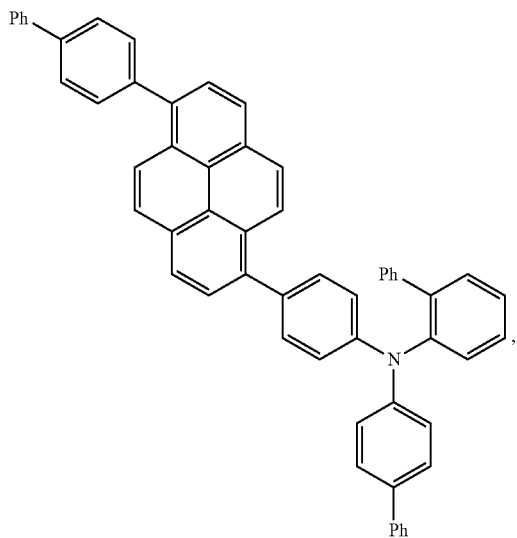
Compound 69
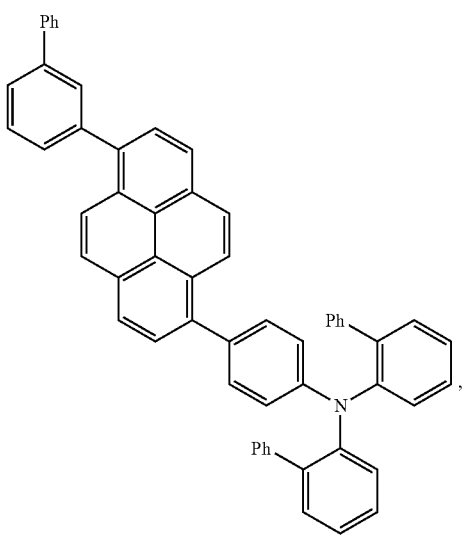
Compound 70
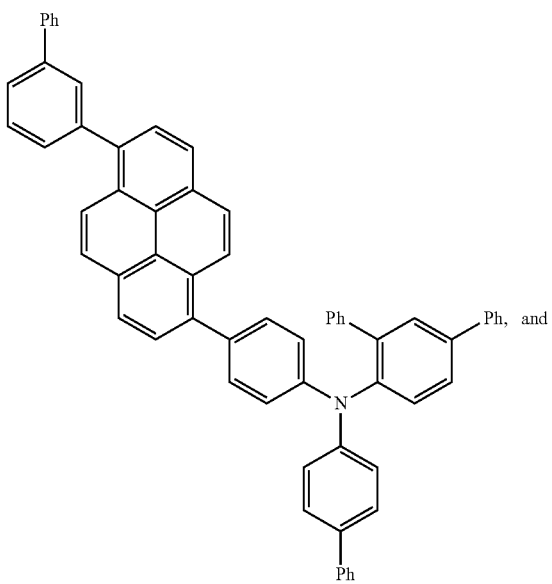
and Compound 71
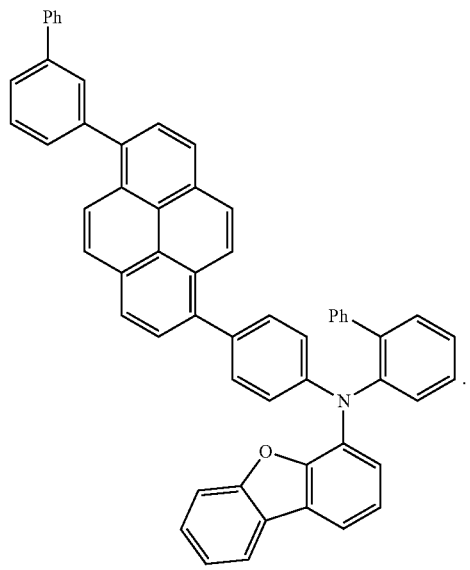
8. The compound of claim 1, wherein the compound is selected from the group consisting of:
Compound 10
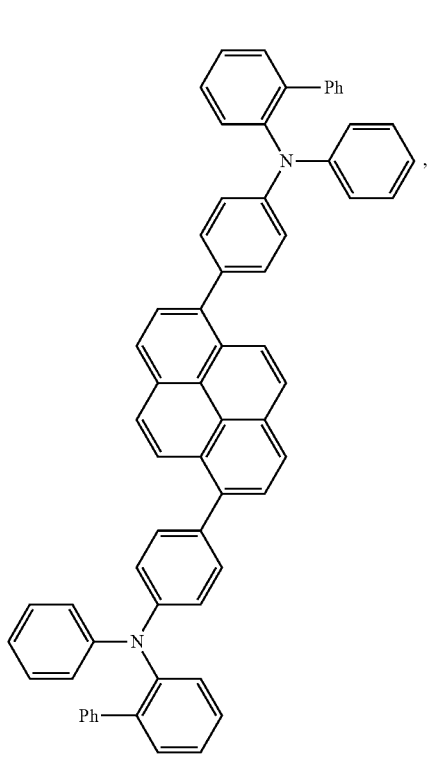
Compound 11
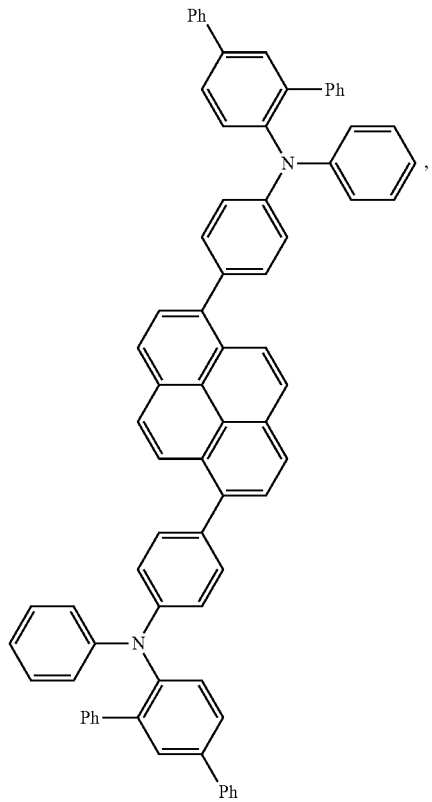
Compound 12
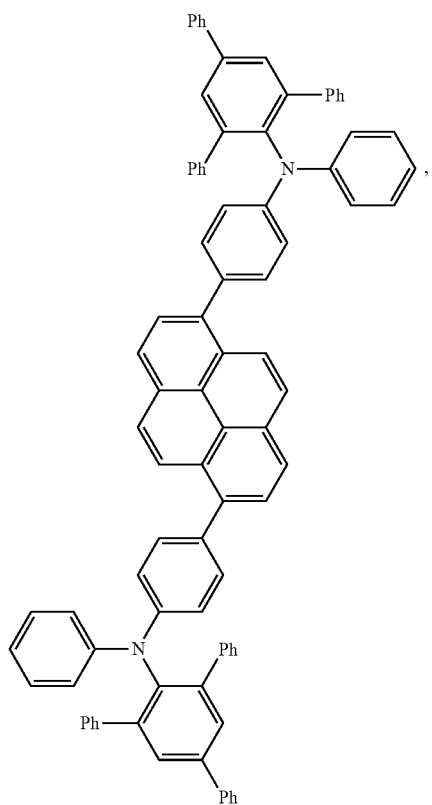

Compound 13
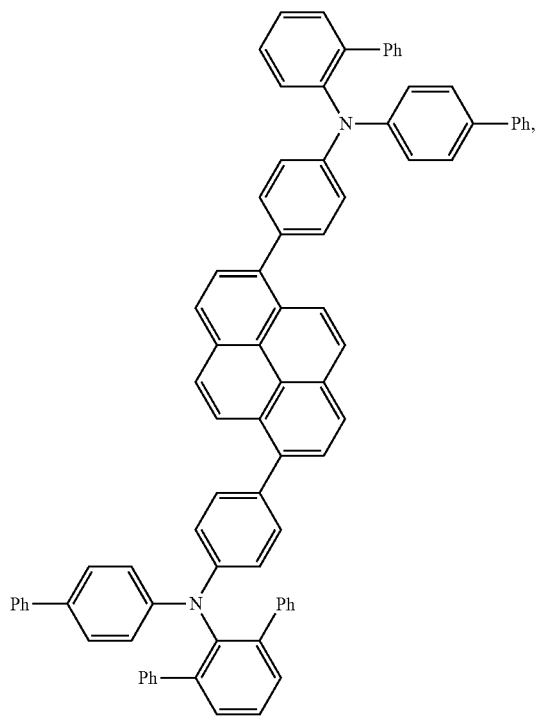
Compound 14
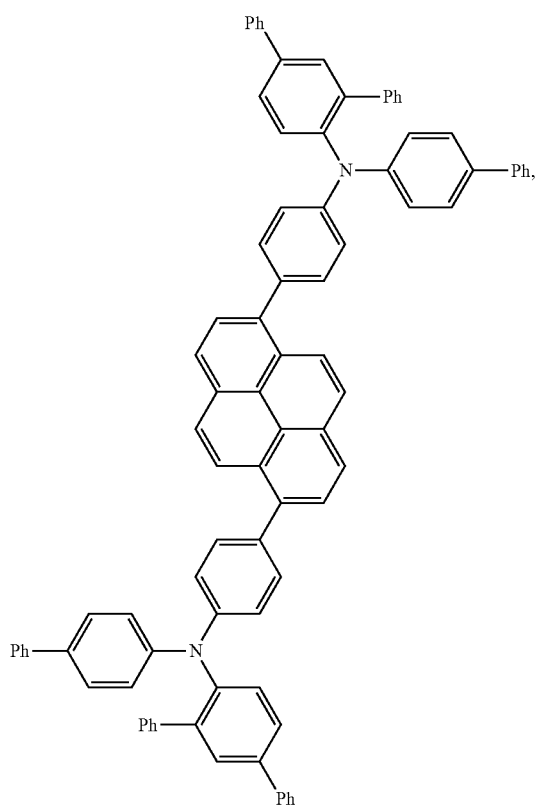
Compound 15
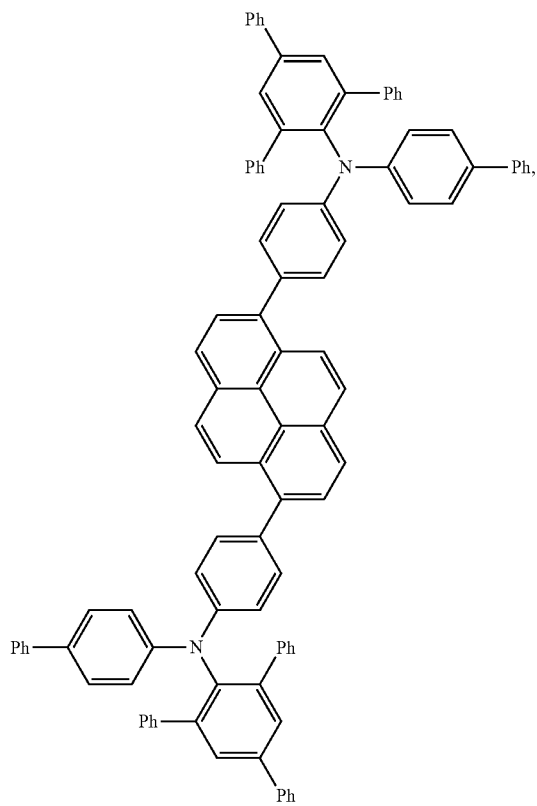
Compound 22
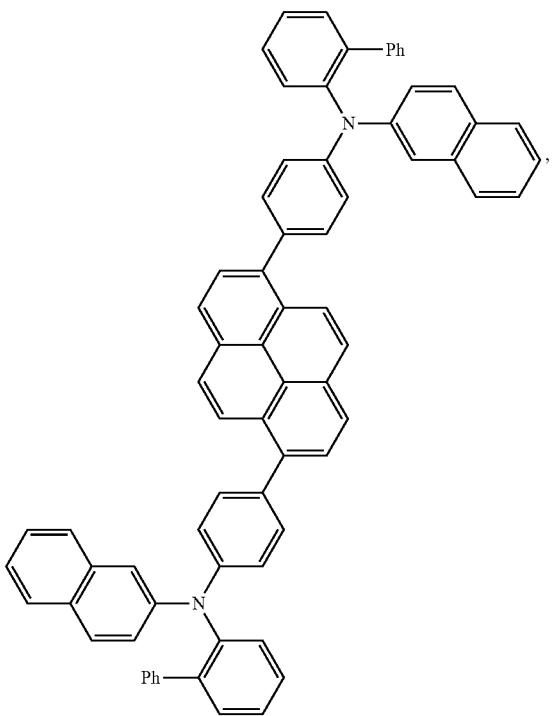

Compound 23
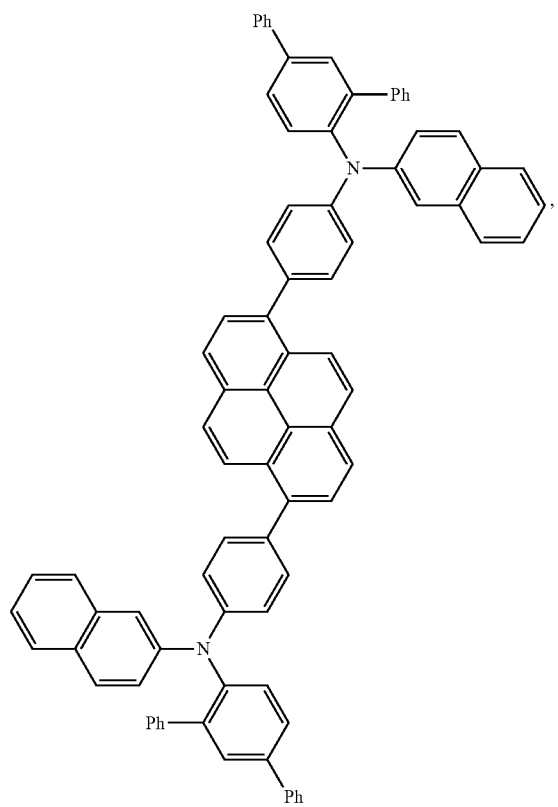
Compound 25
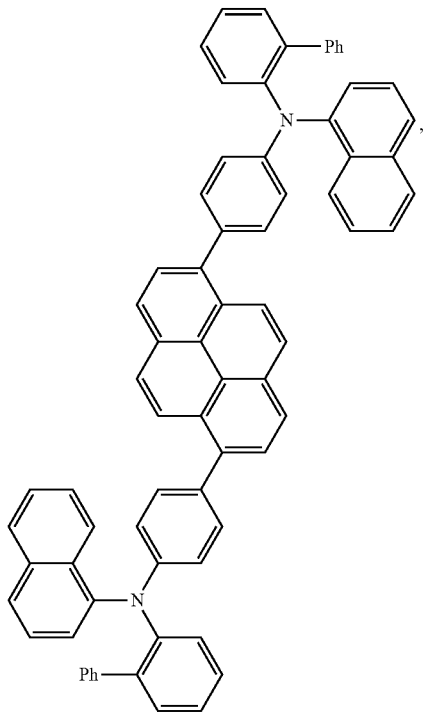
Compound 24
Compound 26
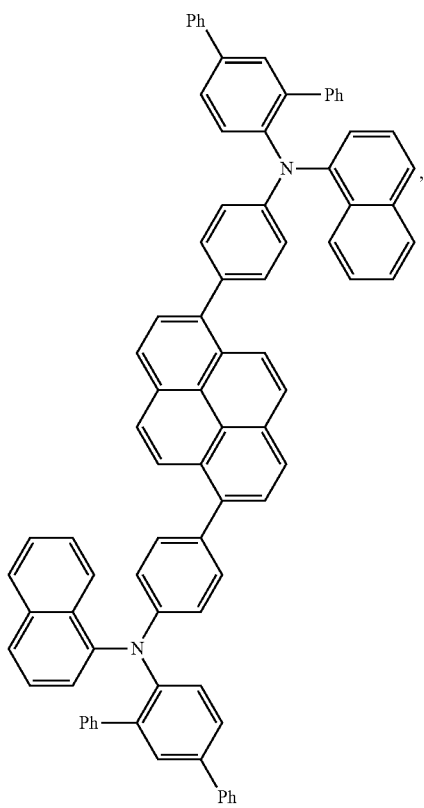

Compound 27
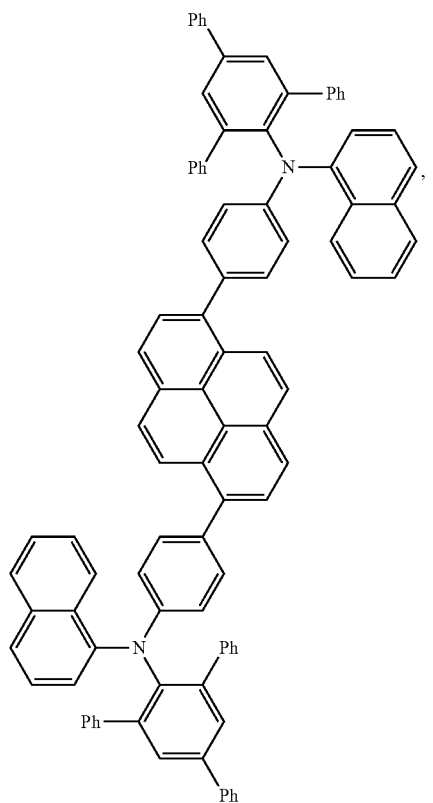
Compound 28
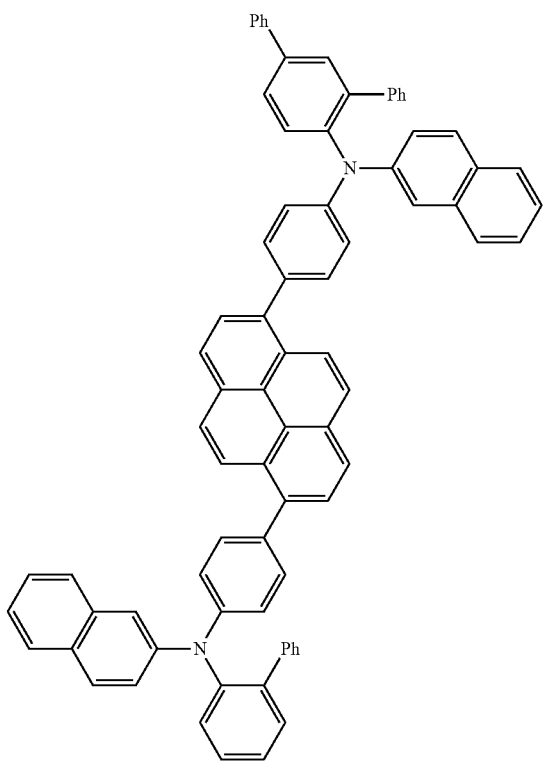
Compound 29
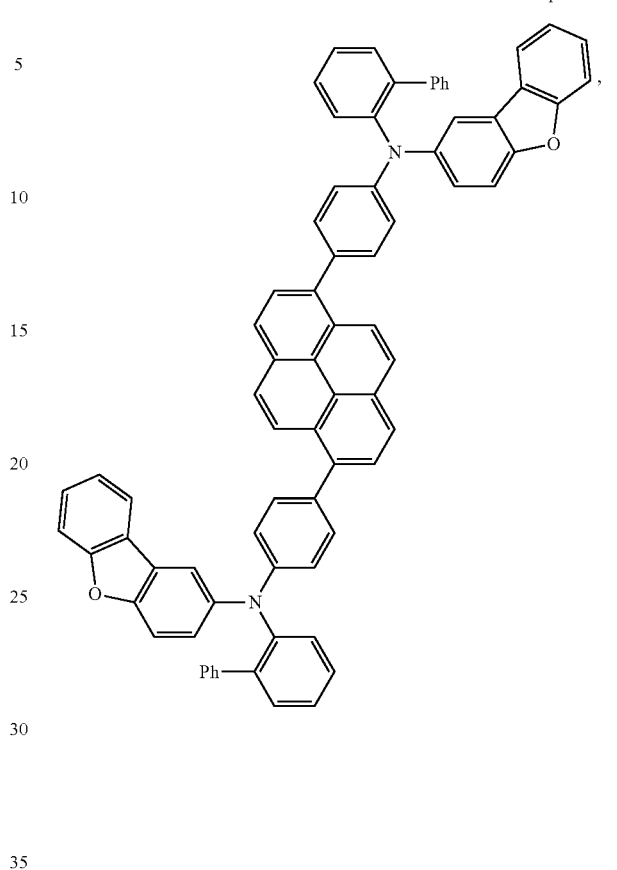
Compound 30
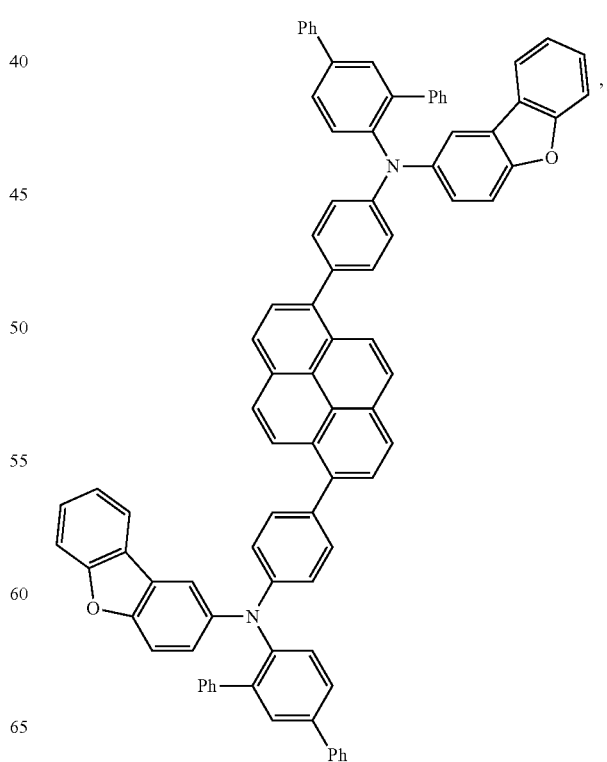

Compound 31
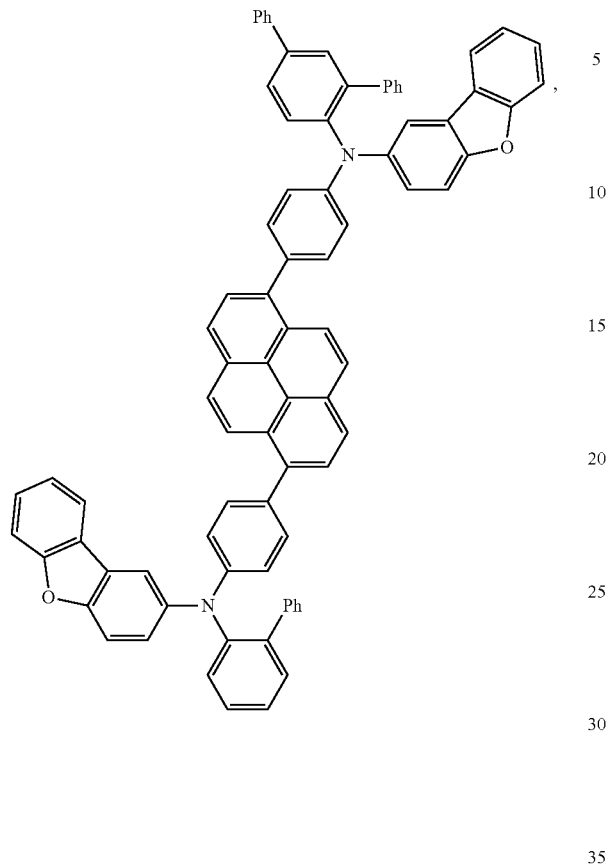
Compound 33
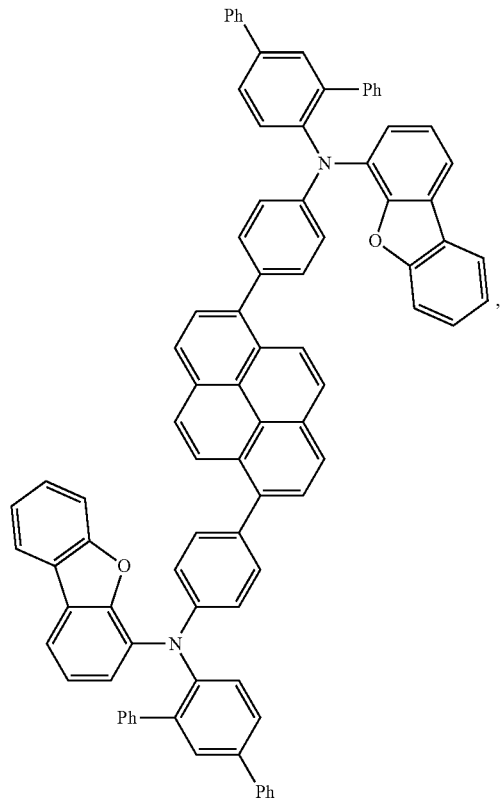
Compound 32
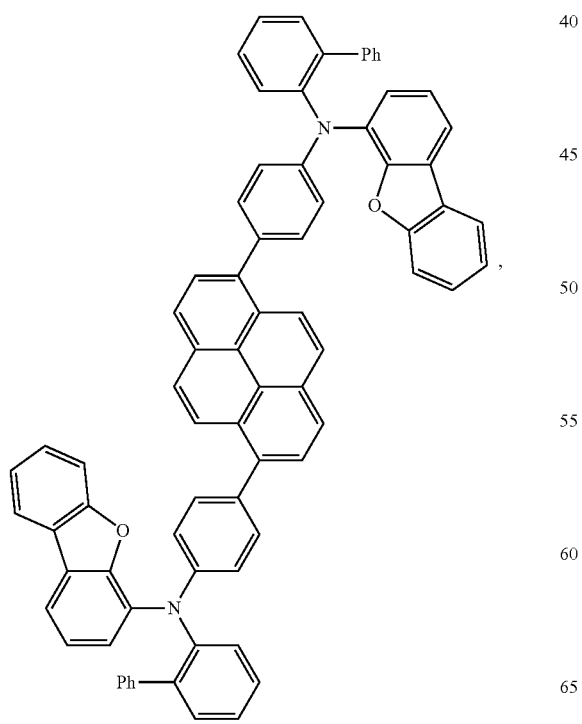
Compound 34
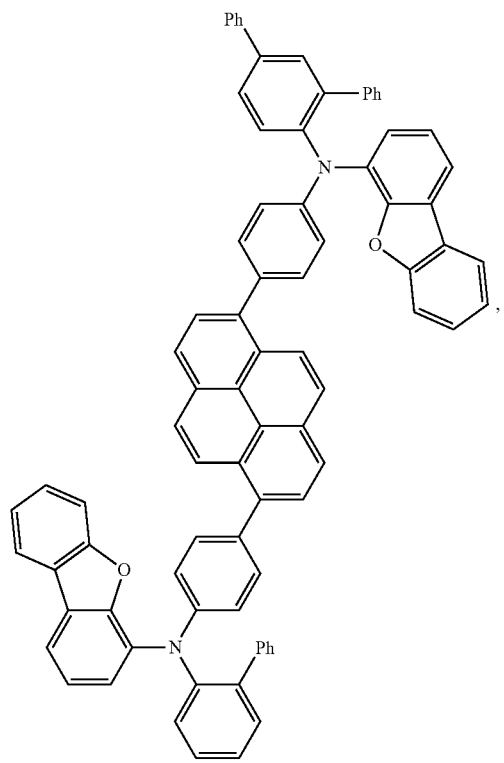

Compound 35
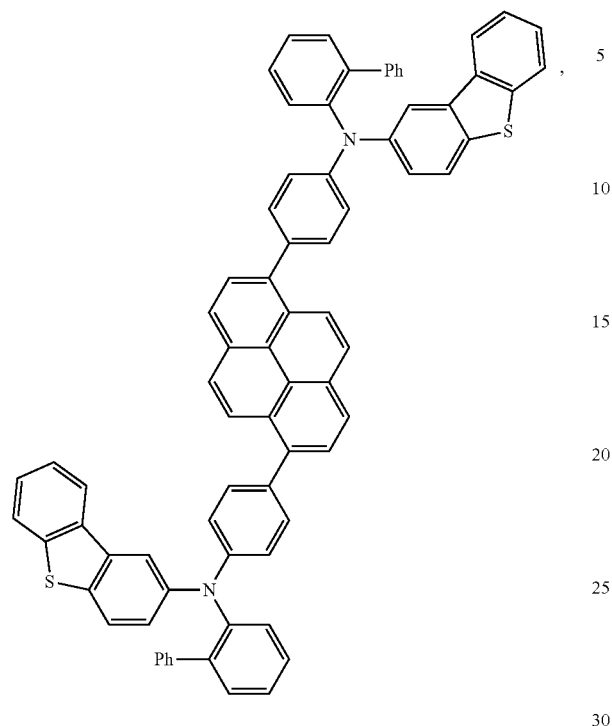
Compound 36
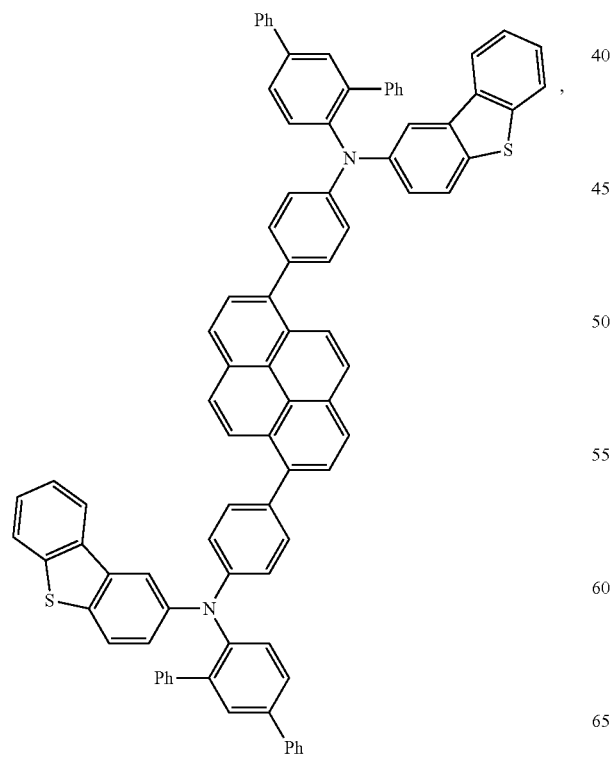
Compound 37
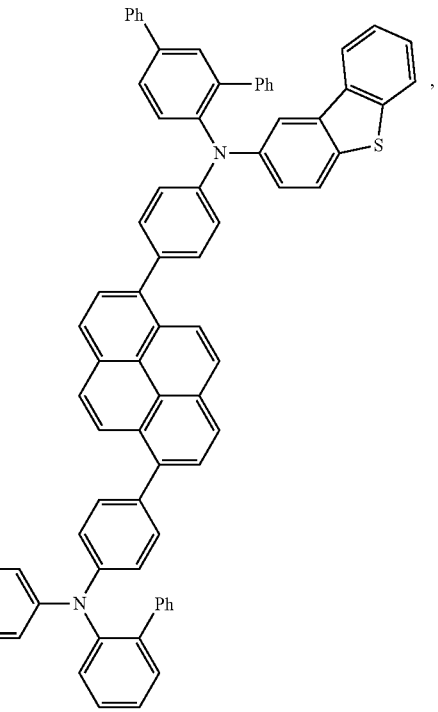
Compound 38
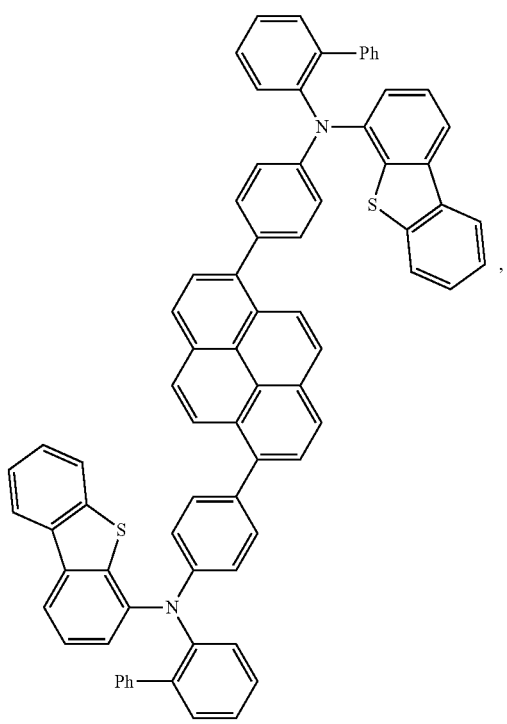

-continued
Compound 39
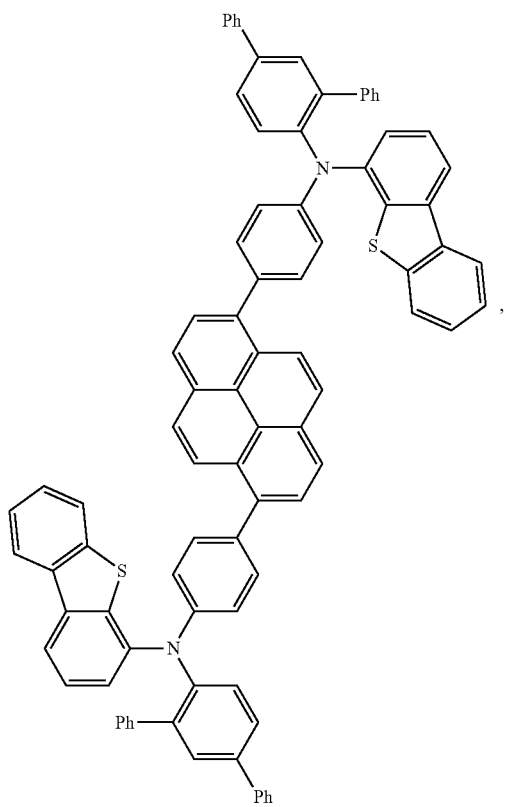
Compound 40
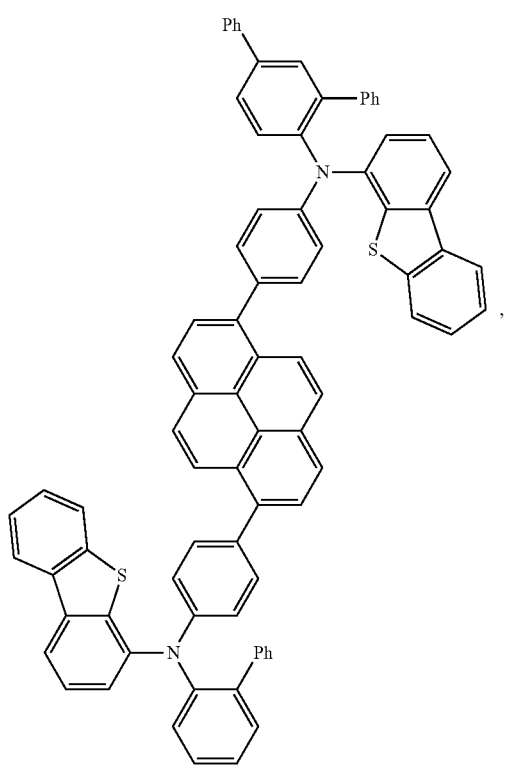
-continued
Compound 41
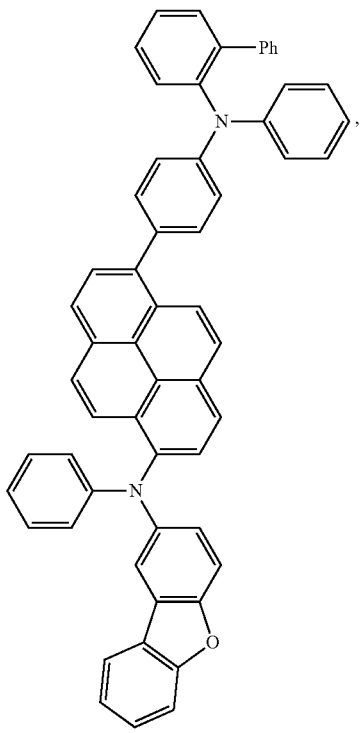
Compound 42
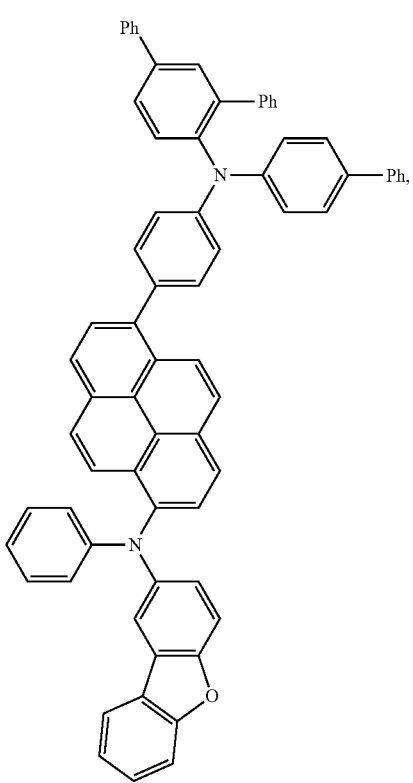

Compound 43
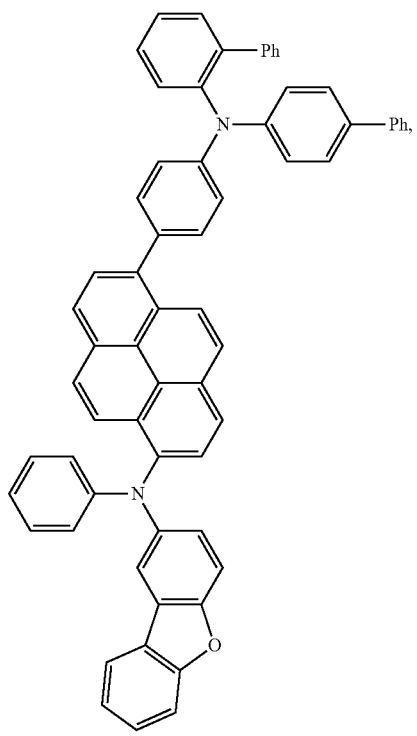
Compound 47
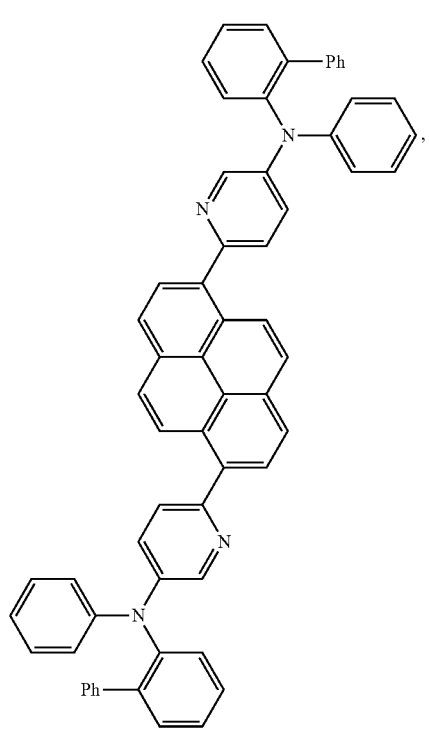
Compound 48
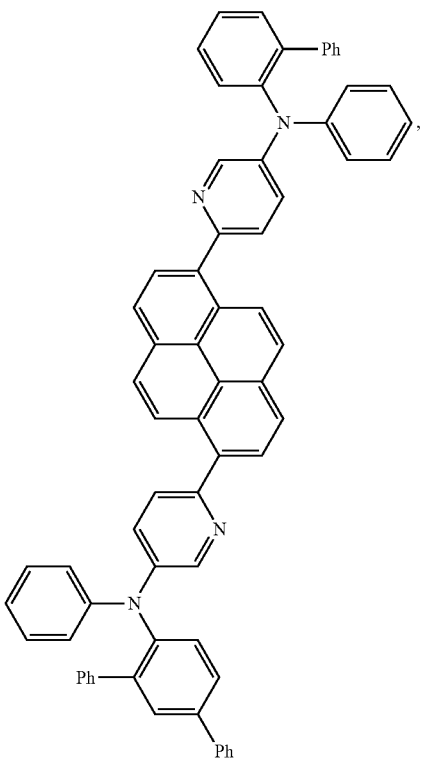
Compound 49
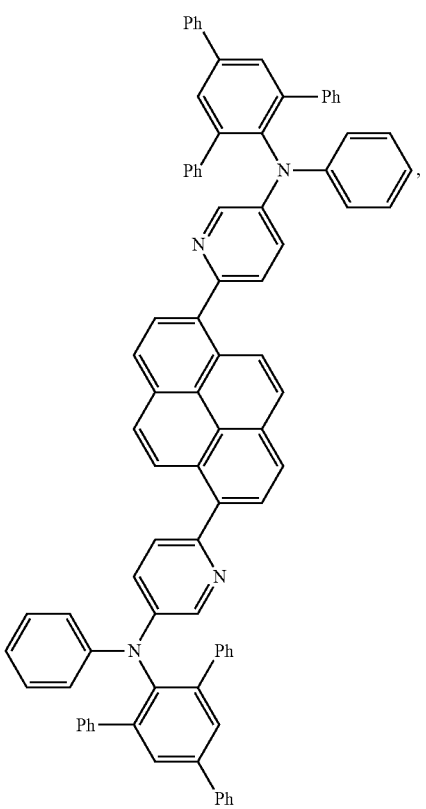

Compound 50
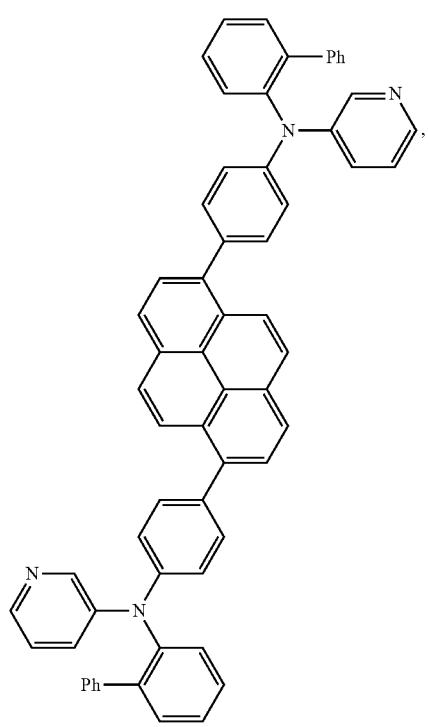
Compound 51
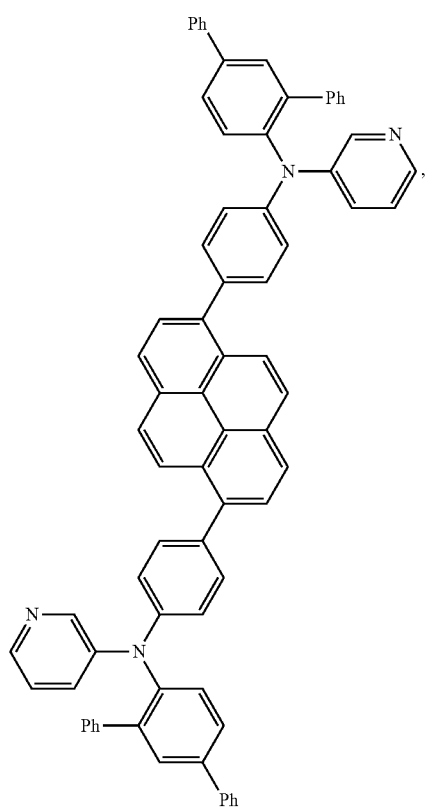
Compound 52
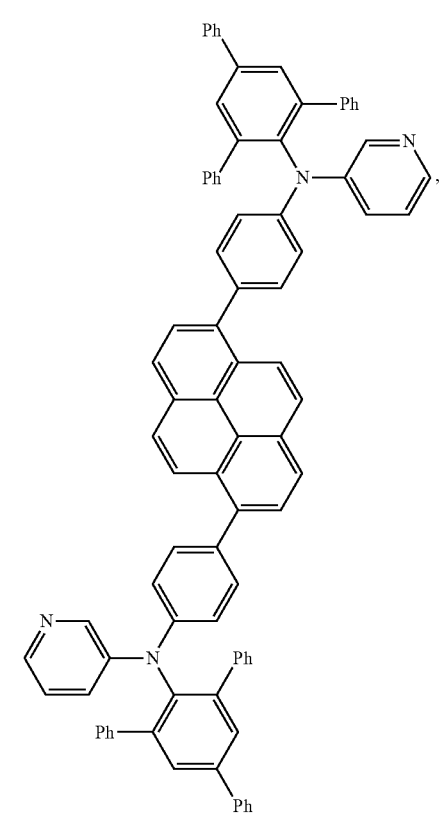
Compound 53
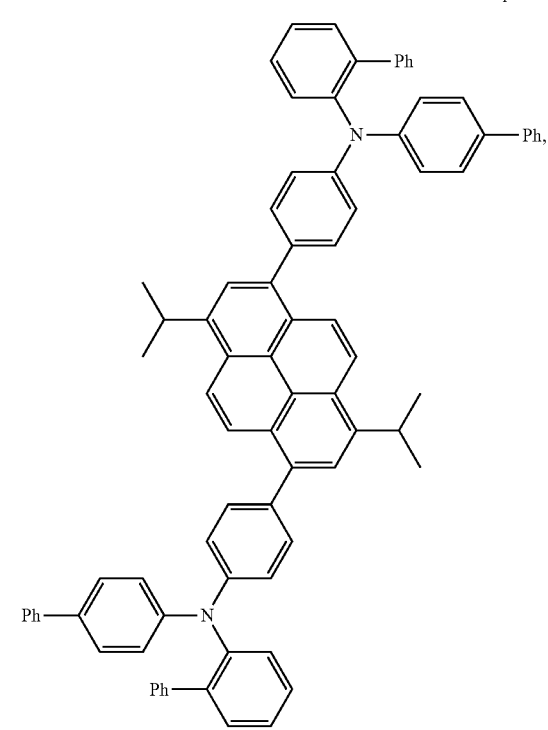

Compound 54
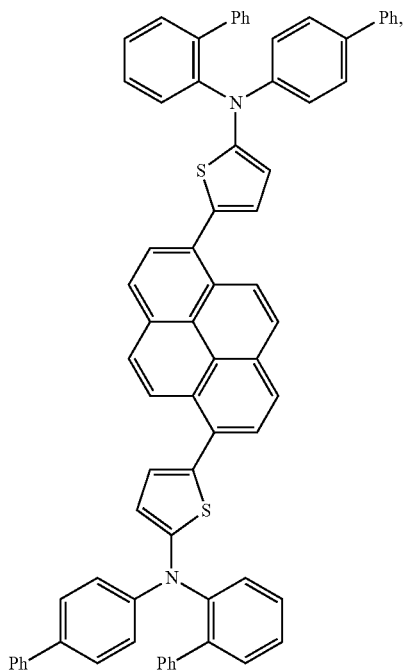
Compound 56
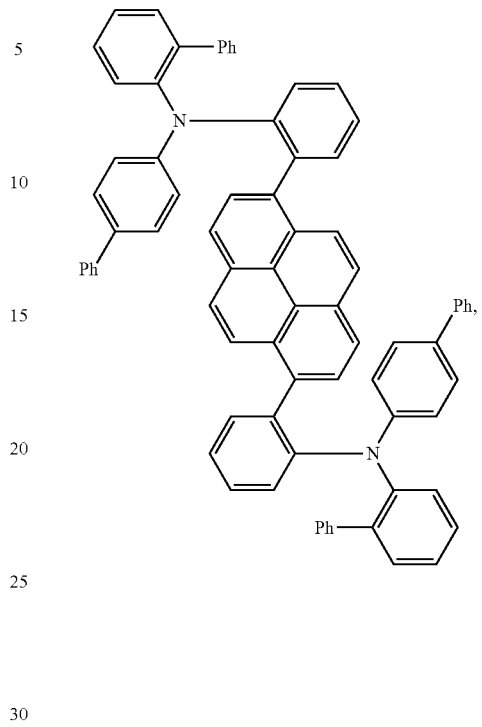
Compound 55
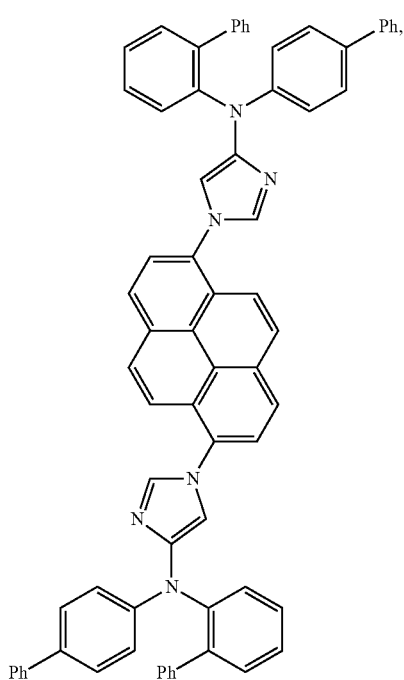
Compound 57
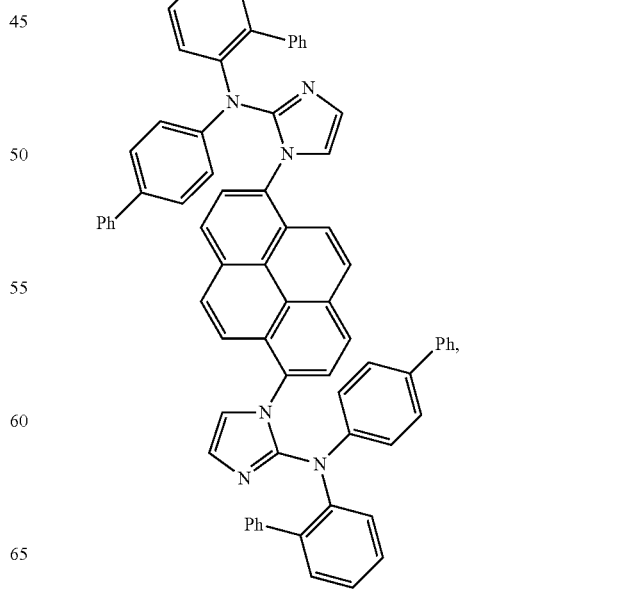

Compound 58
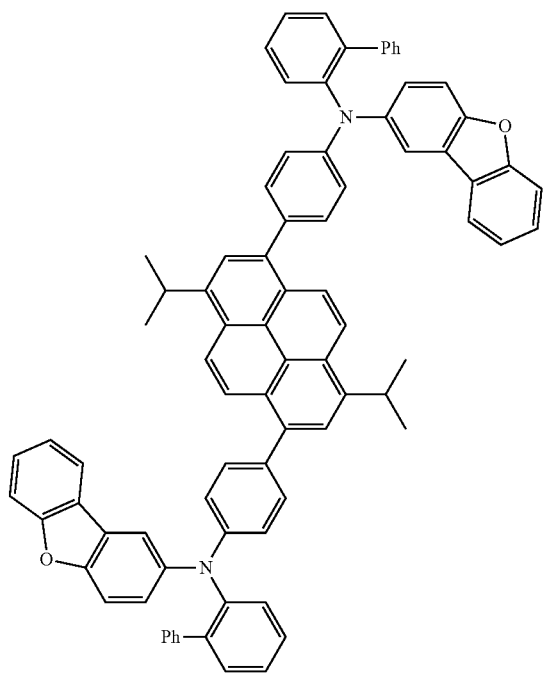
Compound 60
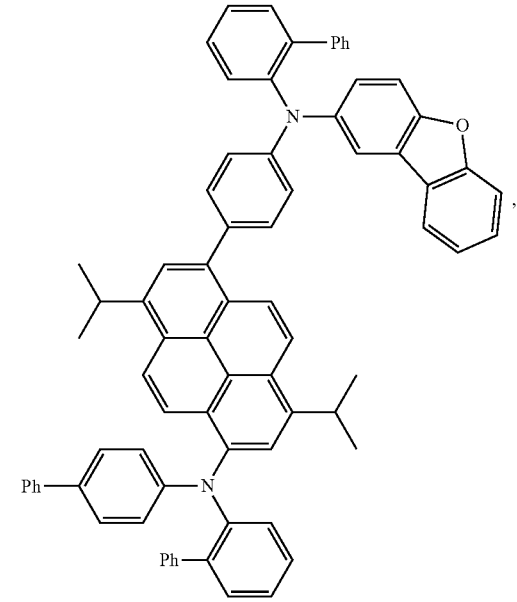
Compound 59
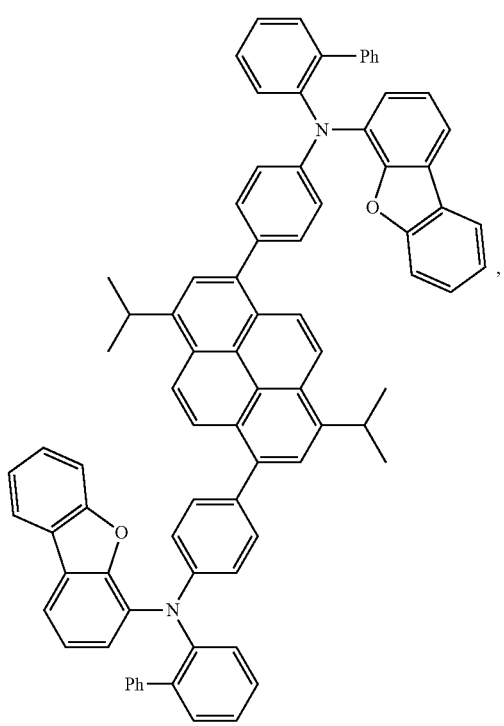
Compound 61
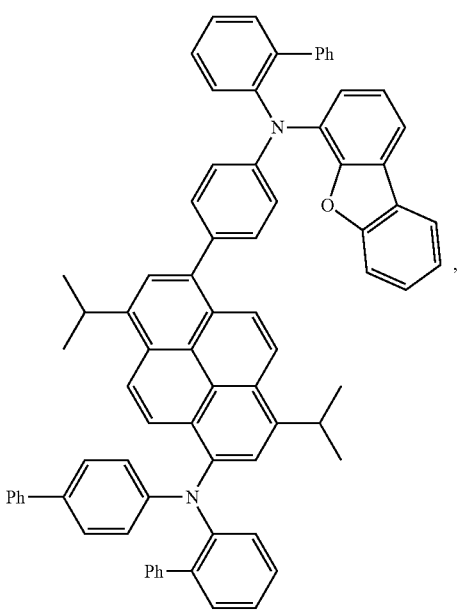

Compound 62
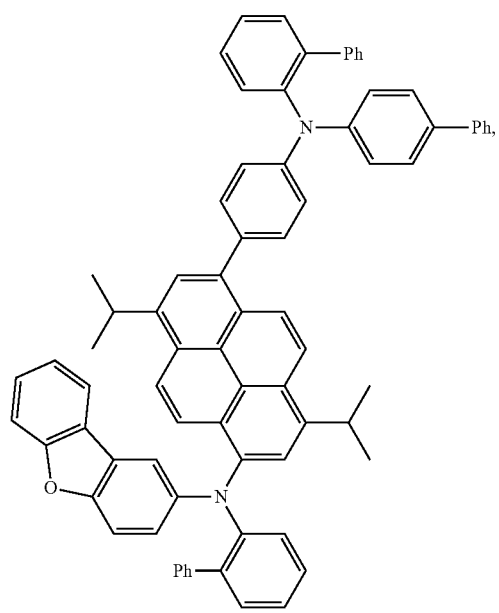
Compound 64
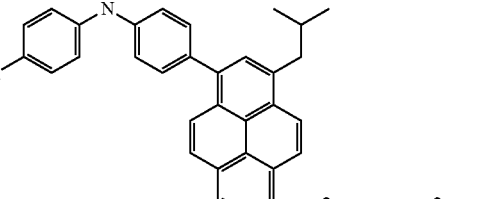
Compound 65
Compound 63
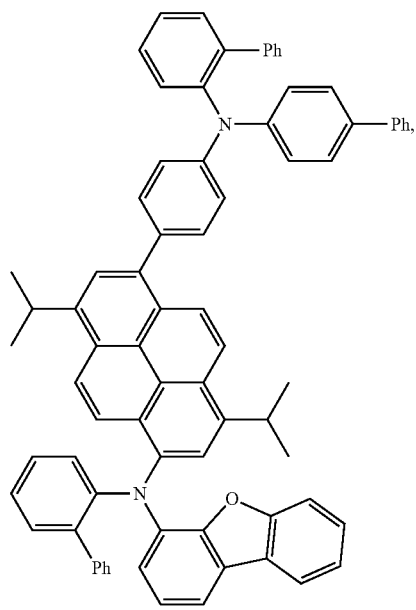
9. The compound of claim 1, wherein $R^1$ has the formula
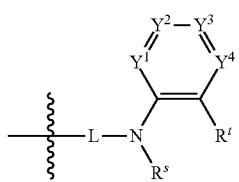
T1
and $R^6$ is amino.

10. The compound of claim 9, wherein the compound is selected from the group consisting of:
Compound 16
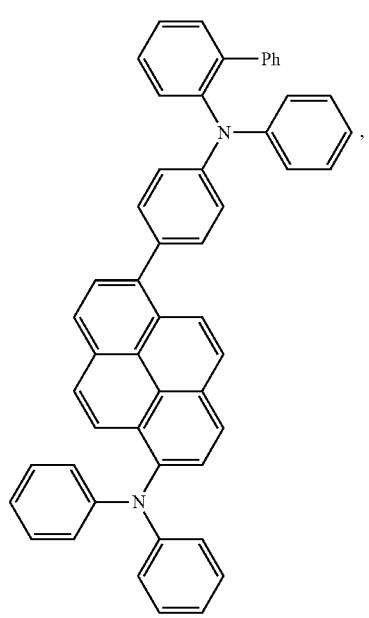
Compound 17
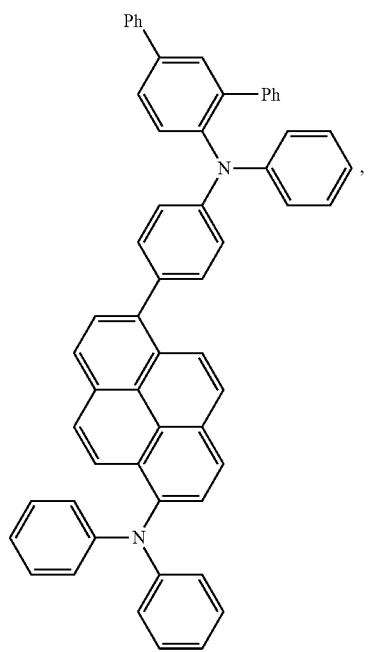
Compound 18
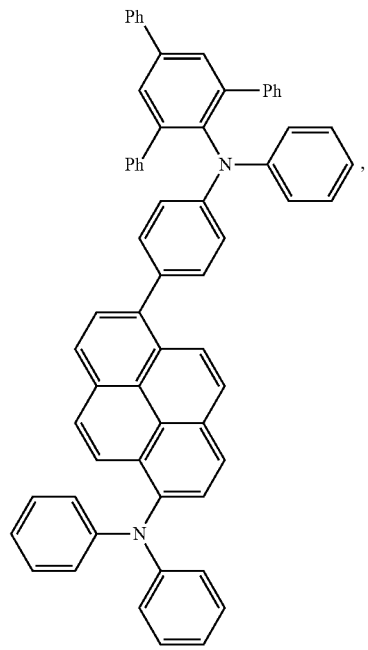
Compound 19
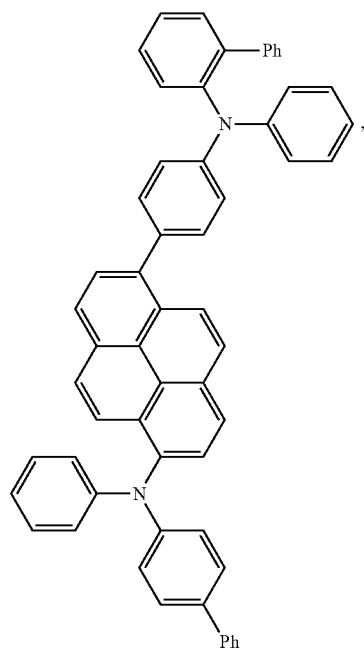

-continued
Compound 20
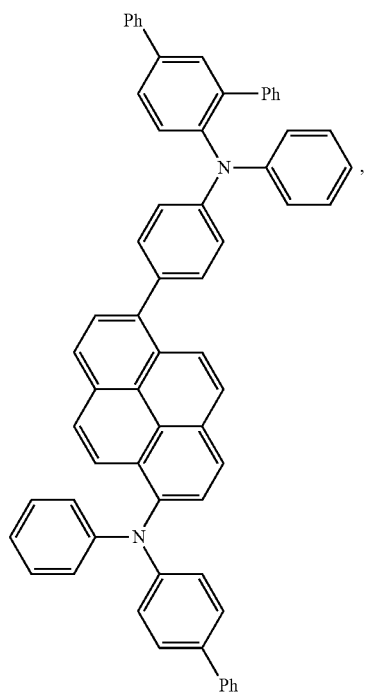
Compound 21
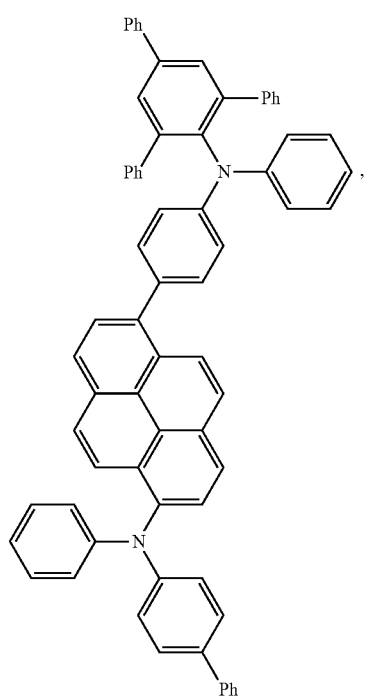
-continued
Compound 41
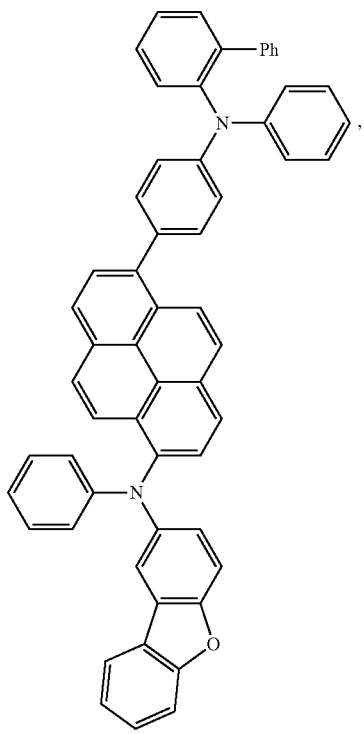
Compound 42
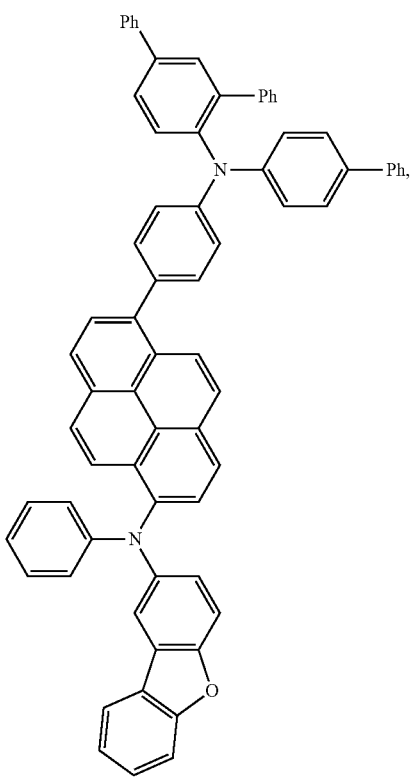

Compound 43
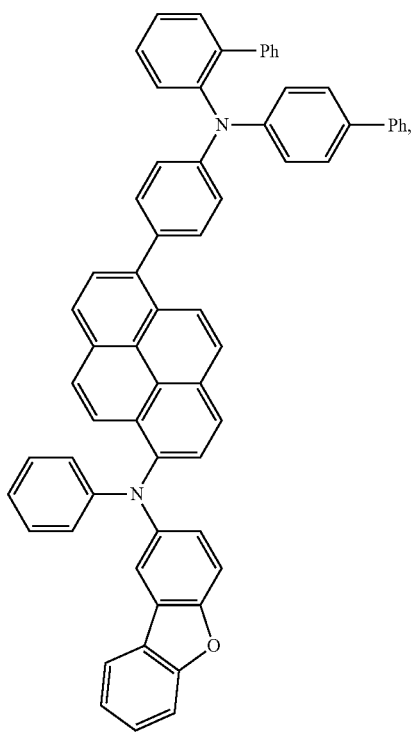
Compound 45
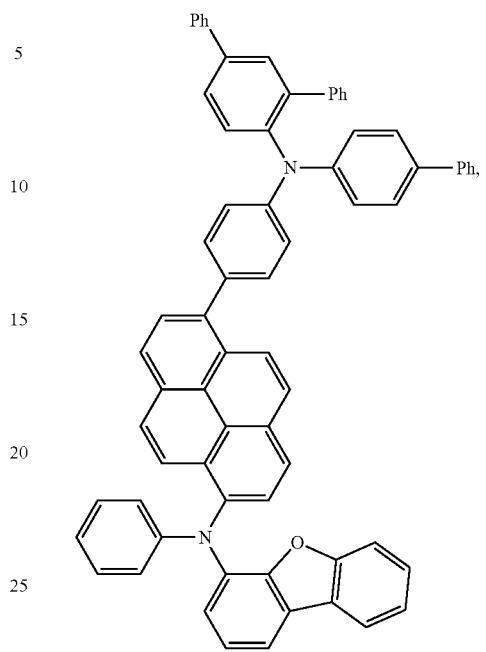
Compound 44
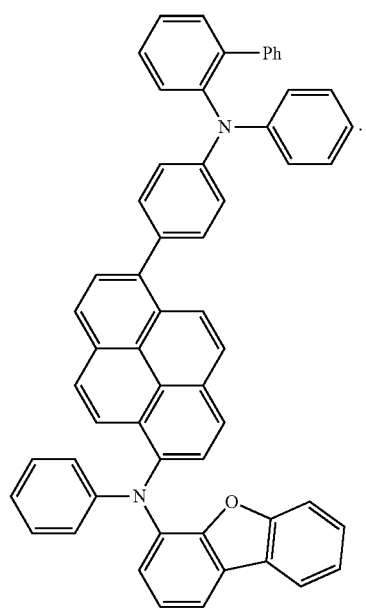
Compound 46
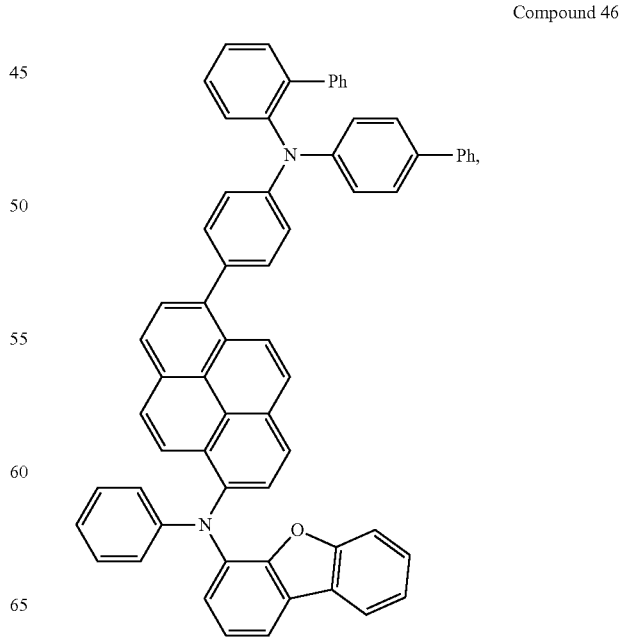

Compound 60
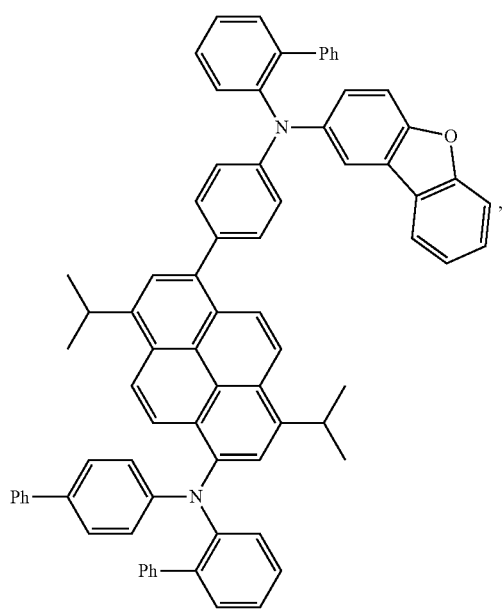
Compound 61
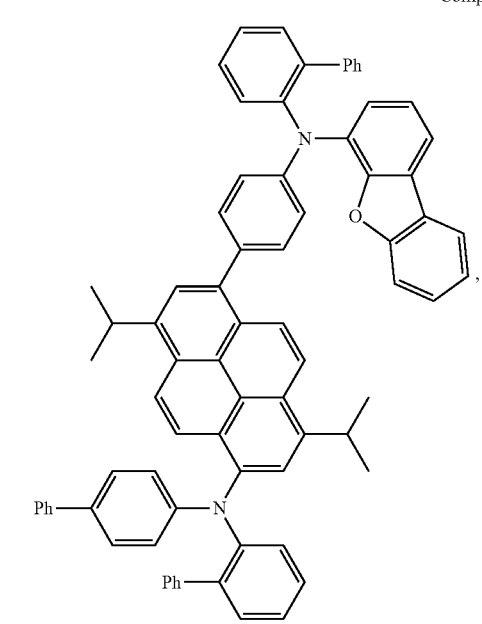
Compound 62
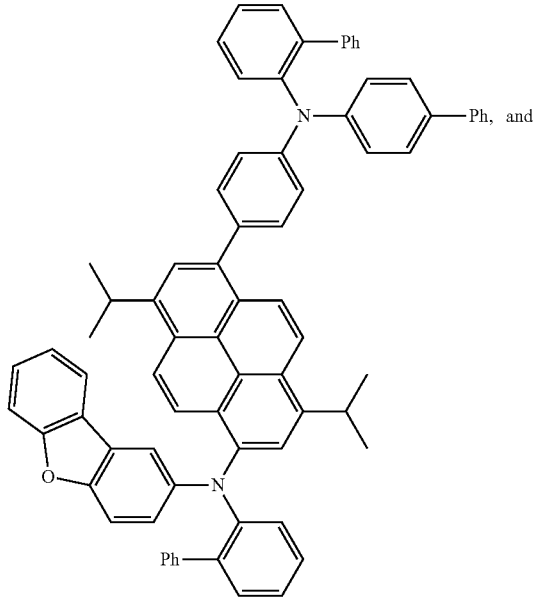
Compound 63
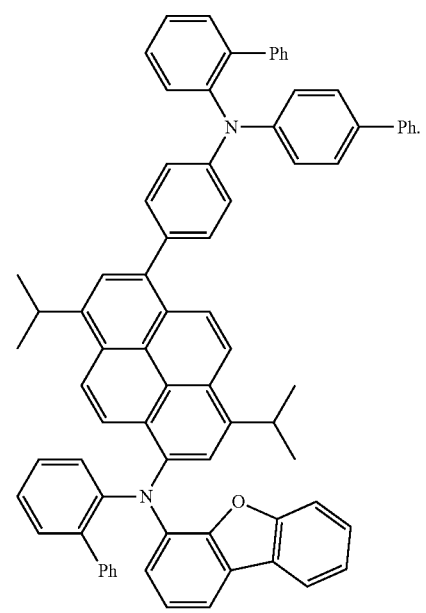
11. A first device comprising a first organic light emitting device, the first organic light emitting device comprising:
an anode;
a cathode; and
an organic layer, disposed between the anode and the cathode, comprising a compound having Formula 1:

Formula 1

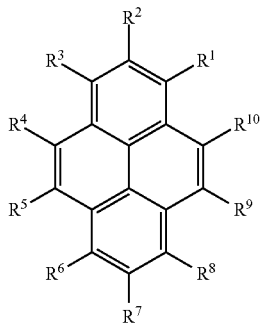

wherein R¹—R¹⁰ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, wherein at least two of R¹—R¹⁰ are not H, wherein at least one R¹—R¹⁰ has the formula T1

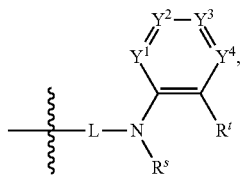

wherein L is an organic linker, wherein $Y^1$ to $Y^4$ are CR or N, wherein R is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, wherein adjacent R moieties can form fused rings, wherein $R^s$ and $R^t$ are independently aryl or heteroaryl, either of which may independently be further substituted, and wherein $R^s$ and $R^t$ do not form fused rings with any part of the molecule.

12. The first device of claim 11, wherein R¹ has the formula T1

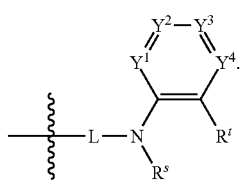

13. The first device of claim 11, wherein R¹ has the formula T1

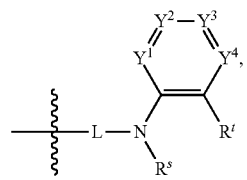

and R⁶ is alkyl, aryl or heteroaryl.

14. The first device of claim 11, wherein R¹ and R⁶ have the formula T1

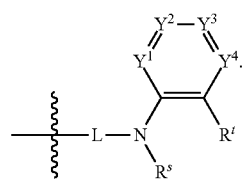

15. The first device of claim 11, wherein R¹ has the formula T1

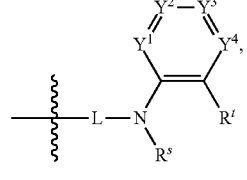

and R⁶ is amino.

16. The first device of claim 11, wherein the first device is selected from the group consisting of a consumer product, an electronic component module, an organic light-emitting device, and a lighting panel.

17. The first device of claim 11, wherein the organic layer is an emissive layer and the compound is an emissive dopant or a non-emissive dopant.

18. The first device of claim 11, wherein the organic layer further comprises a host material; wherein the host material contains aromatic groups selected from the group consisting of naphthalene, triphenylene, anthracene, chrysene, triazene, carbazole, dibenzofuran, dibenzothiophene, dibenzoselenophene, and various aza analogs thereof.

19. A formulation comprising a compound of Formula 1,

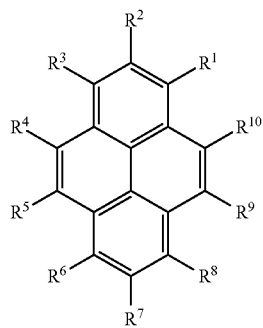

Formula 1 wherein $R^1$—$R^{10}$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof,
wherein at least two of $R^1$—$R^{10}$ are not H,
wherein at least one $R^1$—$R^{10}$ has the formula T1

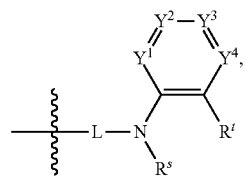

T1 wherein L is an organic linker,
wherein $Y^1$ to $Y^4$ are CR or N,
wherein R is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof,
wherein adjacent R moieties can form fused rings,
wherein $R^s$ and $R^t$ are independently aryl or heteroaryl, either of which may independently be further substituted, and
wherein $R^s$ and $R^t$ do not form fused rings with any part of the molecule.

* * * * *